(12) United States Patent
Honda et al.

(10) Patent No.: US 9,211,691 B2
(45) Date of Patent: Dec. 15, 2015

(54) DELAMINATION DEVICE

(71) Applicant: TOKYO ELECTRON LIMITED, Tokyo (JP)

(72) Inventors: Masaru Honda, Koshi (JP); Masanori Itou, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/029,442

(22) Filed: Sep. 17, 2013

(65) Prior Publication Data

US 2014/0076500 A1    Mar. 20, 2014

(30) Foreign Application Priority Data

Sep. 19, 2012  (JP) .................. 2012-205848
Sep. 19, 2012  (JP) .................. 2012-205849
Aug. 9, 2013   (JP) .................. 2013-166979
Aug. 9, 2013   (JP) .................. 2013-166986

(51) Int. Cl.
*B32B 38/10*    (2006.01)
*B32B 43/00*    (2006.01)
*H01L 21/67*    (2006.01)
*H01L 21/683*   (2006.01)

(52) U.S. Cl.
CPC ........ *B32B 43/006* (2013.01); *H01L 21/67092* (2013.01); *H01L 21/6838* (2013.01); *B32B 38/10* (2013.01); *B32B 2457/14* (2013.01); *Y10T 156/1168* (2015.01); *Y10T 156/19* (2015.01); *Y10T 156/1978* (2015.01)

(58) Field of Classification Search
CPC  B23B 38/10;  B32B 43/006;  Y10T 156/1168; Y10T 156/1978
USPC .................. 156/714, 764, 930, 941
See application file for complete search history.

(56) References Cited

U.S. PATENT DOCUMENTS 6,342,434 B1 *   1/2002   Miyamoto et al. ............ 438/464
8,443,864 B2 *   5/2013   Thallner ........................ 156/758
(Continued)

FOREIGN PATENT DOCUMENTS

JP         11111824 A      4/1999
JP         2002075915 A    3/2002
(Continued)

*Primary Examiner* — Mark A Osele
*Assistant Examiner* — Nickolas Harm
(74) *Attorney, Agent, or Firm* — Nath, Goldberg & Meyer; Jerald L. Meyer

(57) ABSTRACT

Provided is a delamination device of delaminating a laminated substrate obtained by bonding a first substrate and a second substrate, the laminated substrate being disposed in an opening of a frame, the opening having a diameter larger than that of the laminated substrate, and the laminated substrate being held by the frame with a non-bonding surface of the first substrate attached to a tape provided in the opening. The delamination device includes: a first holding unit configured to hold the second substrate of the laminated substrate from above; a second holding unit configured to hold the first substrate of the laminated substrate from below through the tape; and a moving mechanism configured to move the first holding unit in a direction away from the second holding unit.

13 Claims, 47 Drawing Sheets

(56) References Cited

U.S. PATENT DOCUMENTS

| | | | |
|---|---|---|---|
| 2002/0106869 A1* | 8/2002 | Otsu et al. | 438/459 |
| 2003/0015286 A1* | 1/2003 | De et al. | 156/344 |
| 2009/0314430 A1* | 12/2009 | Nakamura | 156/344 |
| 2011/0290427 A1* | 12/2011 | Maki et al. | 156/707 |
| 2013/0048222 A1* | 2/2013 | Tanaka et al. | 156/707 |
| 2014/0020847 A1* | 1/2014 | Burggraf et al. | 156/714 |
| 2014/0150981 A1* | 6/2014 | Itou et al. | 156/714 |

FOREIGN PATENT DOCUMENTS

| | | |
|---|---|---|
| JP | 2005116679 A | 4/2005 |
| JP | 2011103471 A | 5/2011 |
| JP | 2012004522 A | 1/2012 |
| JP | 2012-69914 A | 4/2012 |

* cited by examiner

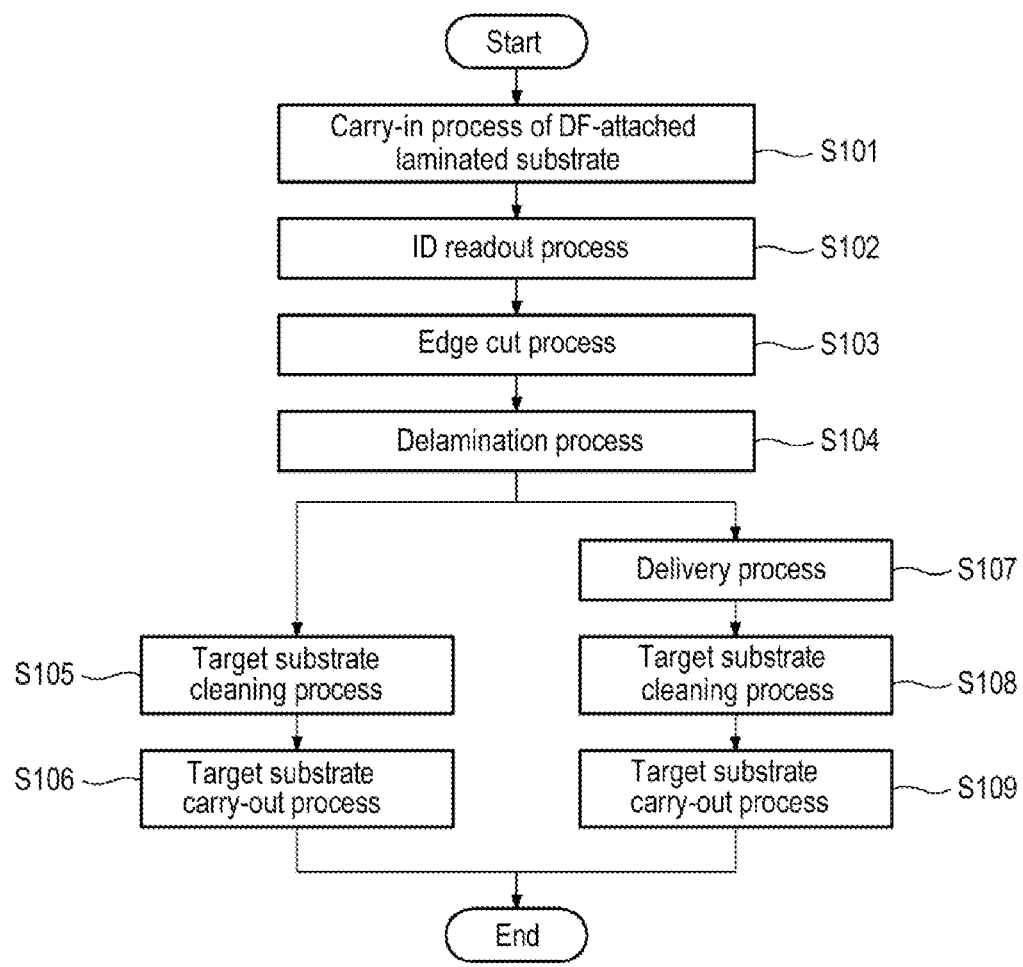

FIG. 14
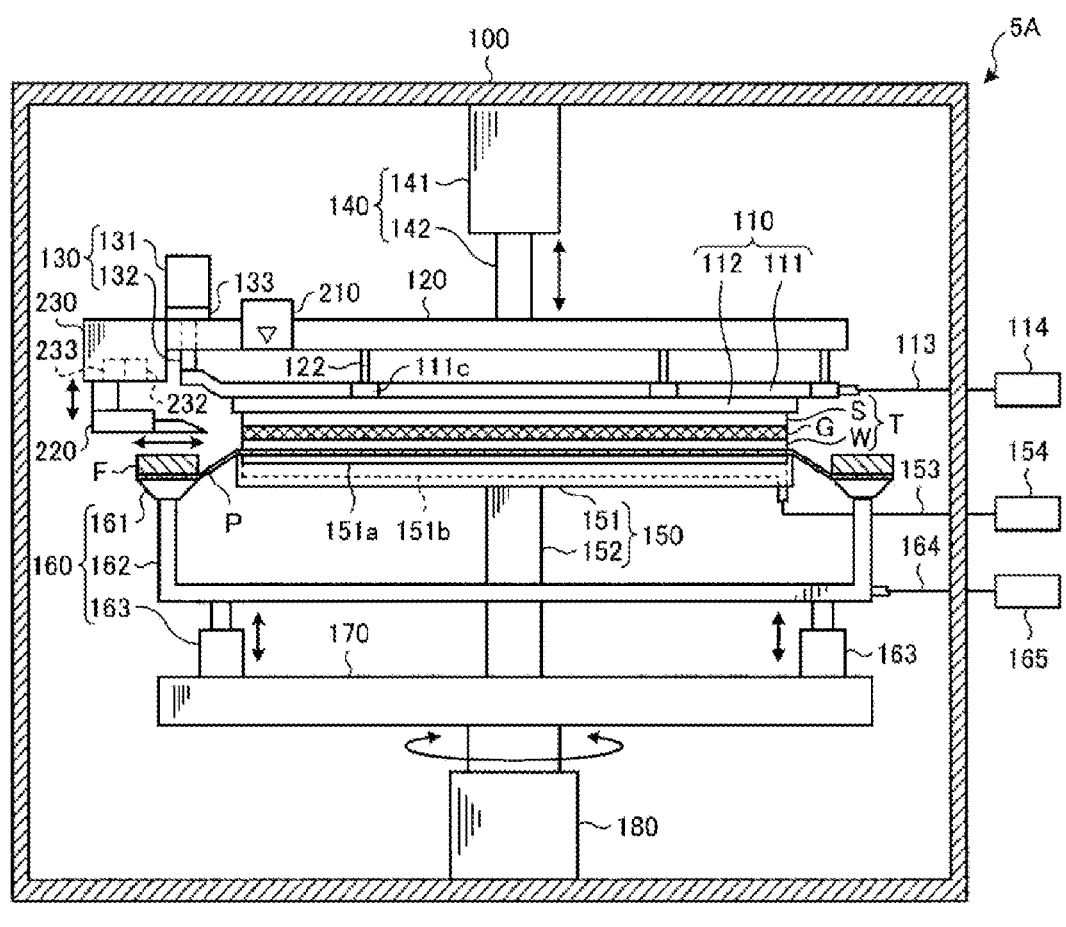
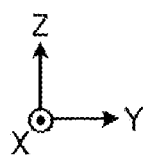

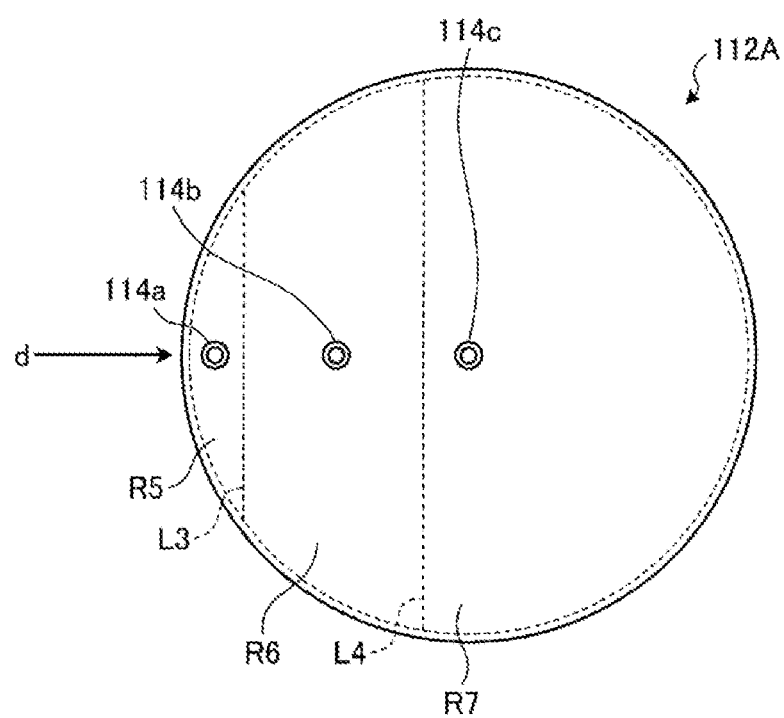

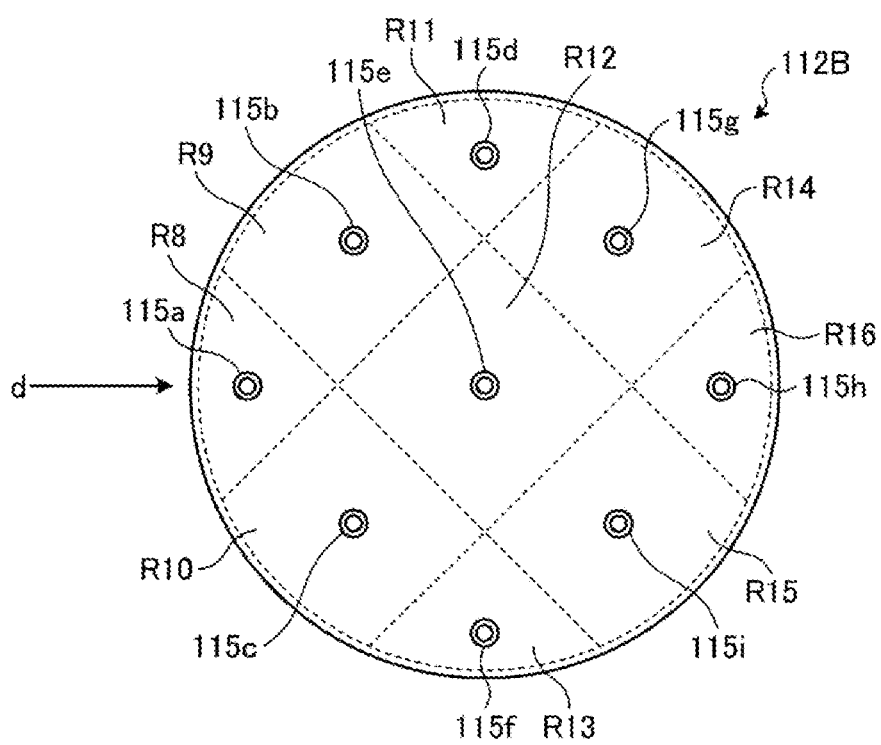

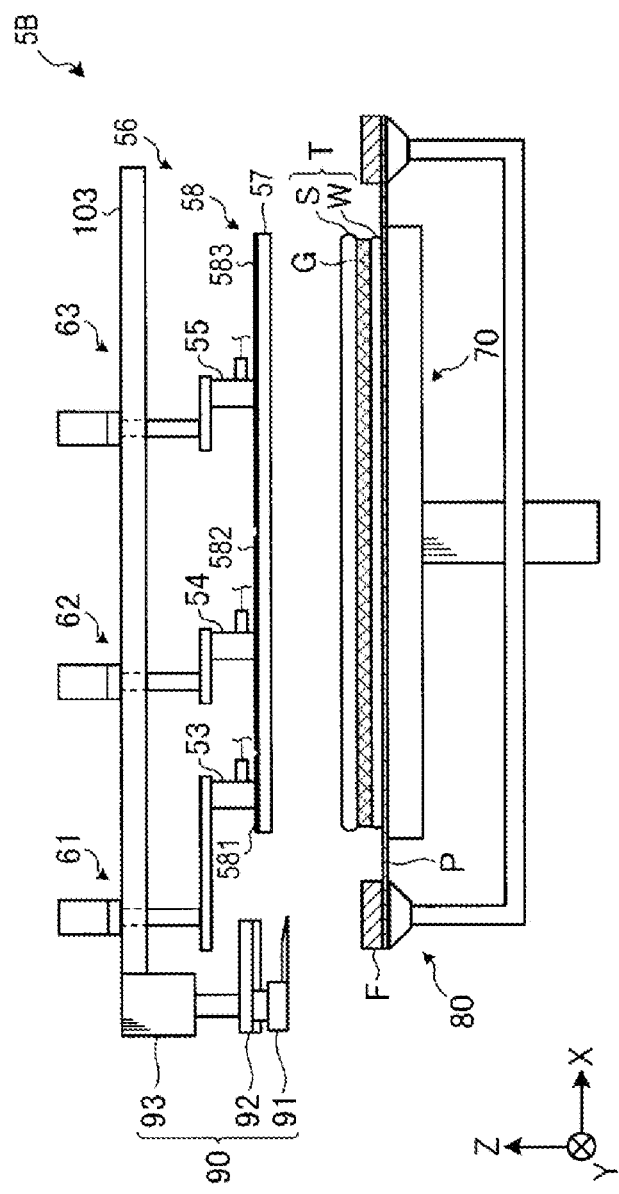

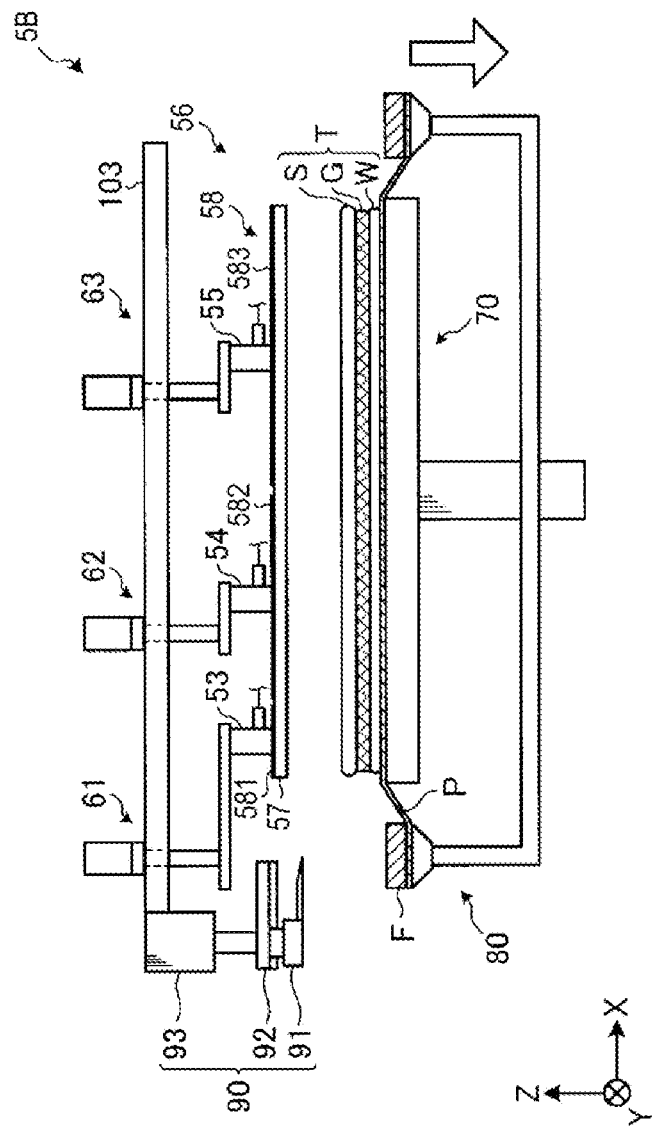

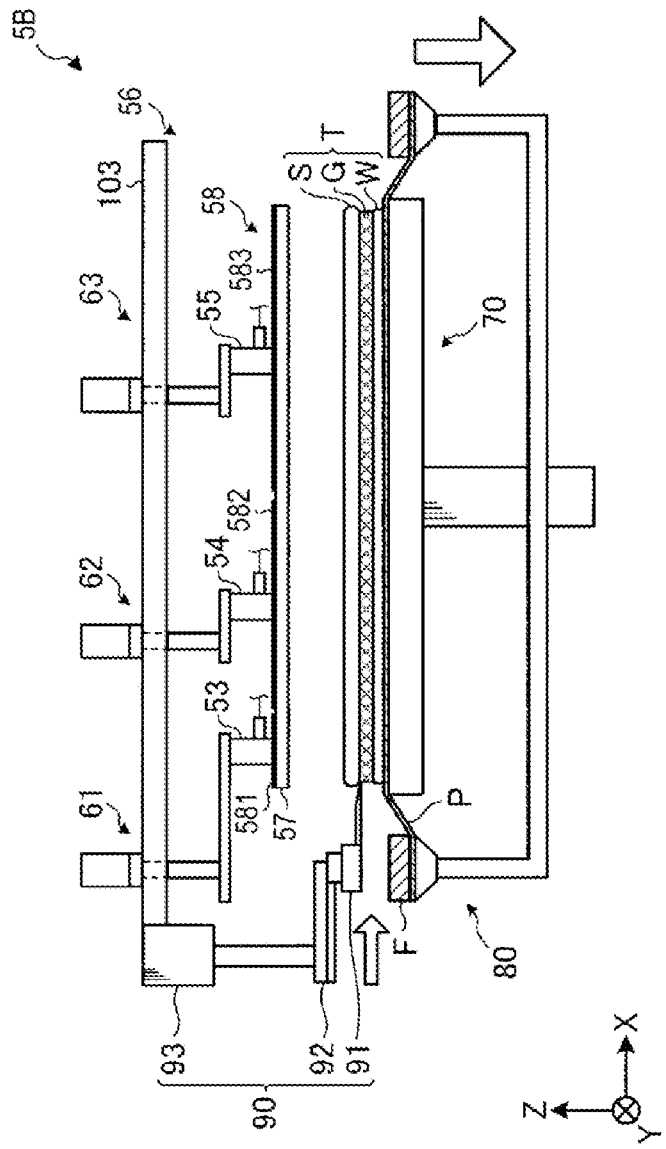

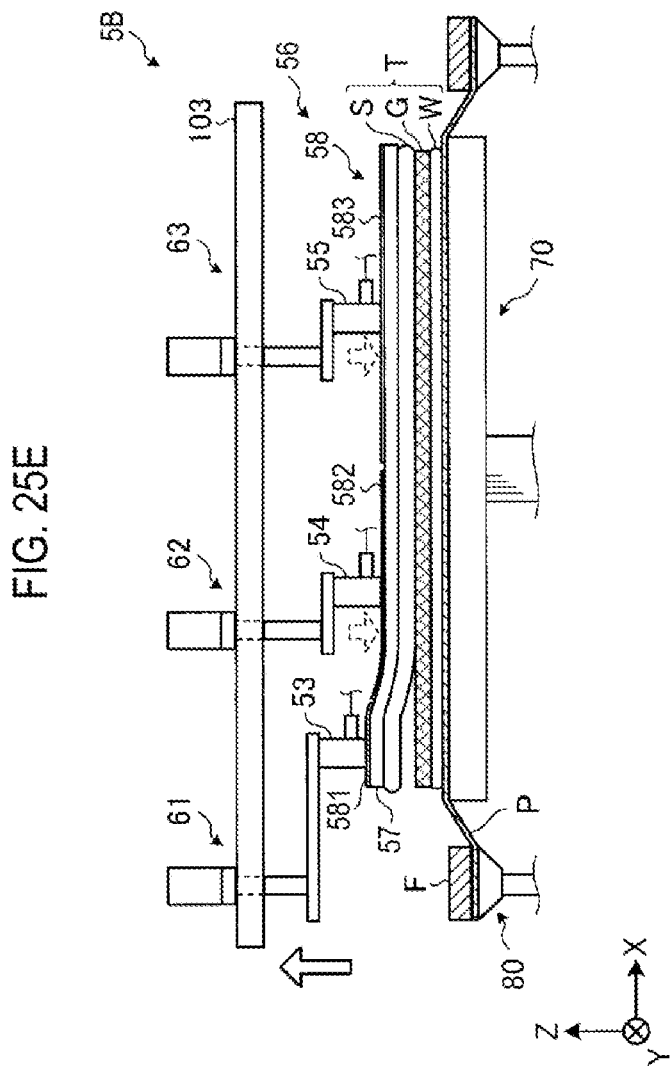

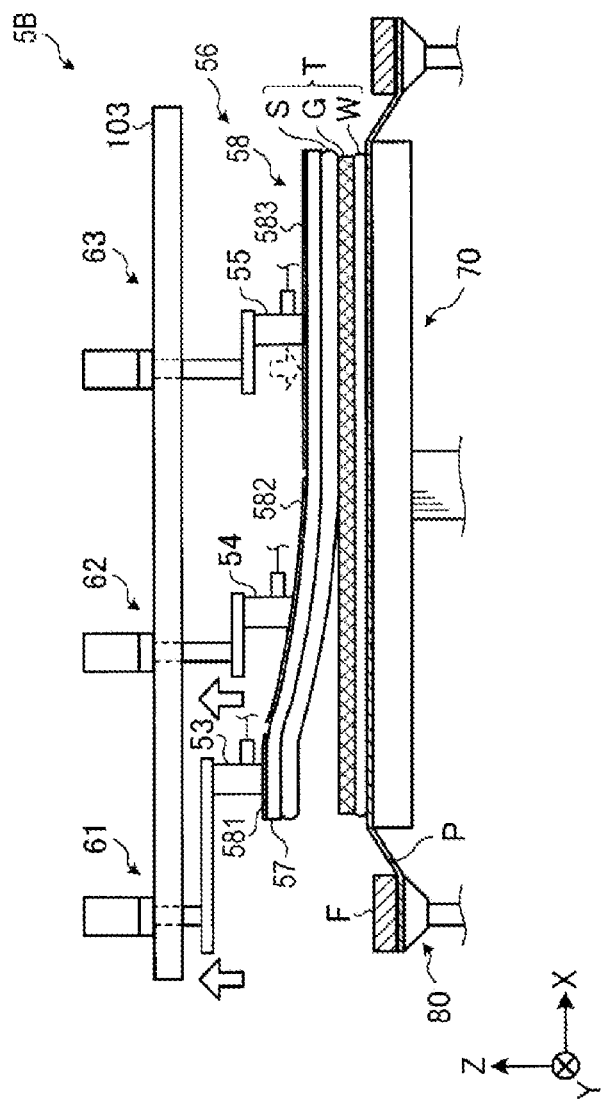

DELAMINATION DEVICE

CROSS-REFERENCE TO RELATED APPLICATIONS

This application claims the benefit of Japanese Patent Application Nos. 2012-205848 filed on Sep. 19, 2012; 2012-205849 filed on Sep. 19, 2012; 2013-166979 filed on Aug. 9, 2013; and 2013-166986 filed on Aug. 9, 2013; in the Japan Patent Office, the disclosure of which is incorporated herein in their entirety by reference.

TECHNICAL FIELD

The embodiments disclosed herein relate to a delamination device.

BACKGROUND

In recent years, in a semiconductor device manufacturing process, semiconductor substrates such as a silicon wafer, a compound semiconductor wafer and the like become larger in diameter and thinner in thickness. A semiconductor substrate having a large diameter and a thin thickness may have a warp or a crack during a transfer operation or a grinding process. Thus, in the semiconductor device manufacturing process, the semiconductor substrate is reinforced by bonding a support substrate to the semiconductor substrate. Then, the reinforced semiconductor substrate is transferred or subjected to a grinding process and subsequently, the support substrate is delaminated from the reinforced semiconductor substrate.

By way of example, a first holding unit may hold the semiconductor substrate while a second holding unit may hold the support substrate. The support substrate may be delaminated from the reinforced semiconductor substrate by vertically moving an outer peripheral portion of the second holding unit.

There still exists a need in the related art to improve an efficiency of a delamination process. Such an improvement of efficiency may be requested even in a manufacturing technique such as a SOI (Silicon On Insulator) accompanied by substrate delamination.

For example, conventionally, a delaminated semiconductor substrate is held by a first holding unit from an upper side, namely in a state where a bonding surface of the semiconductor substrate to be bonded with a support substrate is oriented downward. As such, in order to clean the bonding surface of the semiconductor substrate using a cleaning device, it is sometimes necessary to invert the delaminated semiconductor substrate after receiving the same from the first holding unit. This may hinder a throughput enhancement.

SUMMARY

Some embodiments of the present disclosure provide a delamination device capable of increasing the efficiency of a delamination process.

According to one embodiment of the present disclosure, provided is a delamination device of delaminating a laminated substrate obtained by bonding a first substrate and a second substrate, the laminated substrate being disposed in an opening of a frame, the opening having a diameter larger than that of the laminated substrate, and the laminated substrate being held by the frame with a non-bonding surface of the first substrate attached to a tape provided in the opening. The delamination device includes: a first holding unit configured to hold the second substrate of the laminated substrate from above; a second holding unit configured to hold the first substrate of the laminated substrate from below through the tape; and a moving mechanism configured to move the first holding unit in a direction away from the second holding unit.

According to another embodiment of the present disclosure, provided is a delamination device, which includes: a first holding unit configured to hold a second substrate of a laminated substrate which is obtained by bonding a first substrate and the second substrate; a second holding unit configured to hold the first substrate of the laminated substrate; and a local movement unit configured to move a portion of an outer periphery of the first holding unit away from the second holding unit, wherein the first holding unit is made of a pliable material.

According to another embodiment of the present disclosure, provided is a delamination device, which includes: a first holding unit configured to hold a first substrate of a laminated substrate which is obtained by bonding a first substrate and the second substrate; a second holding unit configured to hold the second substrate of the laminated substrate; and a movement unit configured to move a portion of an outer periphery of the first holding unit away from the second holding unit, wherein the first holding unit includes: a flat elastic member connected to the movement unit; and a plurality of suction portions formed in the elastic member and configured to hold the first substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a flowchart showing a sequence of substrate processes performed by the delamination system.

FIG. 14 is a schematic side view showing a configuration of a delamination device according to a second embodiment.

FIGS. 18A to 18C are schematic plane views showing other configurations of the suction pad.

FIGS. 25A to 25G are views illustrating delamination operations performed by the delamination device according to the third embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments <1. Delamination System>

Figure 1:
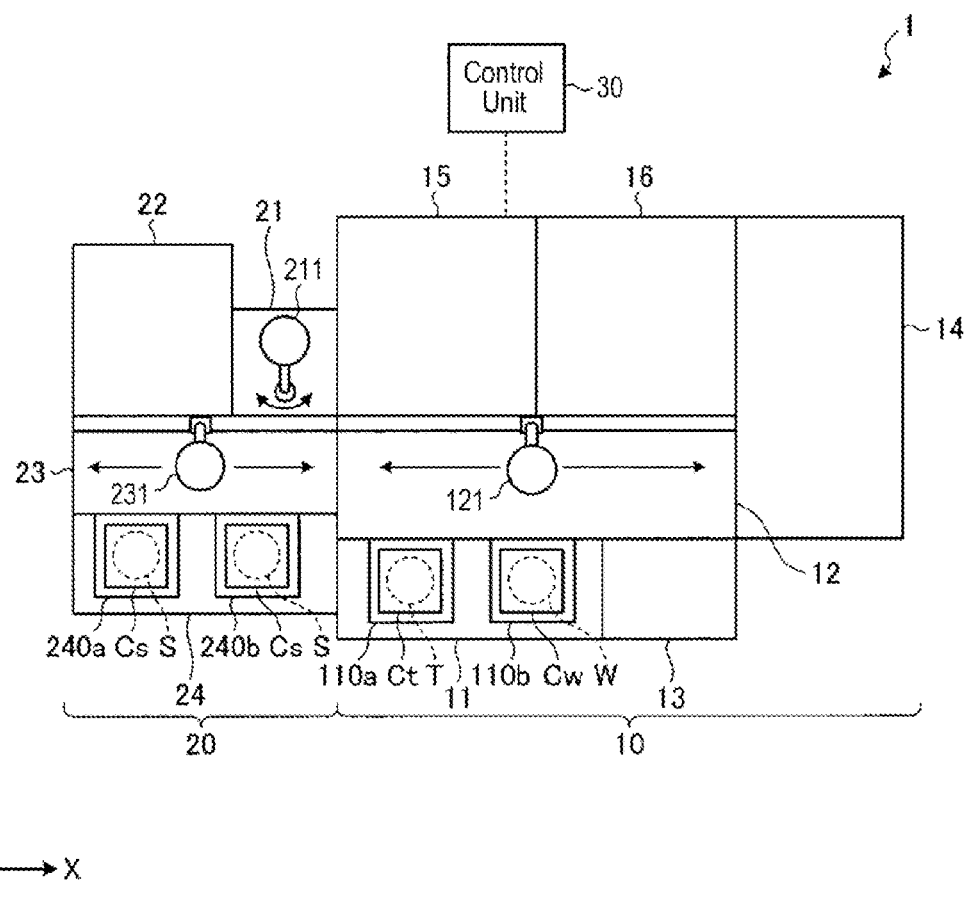
FIG. 1 is a schematic plane view showing an illustrative configuration of a delamination system.
Figure 2:
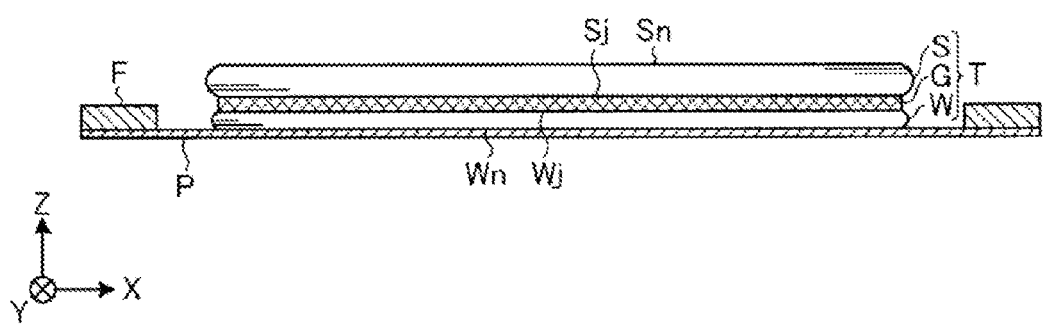
FIG. 2 is a schematic side view of a laminated substrate held by a dicing frame.
Figure 3A:
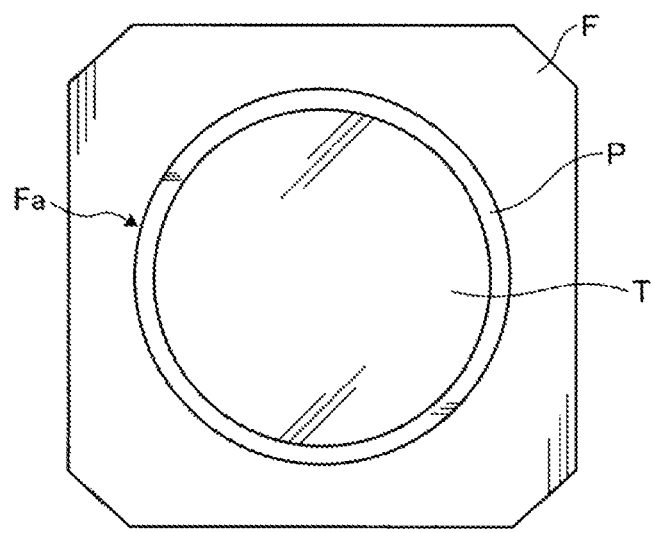
FIGS. 3A and 3B are schematic plane views of the laminated substrate held by the dicing frame.
Figure 3B:
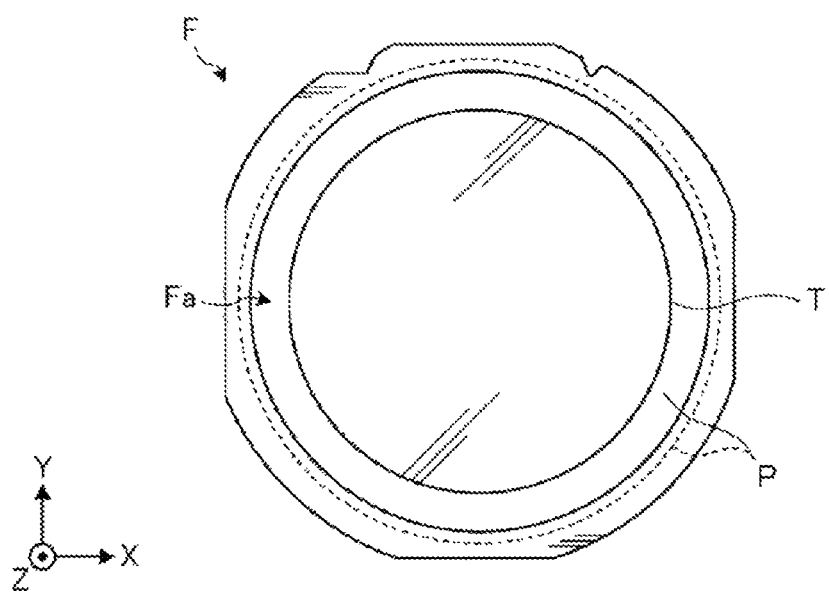

An illustrative configuration of a delamination system will be described with reference to FIGS. 1 to 3B. FIG. 1 is a schematic plane view showing the illustrative configuration of the delamination system. FIGS. 2, 3A and 3B are a schematic side view and a schematic plane view showing a laminated substrate held by a dicing frame, respectively. For the clarification of a positional relationship, an X-axis direction, a Y-axis direction and a Z-axis direction, which are orthogonal to one another, are defined in the following description and a Z-axis forward direction is defined as a vertical upward direction.

The delamination system 1 shown in FIG. 1 delaminates a laminated substrate T (see FIG. 2), in which a target substrate W and a support substrate S are bonded together by a bonding agent G, into the target substrate W and the support substrate S.

In the following description, as shown in FIG. 2, a surface of the target substrate W, which is bonded to the support substrate S by the bonding agent G, will be referred to as a "bonding surface Wj", while a surface opposite to the bonding surface Wj will be referred to as a "non-bonding surface Wn." Further, a surface of the support substrate S, which is bonded to the target substrate W by the bonding agent G, will be referred to as a "bonding surface Sj," while a surface opposite to the bonding surface Sj will be referred to as a "non-bonding surface Sn."

The target substrate W is a substrate made by forming a plurality of electronic circuits on a semiconductor substrate, e.g., a silicon wafer or a compound semiconductor wafer. The surface of the target substrate W, on which the electronic circuits are formed, is the bonding surface Wj. Further, the target substrate W is thin in thickness by, for example, grinding the non-bonding surface Wn. Specifically, the thickness of the target substrate W is from about 20 μm to about 100 μm. More specifically, the thickness of the target substrate W is from about 20 μm to about 50 μm.

The support substrate S supports the target substrate W and has a diameter substantially equal to a diameter of the target substrate W. The thickness of the support substrate S is from about 650 μm to about 750 μm. A silicon wafer, a glass substrate, or the like may be used as the support substrate S. The thickness of the bonding agent G used in bonding the target substrate W and the support substrate S is from about 40 μm to about 150 μm.

As shown in FIG. 2, the laminated substrate T is fixed to a dicing frame F. That is, as described above, since the target substrate W is very thin and easily breakable, the dicing frame F is configured to protect the target substrate W from breaking. As shown in FIGS. 3A and 3B, the dicing frame F is a substantially rectangular shape or a substantially annular shape having a central opening Fa larger in diameter than that of the laminated substrate T. The dicing frame F is made of metal such as stainless steel. A dicing tape P is attached to the dicing frame F such that it closes the opening Fa from a back surface of the dicing frame F, whereby the dicing frame F and the laminated substrate T are bonded together. The thickness of the dicing frame F is, e.g., about 1 mm.

The laminated substrate T is fixed to the dicing frame F through the dicing tape P. Specifically, the laminated substrate T is positioned in the opening Fa of the dicing frame F and the dicing tape P is attached to the non-bonding surface Wn of the target substrate W and the rear surface of the dicing frame F so as to close the opening Fa from the rear surface. The laminated substrate T is held by the dicing frame F in such a state that the target substrate W is positioned downward while the support substrate S is positioned upward (see FIG. 2).

Referring to FIG. 1, the delamination system 1 includes two processing blocks, i.e., a first processing block 10 and a second processing block 20. The first processing block 10 and the second processing block 20 are disposed side by side in an adjoining relationship along the X-axis direction in the order of the second processing block 20 and the first processing block 10.

The first processing block 10 is configured to perform processes for the substrate held by the dicing frame F (specifically, the laminated substrate T or the delaminated target substrate W). In the first processing block 10, the carry-in of the laminated substrate T, the delamination process of the laminated substrate T and the cleaning and carry-out of the delaminated target substrate W are performed. The first processing block 10 includes a carry-in/carry-out station 11, a first transfer region 12, a standby station 13, an edge cut station 14, a delamination station 15 and a first cleaning station 16.

The second processing block 20 is configured to perform processes for the substrate not held by the dicing frame F (specifically, the delaminated support substrate S). In the second processing block 20, the cleaning and carry-out of the delaminated support substrate S is performed. The second processing block 20 includes a delivery station 21, a second cleaning station 22, a second transfer region 23 and a carry-out station 24.

The carry-in/carry-out station 11, the standby station 13, the edge cut station 14, the delamination station 15 and the first cleaning station 16 of the first processing block 10 are arranged adjacent to the first transfer region 12. Specifically, the first transfer region 12 of the first processing block 10 and the second transfer region 23 of the second processing block 20 are disposed side by side along the X-axis direction. At the back side of the first transfer region 12 in the Y-axis direction (or Y-axis backward direction), the carry-in/carry-out station 11 and the standby station 13 are disposed side by side along the X-axis direction in that order. The carry-out station 24 is disposed at the back side of the second transfer region 23 in the Y-axis direction (or Y-axis backward direction).

The delamination station 15 and the first cleaning station 16 are disposed side by side along the X-axis forward direction in that order as they are located opposite to the carry-in/carry-out station 11 and the standby station 13 with the first transfer region 12 interposed therebetween. The delivery station 21 and the second cleaning station 22 are disposed side by side along the X-axis backward direction in that order as they are located opposite to the carry-out station 24 with the second transfer region 23 interposed therebetween. The edge cut station 14 is disposed at a front side of the first transfer region 12 in the X-axis direction (or X-axis forward direction).

The description will be first made as to a configuration of the first processing block 10. In the carry-in/carry-out station 11, a plurality of cassette placing tables is installed. A cassette Ct configured to receive the laminated substrates T or a cassette Cw configured to receive the delaminated target substrates W are placed on each of the cassette placing tables.

Specifically, in the carry-in/carry-out station 11, a cassette Ct configured to receive the laminated substrates T held by the dicing frame F (hereinafter referred to as a "DF-attached laminated substrate T") and a cassette Cw configured to receive the delaminated target substrates W are carried in from the outside or carried out to the outside. A cassette placing table is provided in the carry-in/carry-out station 11. A plurality of cassette placing plates 110a and 110b on which the cassettes Ct and Cw are placed is provided on the cassette placing table.

The DF-attached laminated substrate T or the delaminated target substrate W is transferred in the first transfer region 12. A first transfer device 121 configured to transfer the DF-attached laminated substrate T or the delaminated target substrate W is provided in the first transfer region 12.

The first transfer device 121 is a substrate transfer device that includes a transfer arm unit and a substrate holding unit provided at a tip of the transfer arm unit. The transfer arm unit may be moved in horizontal and vertical directions, and may be rotated around its vertical axis. The first transfer device 121 holds a substrate using the substrate holding unit and transfers the substrate held by the substrate holding unit to a desired place using the transfer arm unit. That is, in the first transfer region 12, processes for transferring the laminated substrate T to the standby station 13, the edge cut station 14 and the delamination station 15, and processes for transferring the delaminated target substrate W to the first cleaning station 16 and the carry-in/carry-out station 11 are performed by the first transfer device 121.

Further, the substrate holding unit of the first transfer device 121 holds the dicing frame F by sucking or gripping the dicing frame F. Thus, the substrate holding unit substantially horizontally holds the DF-attached laminated substrate T or the delaminated target substrate W.

An ID (identification) reading device configured to read out, e.g., an ID (identification) of the dicing frame F is disposed in the standby station 13. The DF-attached laminated substrate T under processing can be identified by the ID reading device.

In addition to the aforementioned ID reading process, where necessary, a standby process to temporarily keep the DF-attached laminated substrate T in a standby state is performed by a temporary standby unit in the standby station 13. A placing table, on which the DF-attached laminated substrate T transferred by the first transfer device 121 is placed, is provided in the standby station 13. The ID reading device and the temporary standby unit are placed on the placing table.

An edge cut device is disposed in the edge cut station 14. The edge cut device performs an edge cut process in which a peripheral edge of the bonding agent G (see FIG. 2) is removed by dissolving it with a solvent. This edge cut process removes the peripheral edge of the bonding agent G, which makes it possible to easily delaminate the target substrate W and the support substrate S in a delamination process which will be described below. Further, the edge cut device is configured to dissolve the peripheral edge of the bonding agent G with a solvent by immersing the laminated substrate T into the solvent for the bonding agent G.

A delamination process of delaminating the DF-attached laminated substrate T transferred by the first transfer device 121 into the target substrate W and the support substrate S is performed in the delamination station 15. A delamination device configured to perform the delamination process is provided in the delamination station 15. The detailed configuration and operation of the delamination device will be described below.

A cleaning process of cleaning the delaminated target substrate W is performed in the first cleaning station 16. A first cleaning device, which is configured to clean the delaminated target substrate W as it is held by the dicing frame F, is provided in the first cleaning station 16. The detailed configuration of the first cleaning device will be described below.

In the above-described first processing block 10, the ID reading process for the dicing frame F is performed in the standby station 13. Then, the edge cut process for the DF-attached laminated substrate T is performed in the edge cut station 14. Thereafter, the delamination process for the DF-attached laminated substrate T is performed in the delamination station 15. Further, in the first processing block 10, the delaminated target substrate W is cleaned in the first cleaning station 16 and then the cleaned target substrate W is transferred to the carry-in/carry-out station 11. Thereafter, the cleaned target substrate W is carried out of the carry-in/carry-out station 11.

Next, the configuration of the second processing block 20 will be described. The delivery station 21, the second cleaning station 22 and the carry-out station 24 are disposed adjacent to the second transfer region 23. Specifically, the delivery station 21 and the second cleaning station 22 are disposed at a front side of the second transfer region 23 in the Y-axis direction (or Y-axis forward direction). The carry-out station 24 is disposed at the back side of the second transfer region 23 in the Y-axis direction. The delivery station 21 is disposed adjacent to the delamination station 15 of the first processing block 10. The delivery station 21 includes a third transfer device 211, e.g., a Bernoulli chuck, which is configured to hold and to transfer the delaminated support substrate S in a non-contact manner. The delivery process is performed using the third transfer device 211. The detailed configuration of the third transfer device 50 will be described below.

A second cleaning process of cleaning the delaminated support substrate S is performed in the second cleaning station 22. A second cleaning device, which is configured to clean the delaminated support substrate S, is provided in the second cleaning station 22. The detailed configuration of the second cleaning device 22 will be described below.

The transfer of the support substrate S cleaned by the second cleaning device is performed in the second transfer region 23. A second transfer device 231 configured to transfer the support substrate S is provided in the second transfer region 23.

The second transfer device 231 is a substrate transfer device that includes a transfer arm unit and a substrate holding unit provided at a tip of the transfer arm unit. The transfer arm unit may be moved in horizontal and vertical directions, and may be rotated around its vertical axis. In the second transfer region 23, a process of transferring the delaminated support substrate S to the carry-out station 24 is performed by the second transfer device 231. The second transfer device 231 holds a substrate using the substrate holding unit and transfers the substrate held by the substrate holding unit to the carry-out station 24 using the transfer arm unit. Examples of the substrate holding unit of the second transfer device 231 may include a fork that substantially horizontally holds the support substrate S by supporting the support substrate S from below.

Cassettes Cs receiving the support substrate S are carried in from the outside or carried out to the outside in the carry-out station 24. A cassette placing table is provided in the carry-out station 24. A plurality of cassette placing plates 240a and 240b on each of which the cassette Cs configured to receive the delaminated support substrates S is placed are provided on the cassette placing table.

In the above-described second processing block 20, the delaminated support substrate S is transferred from the delamination station 15 to the second cleaning station 22 through the delivery station 21 and is then cleaned in the second cleaning station 22. Thereafter, in the second processing block 20, the cleaned support substrate S is transferred to the carry-out station 24 and is carried out of the carry-out station 24.

The delamination system 1 further includes a control device 30. The control device 30 is a device configured to control the operation of the delamination system 1. The control device 30 is, for example, a computer, and includes a control unit (not shown) and a storage unit (not shown). The storage unit stores a program for controlling various processes such as the delamination process. The control unit reads out and executes the program stored in the storage unit, thereby controlling the operation of the delamination system 1.

Further, the aforementioned program may be stored in a computer-readable recording medium and may be installed from the recording medium into the storage unit of the control device 30. The computer-readable recording medium may include a hard disk (HD), a flexible disk (FD), a compact disk (CD), a magneto-optical disk (MO), a memory card or the like.

Figure 5A:
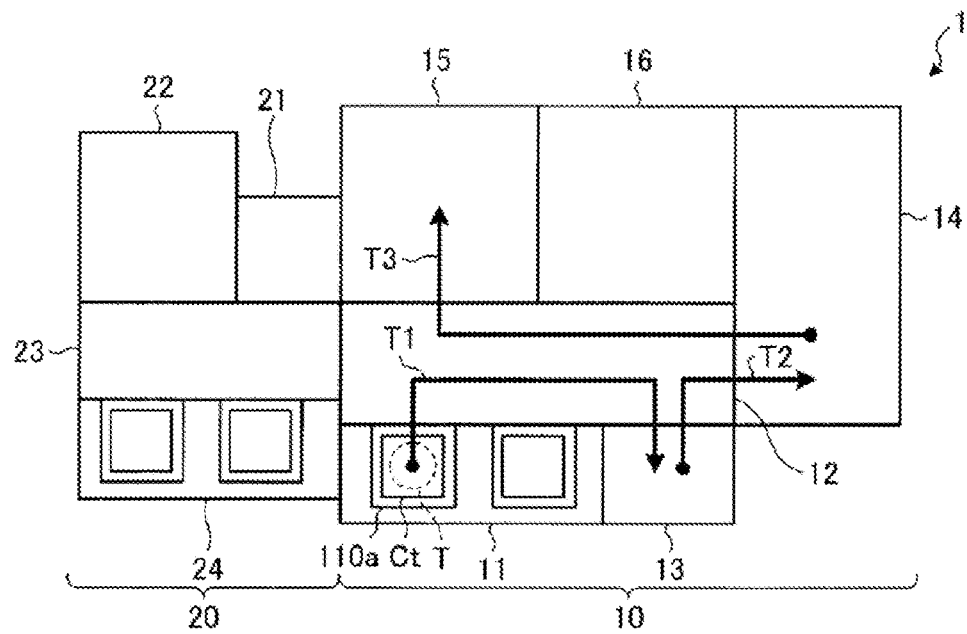
FIG. 5A is a schematic view showing a transfer route of a DF (dicing frame)-attached laminated substrate.
Figure 5B:
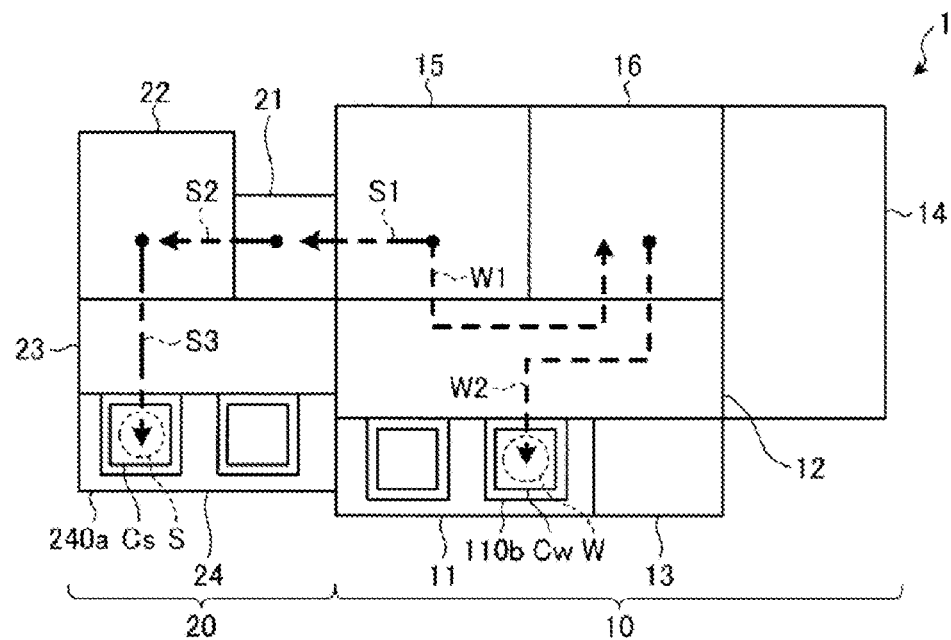
FIG. 5B is a schematic view showing transfer routes of a target substrate and a support substrate.

The operation of the above-described delamination system 1 will be described with reference to FIGS. 4, 5A and 5B. FIG. 4 is a flowchart illustrating a sequence of substrate processing operations performed by the delamination system 1. FIG. 5A is a schematic view showing the transfer route of a DF-attached laminated substrate T. FIG. 5B is a schematic view showing the transfer route of the target substrate W and the support substrate S. The delamination system 1 performs each processing operation shown in FIG. 4 under the control of the control device 30.

In the delamination system 1 configured as above, first, the first transfer device 121 (see FIG. 1), which is disposed in the first transfer region 12 of the first processing block 10, carries the DF-attached laminated substrate T from the cassette Ct placed in the carry-in/carry-out station 11 into the standby station 13 under the control of the control device 30 (see Step S101 in FIG. 4 and an arrow T1 in FIG. 5A).

Specifically, the first transfer device 121 advances the substrate holding unit to the carry-in/carry-out station 11 and allows the substrate holding unit to take out the DF-attached laminated substrate T accommodated in the cassette Ct. In this case, the substrate holding unit of the first transfer device 121 holds the DF-attached laminated substrate T from above as the target substrate W is positioned downward and the support substrate S is positioned upward. Then, the first transfer device 121 carries the DF-attached laminated substrate Tm, which is taken out of the cassette Ct, into the standby station 13.

Subsequently, in the standby station 13, the ID reading device reads the ID of the dicing frame F under the control of the control device 30 (at Step S102 in FIG. 4). The ID read by the ID reading device is transmitted to the control device 30.

Subsequently, under the control of the control device 30, the first transfer device 121 carries the DF-attached laminated substrate T out of the standby station 13 and transfers the same to the edge cut station 14 (see an arrow T2 in FIG. 5A). In the edge cut station 14, the edge cut device performs the edge cut process on the laminated substrate T under the control of the control device 30 (at Step S103 in FIG. 4). Since the peripheral edge of the bonding agent G is removed through the edge cut process, the target substrate W and the support substrate S can be easily delaminated in a subsequent delamination process. This shortens the time needed for the delamination process.

As described above, in the delamination system 1, the edge cut station 14 is provided in the first processing block 10. Therefore, the DF-attached laminated substrate T carried into the first processing block 10 can be directly carried into the edge cut station 14 using the first transfer device 121. Thus, the throughput from serial substrate processing processes can be improved in the delamination system 1. Further, the time spent from the edge cut process to the delamination process can be easily managed and the delamination performance can be stabilized.

Further, when the DF-attached laminated substrate T to be processed exists due to a difference in processing time between devices, the DF-attached laminated substrate T may be kept temporarily in a standby state by the temporary standby unit provided in the standby station 13. This can reduce the time loss between serial processes.

Subsequently, under the control of the control device 30, the first transfer device 121 carries the DF-attached laminated substrate T subjected to the edge cut process out of the edge cut station 14 and transfers the same to the delamination station 15 (see an arrow T3 in FIG. 5A). In the delamination station 15, the delamination device performs a delamination process on the laminated substrate T under the control of the control device 30 (at Step S104 in FIG. 4). By this delamination process, the laminated substrate T is divided into the target substrate W and the support substrate S.

Thereafter, in the delamination system 1, the delaminated target substrate W is processed in the first processing block 10 and the delaminated support substrate S is processed in the second processing block 20. In this case, the delaminated target substrate W is held by the dicing frame F.

First, in the first processing block 10, under the control of the control device 30, the first transfer device 121 carries the delaminated target substrate W out of the delamination device and transfers the same to the first cleaning station 16 (see an arrow W1 in FIG. 5B).

Then, in the first cleaning station 16, under the control of the control device 30, the first cleaning device cleans the bonding surface Wj of the delaminated target substrate W (at Step S105 in FIG. 4). This cleaning process removes the bonding agent G remaining on the bonding surface Wj of the target substrate W.

Subsequently, under the control of the control device 30, the first transfer device 121 carries the cleaned target substrate W out of the first cleaning device of the first cleaning station 16 and transfers the same to the cassette Cw placed in the carry-in/carry-out station 11 (see Step S106 in FIG. 4 and an arrow W2 in FIG. 5B). Thereafter, the target substrate W (the cassette Cw) is carried out of the carry-in/carry-out station 11 for collection. Thus, the process for the target substrate W is completed.

Further, the second processing block 20 performs Steps S107 to S109 (the processes for the delaminated support substrate S) in parallel with Steps S105 and S106 (the processes in the first processing block 10).

First, in the second processing block 20, the third transfer device 211 provided in the delivery station 21 deliveries the delaminated support substrate S under the control of the control device 30 (at Step S107 in FIG. 4). That is, the delaminated support substrate S is extracted from the delamination station 15 and is carried in the second cleaning station 22.

At Step S107, the third transfer device 211 receives the delaminated support substrate S from the delamination device (see an arrow 51 in FIG. 5B) and places the same on the second cleaning device of the second cleaning station 22 (see an arrow S2 in FIG. 5B).

In this case, the delaminated support substrate S is supported by the delamination device at its top surface (i.e., the non-bonding surface Sn) and the third transfer device 211 holds the bonding surface Sj of the support substrate S from below in a non-contact manner. Then, the third transfer device 211 carries the support substrate S into the second cleaning station 22, followed by inverting the support substrate S upside down, and followed by placing the same on the second cleaning device of the second cleaning station 22. Thus, the support substrate S is placed on the second cleaning device with the bonding surface Sj having the bonding agent G oriented upward. Then, under the control of the control device 30, the second cleaning device cleans the bonding surface Sj of the support substrate S (a second cleaning process) (at Step S108 in FIG. 4). This cleaning process removes the bonding agent G remaining on the bonding surface Sj of the support substrate S.

Subsequently, under the control of the control device 30, the second transfer device 231 carries the cleaned support substrate S out of the second cleaning device and transfers the same to the carry-out station 24 (see Step S109 in FIG. 4 and an arrow S3 in FIG. 5B). That is, the support substrate S subjected to the second cleaning process is extracted from the second cleaning station 22 by the second transfer device 231 disposed in the second transfer region 23 and is received in the cassette Cs placed in the carry-out station 24. Thereafter, the support substrate S (or the cassette Cs) is carried out of the carry-out station 24 for collection. Thus, the processes for the support substrate S are completed.

As described above, the delamination system 1 includes a front end (e.g., the carry-in/carry-out station 11 and the first transfer device 121) for one substrate (the laminated substrate T and the delaminated target substrate W) held by the dicing frame F and a front end (e.g., the carry-out station 24 and the second transfer device 231) for another substrate (the delaminated support substrate S) not held by the dicing frame F. This configuration allows the transfer of the cleaned target substrate W to the carry-in/carry-out station 11 and the transfer of the cleaned support substrate S to the carry-out station 24 to be performed in parallel, which makes it possible to efficiently perform the serial substrate processing processes.

Further, in the delamination system 1, the first processing block 10 (the delamination station 15) and the second processing block 20 (the second cleaning station 22) are connected to each other via the delivery station 21. Thus, the delaminated support substrate S can be directly extracted from the delamination station 15 without going through the first transfer region 12 and the second transfer region 23 and can be carried into the second processing block 20. It is therefore possible to smoothly transfer the delaminated support substrate S to the second cleaning device.

The first processing block 10 may include a mount device configured to attach the dicing frame F to the laminated substrate T. In this case, the laminated substrate T to which the dicing frame F is not attached is extracted from the cassette Ct and is carried into the mount device. In the mount device, the dicing frame F is attached to the laminated substrate T. Thereafter, the laminated substrate T fixed to the dicing frame F is transferred to the edge cut station 14 and the delamination station 15 one after another. Further, after the edge cut station 14 is moved to the second processing block 20, the mount device may be disposed in the place where the edge cut station 14 was installed.

Accordingly, according to the delamination system 1, the throughput of the serial substrate processing processes is improved.

<2. Configuration of Each Device>
<2-1. Delamination Device according to a First Embodiment>

Figure 6:
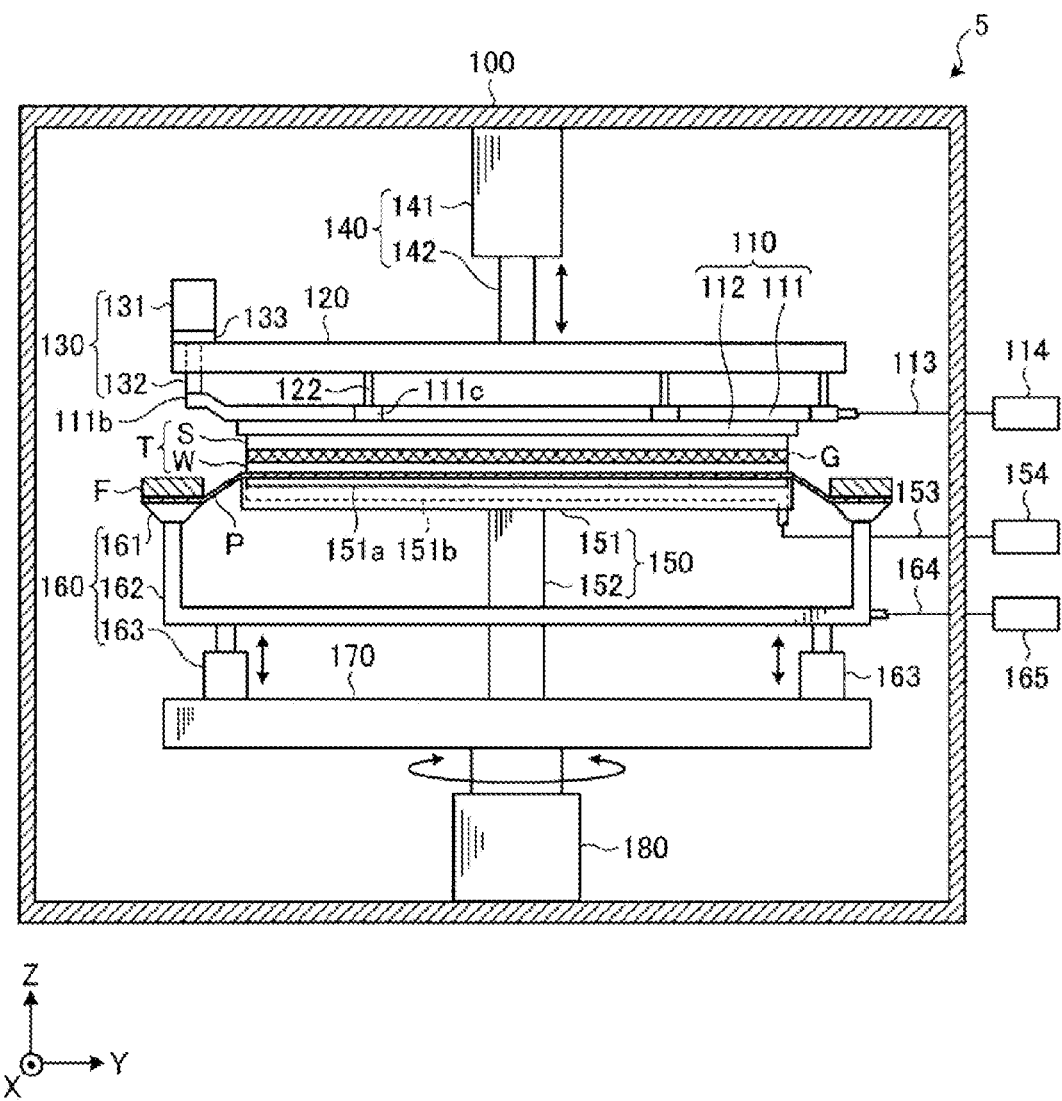
FIG. 6 is a schematic side view showing a configuration of a delamination device according to a first embodiment.

The configuration of each device included in the delamination system 1 will be described in detail. The configuration of the delamination device provided in the delamination station 15 and the delamination operation for the DF-attached laminated substrate T performed by the delamination device will first be described. FIG. 6 is a schematic side view showing the configuration of the delamination device according to the first embodiment.

As shown in FIG. 6, a delamination device 5 includes a processing chamber 100. Inlet/outlets (not shown) are formed in side surfaces of the processing chamber 100. Through the inlet/outlets, the DF-attached laminated substrate T is carried into the processing chamber 100 and the delaminated target substrate W and the delaminated support substrate S are carried out of the processing chamber 100. For example, in the inlet/outlets, opening/closing shutters are provided. The opening/closing shutters are configured to separate the interior of the processing chamber 100 from external regions, thereby preventing particles from entering the processing chamber 100. The inlet/outlets are respectively formed in the side surface of the processing chamber 100 adjacent to the first transfer region 12 and the side surface of the processing chamber 100 adjacent to the delivery station 21.

The delamination device 5 includes a first holding unit 110, an upper base unit 120, a local movement unit 130 and a movement mechanism 140. The delamination device 5 further includes a second holding unit 150, a frame holding unit 160, a lower base unit 170 and a rotation mechanism 180. These components of the delamination device 5 are disposed within the processing chamber 100.

The first holding unit 110 is supported by the upper base unit 120 from above. The upper base unit 120 is supported by the movement mechanism 140. The movement mechanism 140 moves the upper base unit 120 in the vertical direction so that the first holding unit 110 is moved upward or downward.

The second holding unit 150 is disposed below the first holding unit 110. The frame holding unit 160 is disposed outside the second holding unit 150. The second holding unit 150 and the frame holding unit 160 are supported by the lower base unit 170 from below. The lower base unit 170 is supported by the rotation mechanism 180. The rotation mechanism 180 rotates the lower base unit 170 around a vertical axis so that the second holding unit 150 and the frame holding unit 160 are rotated around the vertical axis.

In the delamination device 5, the first holding unit 110 holds the DF-attached laminated substrate T from above and the second holding unit 150 holds the DF-attached laminated substrate T from below. Further, the local movement unit 130 moves a portion of the outer peripheral portion of the first holding unit 110 away from the second holding unit 150. Thus, the delamination device 5 can delaminate the support substrate S from the target substrate W while the delamination progresses from the outer peripheral portion of the support substrate S toward the central portion thereof. Each component of the delamination device 5 will be described below in more detail.

Figure 7A:
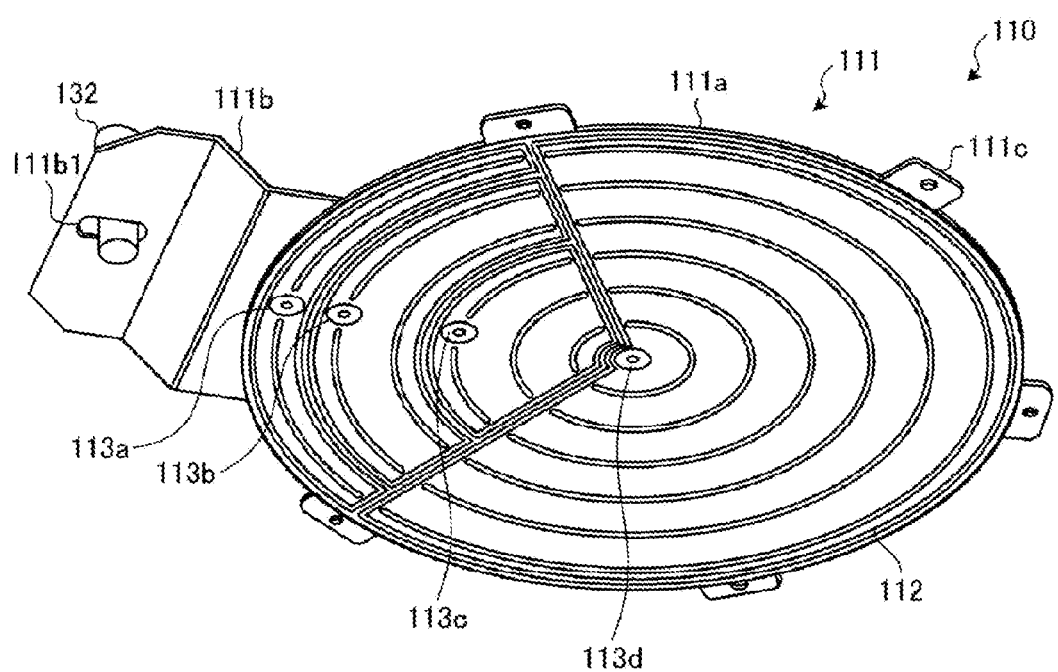
FIG. 7A is a schematic perspective view showing a configuration of a first holding unit.
Figure 7B:
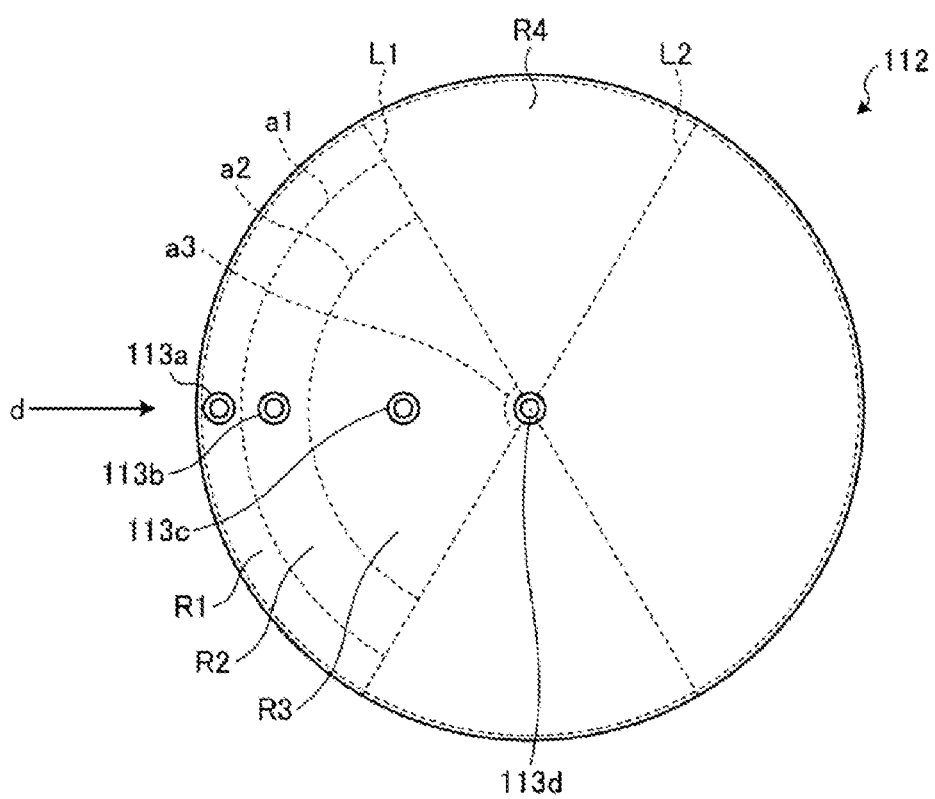
FIG. 7B is a schematic plane view showing a configuration of a suction pad.

The first holding unit 110 is a holding unit configured to suck and hold the support substrate S constituting the DF-attached laminated substrate T. The first holding unit 110 is formed of a pliable member so that the shape of the first holding unit 110 can pliably change when the first holding unit 110 is pulled by the local movement unit 130 (which will be described later). Now, the detailed configuration of the first holding unit 110 will be described with reference to FIGS. 7A and 7B. FIG. 7A is a schematic perspective view showing the configuration of the first holding unit 110. FIG. 7B is a schematic plane view showing a configuration of a suction pad.

As shown in FIG. 7A, the first holding unit 110 includes a thin plate-shaped body 111 and a suction pad 112 attached to a surface of the body 111. The body 111 is formed of an elastic member such as a leaf spring or the like. The suction pad 112 is formed of a resin member.

The body 111 has a disc section 111a having a diameter substantially equal to the diameter of the DF-attached laminated substrate T. The suction pad 112 is attached to a bottom surface of the disc section 111a.

A pulling section 111b is provided in an outer periphery of the disc section 111a. An attachment portion 111b1 in which a cylinder 132 of the local movement unit 130 (which will be described later) is mounted is formed at a tip of the pulling section 111b.

A plurality of fixing sections 111c is provided at the outer periphery of the disc section 111a. The fixing sections 111c are provided in positions corresponding to support members 122 (which will be described later) of the upper base unit 120 and are fixed to the support members 122. The first holding unit 110 is supported by the upper base unit 120 by fixing the fixing sections 111c to the support members 122 of the upper base unit 120.

Although FIG. 7A illustrates that five fixing sections 111c are provided in the disc section 111a, the number of the fixing sections 111c provided in the disc section 111a is not limited to five.

The suction pad 112 is a disc-shaped resin member in which a suction region for the DF-attached laminated substrate T is formed. As shown in FIG. 7B, the suction region of the suction pad 112 is divided into a plurality of individual regions R1 to R4 by a plurality of straight lines L1 and L2 radially extending from a center of the suction pad 112 and by a plurality of circular arcs a1 to a3.

Suction ports 113a to 113d are formed in the individual regions R1 to R4, respectively. The respective suction ports 113a to 113d are connected to a suction device 114 such as a vacuum pump or the like through a suction pipe 113 shown in FIG. 6. The first holding unit 110 sucks the support substrate S constituting the DF-attached laminated substrate T through each of the suction ports 113a to 113d by virtue of suction of the suction device 114 and thus holds the support substrate S at each individual region R1 to R4.

As described above, the suction region of the suction pad 112 is divided into the plurality of individual regions R1 to R4 and the support substrate S is held by virtue of the suction at each individual region R1 to R4. Thus, even if air is leaked in some of the individual regions, the support substrate S can be stably held through other individual regions.

Further, as for the respective individual regions R1 to R4, the individual region defined at a rear side of a delamination progress direction d is larger than the individual region defined at a front side of the delamination progress direction d. By way of example, the individual regions R1 to R3 are disposed along the delamination progress direction d in that order. The individual region R2 is larger than the individual region R1. The individual region R3 is larger than the individual region R2.

If the suction region is smaller, then the suction force may be larger in that suction region. With the above-described configuration, the suction force in the individual region R1 defined at the rear side of the delamination progress direction d can be larger than the suction force in other individual regions R2 to R4. The individual region defined at the rear side of the delamination progress direction d is a region where the largest force is required during delaminating the target substrate W and the support substrate S. Therefore, by increasing the suction force in the individual region defined at the rear side of the delamination progress direction d, the target substrate W and the support substrate S can be reliably delaminated.

Further, the suction ports 113a to 113d of the individual regions R1 to R4 are formed in a line along the delamination progress direction d. Thus, the support substrate S can be reliably held during the delamination operation.

In this embodiment, although the lines L1 and L2 are illustrated as straight lines, the lines L1 and L2 do not necessarily need to be a straight line. Further, in this embodiment, one suction device 114 is connected to the suction ports 113a to 113d, but suction devices may be provided for each of the suction ports 113a to 113d.

The configuration of the delamination device 5 will further e described with reference to FIG. 6. The upper base unit 120 is located opposite to the first holding unit 110 with a gap left therebetween. The plurality of support members 122 is formed on the underside of the upper base unit 120 to protrude toward the first holding unit 110. The support members 122 and the fixing sections 111c of the first holding unit 110 are fixed to each other so that the first holding unit 110 is supported by the upper base unit 120.

The local movement unit 130 moves a portion of the outer periphery of the first holding unit 110 away from the second holding unit 150. Specifically, the local movement unit 130 includes a body 131 and the cylinder 132. The body 131 is fixed to the upper base unit 120. The cylinder 132 is fixed to the body 131 at its base end and is vertically moved by the body 131. A leading end portion of the cylinder 132 is fixed to the attachment portion 111b1 of the pulling section 111b (see FIG. 7A), which is provided in the body 111 of the first holding unit 110.

The local movement unit 130 moves the cylinder 132 vertically upward by the body 131 so that the pulling section 111b fixed to the cylinder 132 is vertically moved upward. As a result, said portion of the outer periphery of the support substrate S held by the first holding unit 110 is moved vertically upward so that the support substrate S is delaminated from the target substrate W held by the second holding unit 150.

A load cell 133 is provided in the local movement unit 130 to detect a load applied to the cylinder 132. The local movement unit 130 can pull the first holding unit 110 while controlling a force applied vertically upward to the support substrate S based on the detection result obtained at the load cell 133.

Figure 8A:
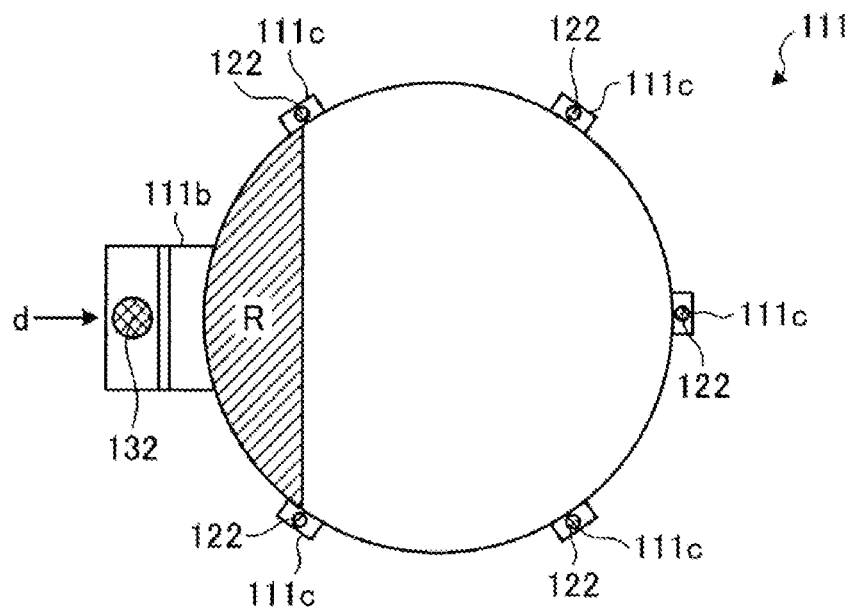
FIG. 8A is a schematic plane view showing a body of the first holding unit.
Figure 8B:
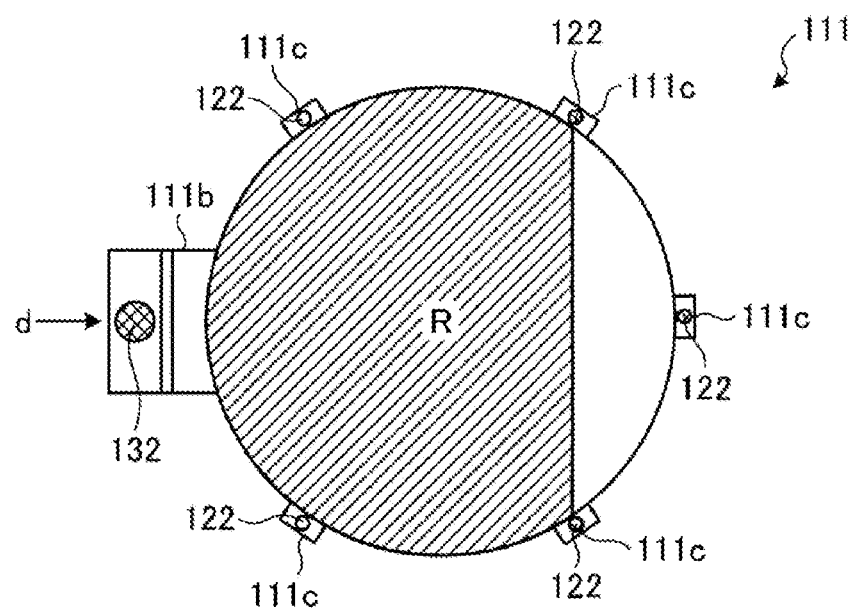
FIG. 8B is another schematic plane view showing the body of the first holding unit.

In the delamination device 5 according to the first embodiment, the movement of the first holding unit 110 caused by the local movement unit 130 may be adjusted by fixing all or some of the fixing sections 111c provided in the body 111 of the first holding unit 110 to the support members 122. This will be described with reference to FIGS. 8A and 8B. FIGS. 8A and 8B are schematic plane views of the body 111 of the first holding unit 110.

If the five fixing sections 111c provided in the body 111 of the first holding unit 110 are all fixed to the support members 122 as shown in FIG. 8A, a region R in which the first holding unit 110 can be moved by the local movement unit 130 is limited to the region ranging from the rear side of the delamination progress direction d to the two fixing sections 111c positioned nearest to the rear side. In contrast, if the support members 122 are removed from the two fixing sections 111c positioned at the rear side of the delamination progress direction d as shown in FIG. 8B, then the region R in which the first holding unit 110 can be moved by the local movement unit 130 can be set larger than the region R shown in FIG. 8A.

As described above, the fixing sections 111c are configured to fix the first holding unit 110 to the upper base unit 120. In addition, the fixing sections 111c are provided along the circumferential direction of the outer periphery of the body 111 and are fixed to the support members 122. Thus, the fixing sections 111c are configured to limit the movement of the first holding unit 110 caused by the local movement unit 130.

The configuration of the delamination device 5 will be further described with reference to FIG. 6. The movement mechanism 140 is disposed above the upper base unit 120. The movement mechanism 140 includes a body 141 and a drive unit 142. The body 141 is fixed to a ceiling of the processing chamber 100. The drive unit 142 is fixed to the body 141 at its base and is configured to vertically move. A motor or a cylinder may be used as the drive unit 142. The drive unit 142 is coupled to the upper base unit 120 at its leading end.

The movement mechanism 140 moves the drive unit 142 vertically upward by the body 141, thereby moving the upper base unit 120 coupled to the drive unit 142 along the vertical direction. Thus, the first holding unit 110 and the local movement unit 130, which are supported by the upper base unit 120, are moved up and down.

The second holding unit 150 is disposed below the first holding unit 110 to be opposite to the first holding unit 110. The second holding unit 150 sucks and holds the target substrate W, which constitutes the DF-attached laminated substrate T, via the dicing tape P.

The second holding unit 150 includes a disc-shaped body 151 and a prop member 152 supporting the body 151. The prop member 152 is supported on the lower base unit 170.

The body 151 is formed of a metal material such as aluminum or the like. The body 151 has a suction surface 151a on its top side. The suction surface 151a has a diameter substantially equal to the diameter of the DF-attached laminated substrate T. The suction surface 151a is brought into contact with the bottom surface of the DF-attached laminated substrate T (i.e., the non-bonding surface Wn of the target substrate W). The suction surface 151a is formed of a porous body or porous ceramics such as a silicon carbide or the like.

A suction space 151b communicating with the outside through the suction surface 151a is formed in the body 151. The suction space 151b is connected to a suction device 154 such as a vacuum pump or the like through a suction pipe 153.

The second holding unit 150 holds the target substrate W in such a manner that the non-bonding surface Wn of the target substrate W is sucked to the suction surface 151a via the dicing tape P under a negative pressure generated by a suction force of the suction device 154. In this embodiment, although a porous chuck is used as the second holding unit 150, the second holding unit 150 is not limited thereto. By way of example, an electrostatic chuck may be used as the second holding unit 150.

The frame holding unit 160 is disposed at the outside of the second holding unit 150. The frame holding unit 160 holds the dicing frame F from below. The frame holding unit 160 includes: a plurality of suction portions 161 configured to suck and hold the dicing frame F; a support member 162 configured to support the suction portions 161; and a movement mechanism 163 fixed to the lower base unit 170 and configured to vertically move the support member 162.

The suction portions 161 are made of an elastic material such as rubber or the like and are positioned in the four positions corresponding to front, rear, left and right locations of the dicing frame F shown in FIGS. 3A and 3B. The suction portions 161 are formed with suction ports (not shown), which are connected to a suction device 165 such as a vacuum pump or the like through the support member 162 and the suction pipe 164.

The frame holding unit 160 holds the dicing frame F in such a manner that the dicing frame F is sucked by means of a negative pressure generated by a suction force of the suction device 165. Further, the frame holding unit 160 moves the support member 162 and the suction portions 161 along the vertical direction by the movement mechanism 161 while holding the dicing frame F, thus moving the dicing frame F along the vertical direction.

The lower base unit 170 is disposed below the second holding unit 150 and the frame holding unit 160 to support the second holding unit 150 and the frame holding unit 160. The lower base unit 170 is supported by the rotation mechanism 180 that is fixed to a floor surface of the processing chamber 100. The lower base unit 170 is rotated around its vertical axis by the rotation mechanism 180, whereby the second holding unit 150 and the frame holding unit 160 supported on the lower base unit 170 are rotated around the vertical axis.

Figure 9:
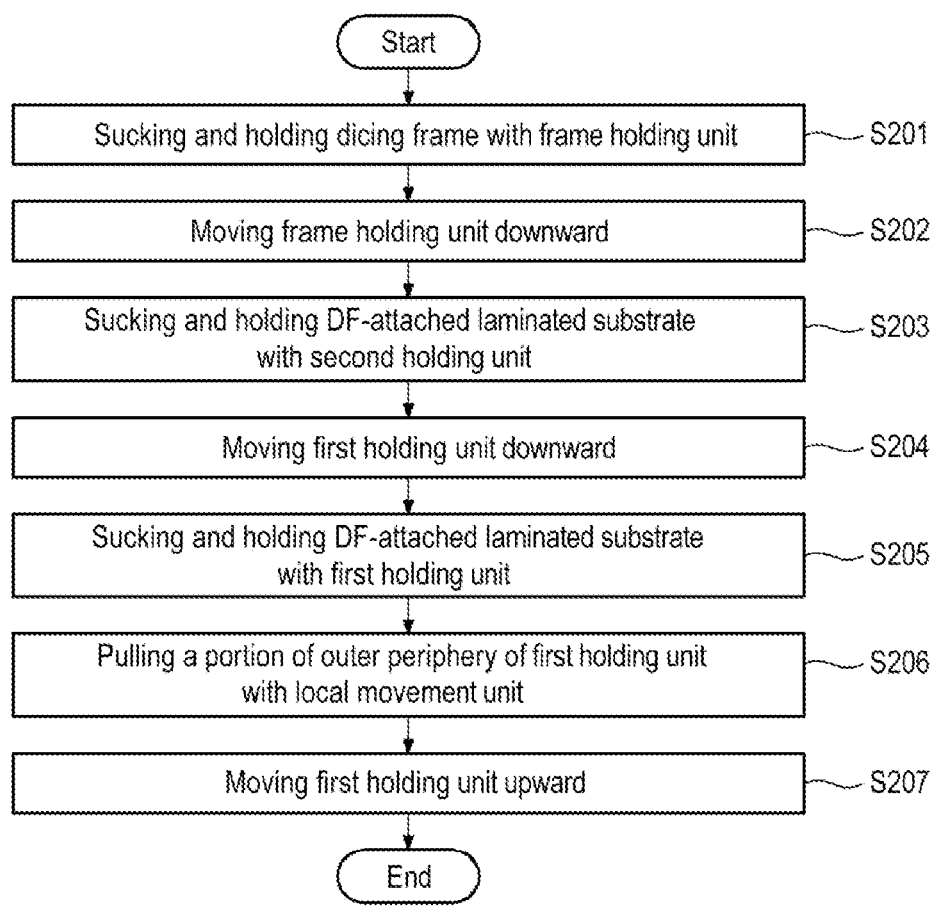
FIG. 9 is a flowchart showing a sequence of delamination processes performed by the delamination device according to the first embodiment.

Next, the operation of the delamination device 5 will be described with reference to FIGS. 9 and 10A to 10E. FIG. 9 is a flowchart showing a sequence of operations of the delamination process. FIGS. 10A to 10E illustrate a delamination operation performed by the delamination device 5. Under the control of the control device 30, the delamination device 5 performs the delamination operations shown in FIG. 9.

First, the frame holding unit 160 of the delamination device 5 sucks and holds, from below, the dicing frame F of the DF-attached laminated substrate T, which is carried into the delamination station 15 by the first transfer device 121 (at Step S201). In this case, the DF-attached laminated substrate T is held only by the frame holding unit 160 (see FIG. 10A).

Subsequently, the movement mechanism 163 (see FIG. 6) of the delamination device 5 moves the frame holding unit 160 downward at Step S202). Thus, the target substrate W of the DF-attached laminated substrate T is brought into contact with the second holding unit 150 via the dicing tape P (see FIG. 10B). Thereafter, the second holding unit 150 of the delamination device 5 sucks and holds the DF-attached laminated substrate T (at Step S203) via the dicing tape P. Then, the DF-attached laminated substrate T is supported as the target substrate W is held by the second holding unit 150 and the dicing frame F is held by the frame holding unit 160.

Next, the movement mechanism 140 of the delamination device 5 moves the first holding unit 110 downward (at Step S204). Thus, the support substrate S of the DF-attached laminated substrate T is brought into contact with the first holding unit 110 (see FIG. 10C). Thereafter, the first holding unit 110 of the delamination device 5 sucks and holds the support substrate S constituting the DF-attached laminated substrate T (at Step S205).

Subsequently, the local movement unit 130 of the delamination device 5 pulls the portion of the outer periphery of the first holding unit 110 (at Step S206). Specifically, the local movement unit 130 moves the pulling section 111b provided in the body 111 of the first holding unit 110 vertically upward by the actuation of the cylinder 132. Thus, the outer periphery of the DF-attached laminated substrate T is pulled vertically upward and the support substrate S begins to be delaminated from the target substrate W, in which the delamination progresses from the outer periphery of the support substrate S toward the central portion thereof (see FIG. 10D).

As described above, the first holding unit 110 is formed of the pliable material. Therefore, if the local movement unit 130 pulls the pulling section 111b of the first holding unit 110 vertically upward, then the first holding unit 110 pliably deforms along with the pulling operation. Accordingly, the delamination device 5 can delaminate the support substrate S from the target substrate W without applying a heavy load to the target substrate W.

Then, the movement mechanism 140 of the delamination device 5 moves the first holding unit 110 upward (in Step S207). Thus, the support substrate S is delaminated from the target substrate W. Thereafter, the delamination device 5 finishes the delamination process.

Further, after the target substrate W and the support substrate S are delaminated from each other, the rotation mechanism 180 of the delamination device 5 may rotate the second holding unit 150 and the frame holding unit 160. Thus, even if the bonding agent G adheres to the support substrate S and the target substrate W, such a bonding agent G can be twisted and then cut.

Figure 10A:
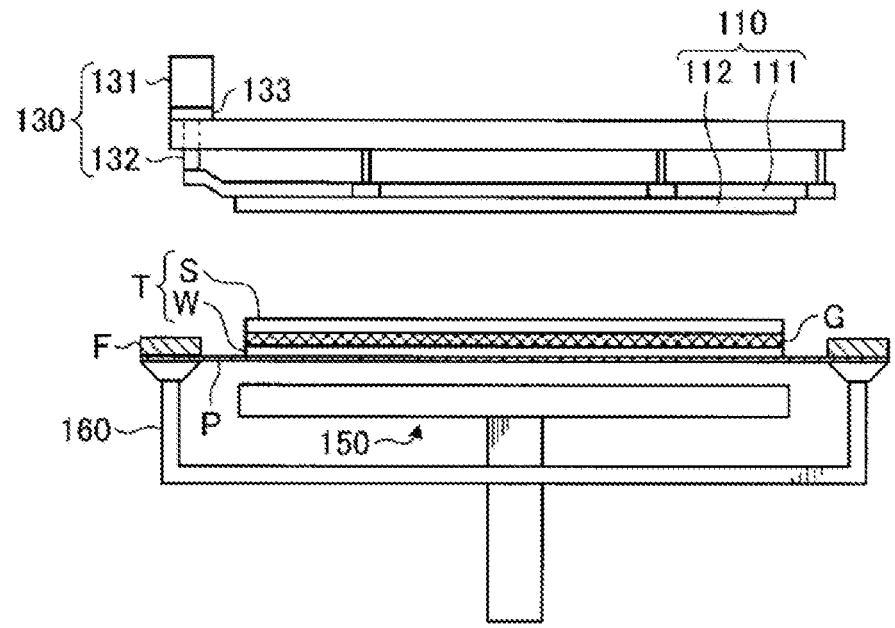
FIGS. 10A to 10E are views illustrating delamination operations performed by the delamination device.
Figure 10B:
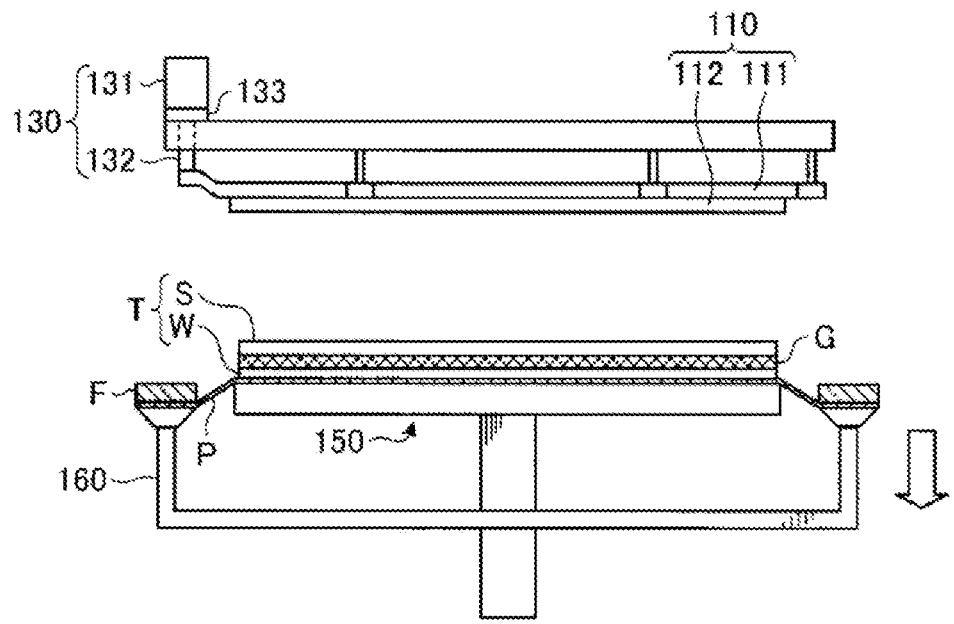
Figure 10C:
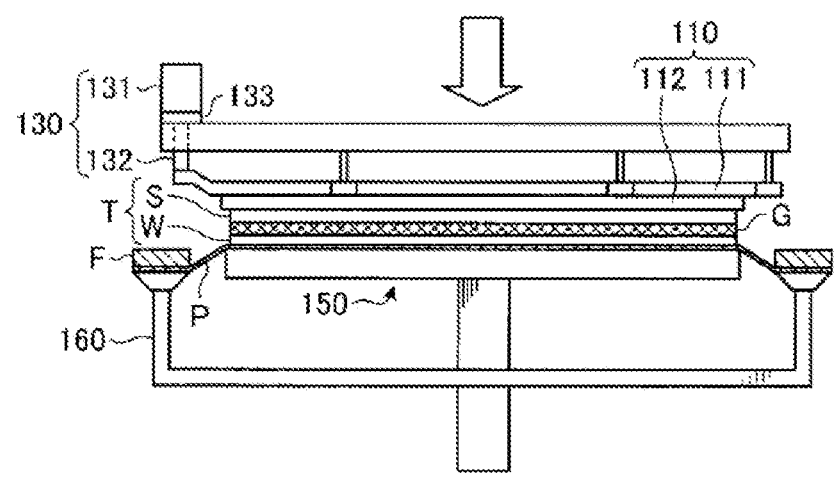
Figure 10D:
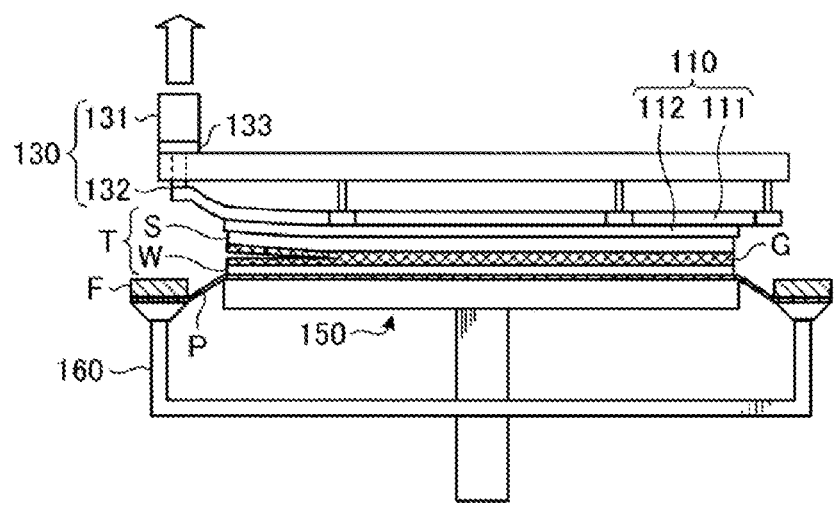
Figure 10E:
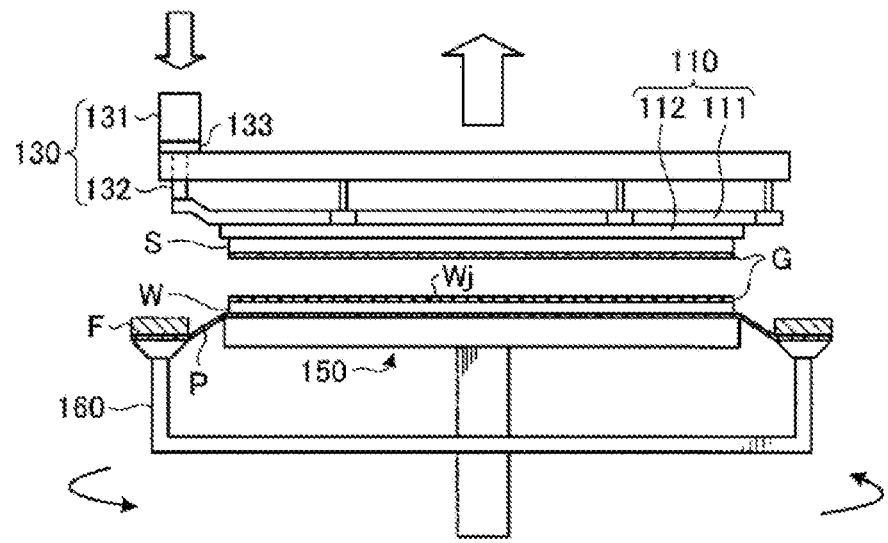

After the delamination device 5 finishes the delamination process, the first transfer device 121 carries the delaminated target substrate W out of the delamination device 5 and transfers the same to the first cleaning station 16. At this time, as shown in FIG. 10E, the delaminated target substrate W is held by the second holding unit 150 as the bonding surface Wj to be cleaned faces upward. Thus, the first transfer device 121 can transfer the delaminated target substrate W to the first cleaning station 16 without turning upside down the target substrate W after carrying the delaminated target substrate W out of the delamination device 5.

As described above, in the delamination device 5 according to the above-described first embodiment, the first holding unit 110 holds the support substrate S of the DF-attached laminated substrate T from above and the second holding unit 150 holds the target substrate W of the DF-attached laminated substrate T from below via the dicing tape P. Therefore, the delamination device 5 does not need to turn upside down the delaminated target substrate W, enhancing the efficiency of the delamination process.

Further, in the delamination device 5 according to the first embodiment, the first holding unit 110 is made of the pliable member, which makes it possible to delaminate the support substrate S from the target substrate W without applying a heavy load to the target substrate W. Thus, the delamination process for the support substrate S and the target substrate W can be efficiently performed.

<2-2. Configuration of First Cleaning Device>

Figure 11A:
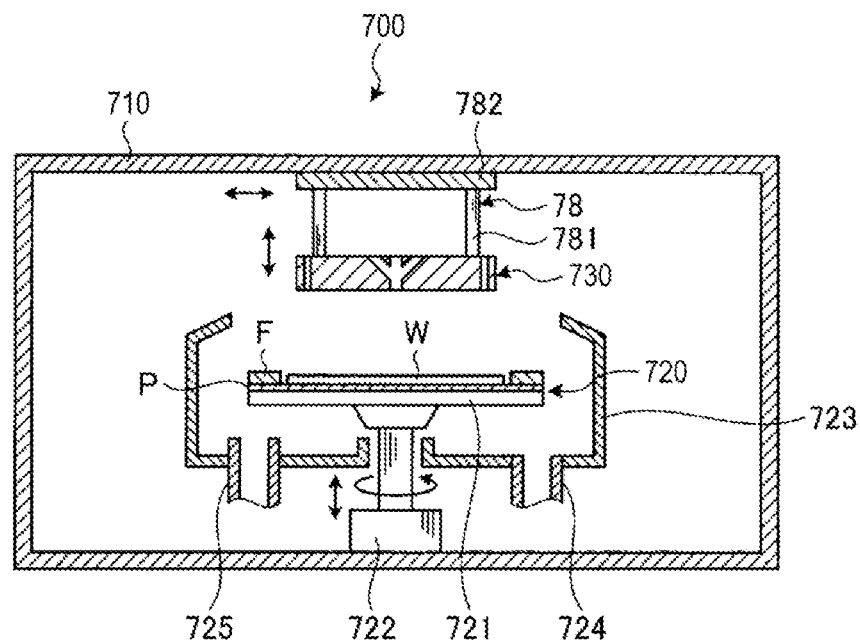
FIG. 11A is a schematic side view showing a configuration of a first cleaning device.
Figure 11B:
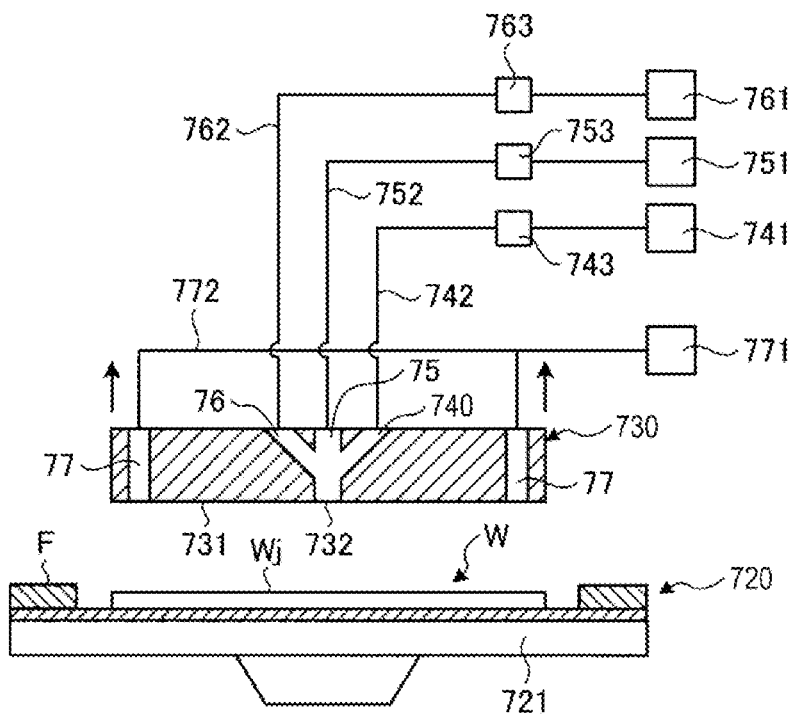
FIG. 11B is another schematic side view showing the configuration of the first cleaning device.
Figure 11C:
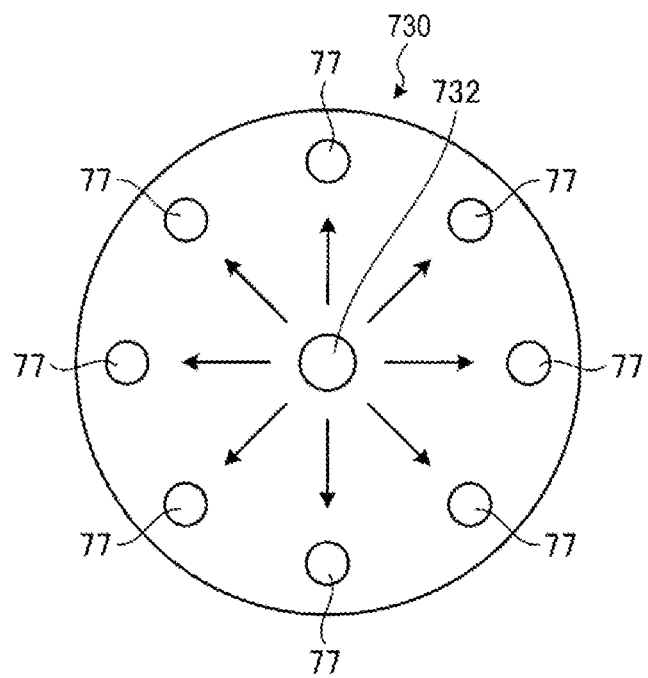
FIG. 11C is a schematic plane view showing a configuration of a cleaning jig.

Next, the configuration of the first cleaning device will be described with reference to FIGS. 11A through 11C. FIGS. 11A and 11B are schematic side views showing the configuration of the first cleaning device. FIG. 11C is a schematic plane view showing the configuration of a cleaning jig.

As shown in FIG. 11A, the first cleaning device 700 includes a processing container 710. An inlet/outlet (not shown) through which the target substrate W is carried in and out is formed in a side surface of the processing container 710. An opening/closing shutter (not shown) is provided in the inlet/outlet. A filter (not shown) configured to purify an internal atmosphere of the processing container 710 is provided in the processing container 710.

A substrate holding unit 720 is centrally disposed in the processing container 710. The substrate holding unit 720 includes a spin chuck 721 which holds and rotates the dicing frame F and the target substrate W.

The spin chuck 721 has a horizontal top surface, in which suction ports (not shown) through which, for example, the dicing tape P is sucked, are formed. By a suction force through the suction ports, the target substrate W is sucked and held on the spin chuck 721 via the dicing tape P. In this case, the target substrate W is sucked and held by the spin chuck 721 with the bonding surface Wj oriented upward.

A chuck driving unit 722 including, e.g., a motor is disposed below the spin chuck 721. The spin chuck 721 is rotated at a predetermined speed by the chuck driving unit 722. The chuck driving unit 722 includes an up-and-down drive source such as a cylinder. The spin chuck 721 is moved up and down by the up-and-down drive source.

A cup 723, which receives and collects liquid scattering or falling from the target substrate W, is disposed around the substrate holding unit 720. A drain pipe 724 configured to drain the collected liquid and an exhaust pipe 725 configured to exhaust an internal atmosphere of the cup 723 are connected to the underside of the cup 723.

A cleaning jig 730 configured to clean the bonding surface Wj of the target substrate W is disposed above the substrate holding unit 720. The cleaning jig 730 is located opposite to the target substrate W held by the substrate holding unit 720. A configuration of the cleaning jig 730 will be described with reference to FIGS. 11B and 11C.

As shown in FIGS. 11B and 11C, the cleaning jig 730 has a substantially disc-like shape. A supply surface 731 is formed at a bottom of cleaning jig 730 to cover at least the bonding surface Wj of the target substrate W. In this embodiment, the supply surface 731 has substantially the same size as the bonding surface Wj of the target substrate W.

A solvent supply portion 740, a rinse liquid supply portion 75, and an inert gas supply portion 76 are provided in a central region of the cleaning jig 730. The solvent supply portion 740 is configured to supply a solvent for the bonding agent G (e.g., thinner) in between the supply surface 731 and the bonding surface Wj, and the rinse liquid supply portion 75 is configured to supply a rinse liquid for the solvent. The inert gas supply portion 76 is configured to supply an inert gas (e.g., a nitrogen gas). The solvent supply portion 740, the rinse liquid supply portion 75 and the inert gas supply portion 76 are joined inside the cleaning jig 730 and then are extended to a supply outlet 732 formed in the supply surface 731 of the cleaning jig 730. That is, a solvent flow path from the solvent supply portion 740 to the supply outlet 732, a rinse liquid flow path from the rinse liquid supply portion 75 to the supply outlet 732 and an inert gas flow path from the inert gas supply portion 76 to the supply outlet 732 pass through the cleaning jig 730 in a thickness direction. Depending on the major component of the solvent for the bonding agent G, a variety of liquids may be used as the rinse liquid. For example, pure water or IPA (isopropyl alcohol) may be used as the rinse liquid. For faster drying of the rinse liquid, a highly volatile liquid may be used as the rinse liquid.

A supply pipe 742, which communicates with a solvent supply source 741 storing a solvent therein, is connected to the solvent supply portion 740. A supply kit 743, which is equipped with a valve or a flow rate controller for controlling the flow of a solvent, is provided at the supply pipe 742. A supply pipe 752, which communicates with a rinse liquid supply source 751 storing a rinse liquid therein, is connected to the rinse liquid supply portion 75. A supply kit 753, which is equipped with a valve or a flow rate controller for controlling the flow of a rinse liquid, is provided at the supply pipe 752. A supply pipe 762, which communicates an inert gas supply source 761 storing an inert gas therein, is connected to the inert gas supply portion 76. A supply kit 763, which is equipped with a valve or a flow rate controller for controlling the flow of an inert gas, is provided at the supply pipe 762.

Suction portions 77 for suctioning the solvent or the rinse liquid existing in a clearance between the supply surface 731 and the bonding surface Wj are provided in the outer periphery of the cleaning jig 730. The suction portions 77 pass through the cleaning jig 730 in the thickness direction. Further, the suction portions 77 are positioned at an equal spacing in a plurality of locations (e.g., eight locations) along the circumference of the cleaning jig 730 (see FIG. 11C). A suction pipe 772 communicating with a negative pressure generating device 771 (e.g., a vacuum pump) is connected to each of the suction portions 77.

As shown in FIG. 11A, a movement mechanism 78, which moves the cleaning jig 730 vertically and horizontally, is provided at a ceiling surface of the processing container 710 above the cleaning jig 730. The movement mechanism 78 includes a support member 781 configured to support the cleaning jig 730 and a jig driving unit 782 configured to support the support member 781 and vertically and horizontally move the cleaning jig 730.

The first transfer device 121 holds the dicing frame F, which is held by the frame holding unit 160 (see FIG. 6) of the delamination device 5, from above so that the delaminated target substrate W is held by the first transfer device 121. Then, the first transfer device 121 places the delaminated target substrate W on the spin chuck 721 of the first cleaning device 700. Thus, the delaminated target substrate W is placed on the spin chuck 721 as the bonding surface Wj oriented upward.

Then, under the control of the control device 30, the first cleaning device 700 performs a cleaning process (first cleaning process) on the target substrate W placed on the substrate holding unit 72.

First, the first cleaning device 700 sucks and holds the target substrate W and the dicing frame F using the spin chuck 721 with the dicing tape pipeline P interposed therebetween. Then, the first cleaning device 700 adjusts a horizontal position of the cleaning jig 730 and then moves the cleaning jig 730 downward to a predetermined position by the movement mechanism 78. In this case, a distance between the supply surface 731 of the cleaning jig 730 and the bonding surface Wj of the target substrate W is set to a distance at which, as described below, the solvent for the bonding agent G can be diffused due to a surface tension between the supply surface 731 and the bonding surface Wj.

Thereafter, the first cleaning device 700 supplies the solvent from the solvent supply source 741 to the solvent supply portion 740 while rotating the target substrate W by the spin chuck 721. The solvent is supplied from the supply outlet 732 to a space defined between the supply surface 731 and the bonding surface Wj. In this space, the solvent is diffused on the bonding surface Wj of the target substrate W due to the surface tension of the solvent and the centrifugal force caused by the rotation of the target substrate W. At this time, the first cleaning device 700 appropriately sucks the solvent by the suction portions 77 such that the solvent does not flow onto the dicing tape P. This can prevent the deterioration in strength of the dicing tape P caused by the solvent. In the above-described manner, the solvent is supplied to the entire bonding surface Wj of the target substrate W.

Thereafter, the first cleaning device 700 maintains, for a predetermined time (e.g., several minutes), the state that the bonding surface Wj of the target substrate W is immersed in the solvent. By doing so, the impurities such as the bonding agent G remaining on the bonding surface Wj are removed by the solvent.

Then, the first cleaning device 700 moves the cleaning jig 730 upward to a predetermined position while continuously rotating the target substrate W by the spin chuck 721 and continuously suctioning the solvent by the suction portions 77. Subsequently, the first cleaning device 700 supplies the rinse liquid from the rinse liquid supply source 751 to the rinse liquid supply portion 75. The rinse liquid is diffused on the bonding surface Wj of the target substrate W due to a surface tension and a centrifugal force while being mixed with the solvent. Thus, a mixture of the solvent and the rinse liquid is supplied to the entire bonding surface Wj of the target substrate W.

Thereafter, the first cleaning device 700 moves the cleaning jig 730 downward to a predetermined position while continuously rotating the target substrate W by the spin chuck 721 and continuously suctioning the mixture of the solvent and the rinse liquid by the suction portions 77. Then, the inert gas is supplied from the inert gas supply source 761 through the inert gas supply portion 76 and the supply outlet 732. The inert gas makes the mixture of the solvent and the rinse liquid flow outward of the target substrate W. Thus, the mixture of the solvent and the rinse liquid is suctioned through the suction portions 77 and is removed from the bonding surface Wj of the target substrate W.

Thereafter, the first cleaning device 700 dries the target substrate W by continuously rotating the target substrate W by the spin chuck 721 and continuously supplying the inert gas. Thus, the cleaning process (first cleaning process) for the target substrate W is finished. The cleaned target substrate W is carried out of the first cleaning device 700 and is transferred to the cassette Cw of the carry-in/carry-out station 11 by the first transfer device 121.

<2-3. Configuration of Third Transfer Device>

Figure 12:
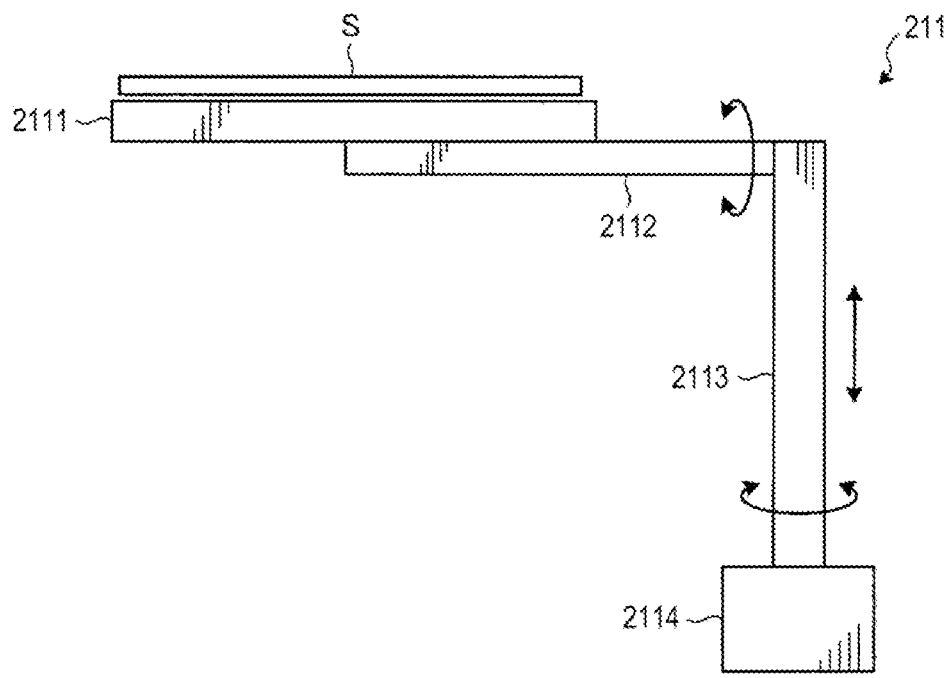
FIG. 12 is a schematic side view showing a configuration of a third transfer device.

Next, a configuration of the third transfer device 211 provided in the delivery station 21 will be described with reference to FIG. 12. FIG. 12 is a schematic side view showing the configuration of the third transfer device 211.

As shown in FIG. 12, the third transfer device 211 includes a Bernoulli chuck 2111 holding the support substrate S. The Bernoulli chuck 2111 injects gas from an injection port formed on its suction surface toward the surface of the support substrate S. The Bernoulli chuck 2111 holds the support substrate S in a non-contact manner by using a change in negative pressure, which is caused by the change in flow velocity of the gas according to the gap between the suction surface and the surface of the support substrate S.

Further, the third transfer device 211 includes a first arm 2112, a second arm 2113 and a base 2114. The first arm 2112 horizontally extends and supports the Bernoulli chuck 2111 at its tip. The second arm 2113 vertically extends and supports a base end portion of the first arm 2112 at its tip. A drive mechanism rotating the first arm 2112 around a horizontal axis is provided in the tip portion of the second arm 2113. By rotating the first arm 2112 around the horizontal axis by means of the drive mechanism, the Bernoulli chuck 2111 can be turned upside down.

The base 2114 supports a base end portion of the second arm 2113. A drive mechanism that rotates and vertically moves the second arm 2113 is provided in the base 2114. By rotating or vertically moving the second arm 2113 by means of the drive mechanism, the Bernoulli chuck 2111 can be moved up and down along the vertical axis and be swung around the vertical axis.

Under the control of the control device 30, the third transfer device 211 performs a delivery process of receiving the delaminated support substrate S from the delamination device 5 and then delivering the delaminated support substrate S to a second cleaning device 800.

Specifically, the third transfer device 211 holds the support substrate S, which is held from above by the first holding unit 110 of the delamination device 5, from below by means of the Bernoulli chuck 2111. Thus, the support substrate S is held on the Bernoulli chuck 2111 as the non-bonding surface Sn faces upward. Then, the third transfer device 211 rotates the second arm 2113 around the vertical axis, thereby swinging the Bernoulli chuck 2111. Thus, the support substrate S held on the Bernoulli chuck 2111 is moved from the delamination station 15 to the second cleaning station 22 via the delivery station 21.

Subsequently, the third transfer device 211 rotates the first arm 2112 around the horizontal axis, thereby turning upside down the Bernoulli chuck 2111. Thus, the support substrate S is positioned as the non-bonding surface Sn faces downward. Then, the third transfer device 211 moves the Bernoulli chuck 2111 downward by moving the second arm 2113 downward and places the support substrate S held on the Bernoulli chuck 2111 to the second cleaning device. Thus, the support substrate S is placed on the second cleaning device as the bonding surface Sj faces upward. The bonding surface Sj is cleaned by the second cleaning device.

<2-4. Configuration of Second Cleaning Device>

Figure 13A:
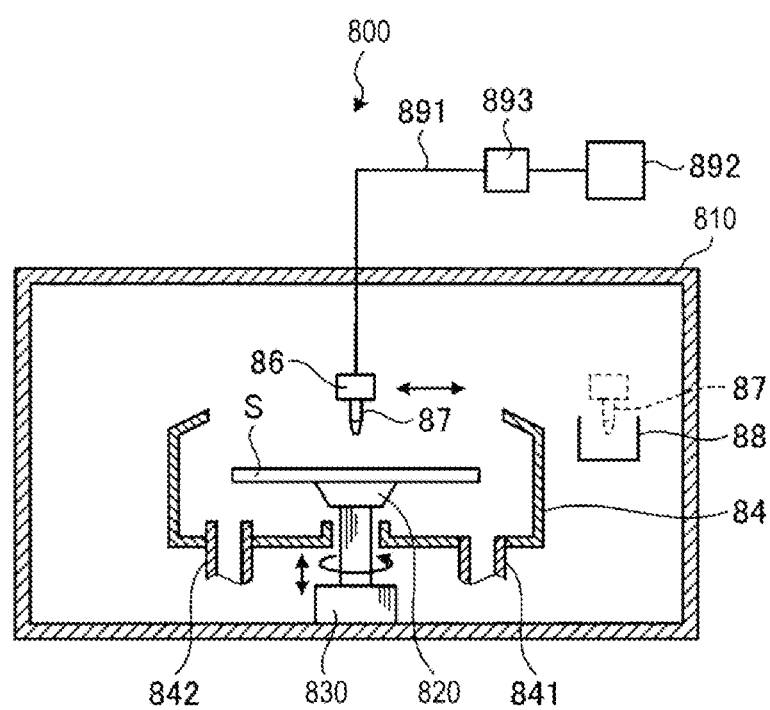
FIG. 13A is a schematic side view showing a configuration of a second cleaning device.
Figure 13B:
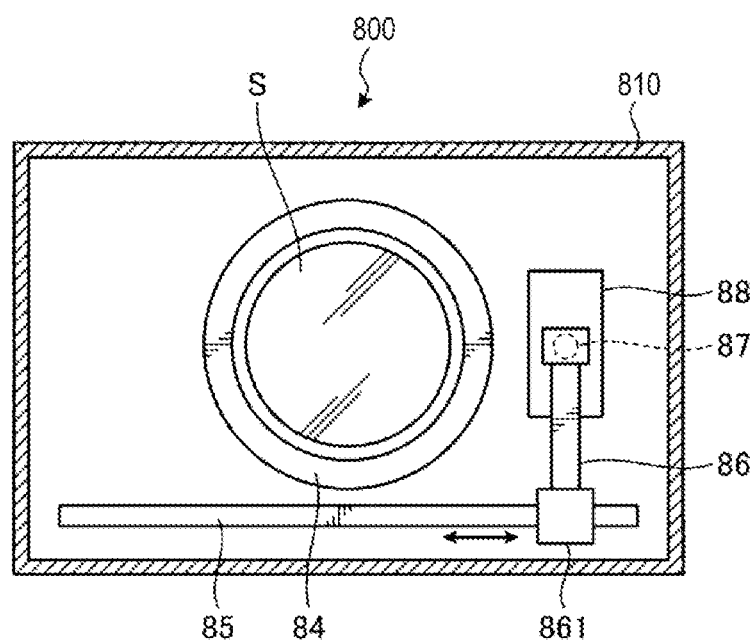
FIG. 13B is a schematic plane view showing the configuration of the second cleaning device.

Next, the configuration of the second cleaning device provided in the second cleaning station 22 will be described with reference to FIGS. 13A and 13B. FIG. 13A is a schematic side view showing the configuration of the second cleaning device. FIG. 13B is a schematic plane view showing the configuration of the second cleaning device.

As shown in FIG. 13A, the second cleaning device 800 includes a processing container 810. An inlet/outlet (not shown) for the support substrate S is formed in a side surface of the processing container 810. An opening/closing shutter (not shown) is provided in the inlet/outlet.

A spin chuck 820 holding and rotating the support substrate S is centrally disposed in the processing container 810. The spin chuck 820 has a horizontal top surface. Suction ports (not shown) sucking the support substrate S are formed in the top surface of the spin chuck 820. By the suction through the suction ports, the support substrate S is sucked and held on the spin chuck 820.

A chuck driving unit 830, which includes, for example, a motor, is disposed below the spin chuck 820. The chuck driving unit 830 rotates the spin chuck 820 at a predetermined speed. The chuck driving unit 830 is provided with an up-and-down drive source (e.g., a cylinder). The spin chuck 820 can be moved up and down by the up-and-down drive source.

A cup 84 configured to receive and recover the liquid scattering or falling from the support substrate S is disposed around the spin chuck 820. A drain pipe 841 configured to drain the recovered liquid and an exhaust pipe 842 configured to vacuum and evacuate the atmosphere within the cup 84 are connected to a bottom surface of the cup 84.

As shown in FIG. 13B, a rail 85 is provided in the processing container 810. A base end portion of an arm 86 is attached to the rail 85. A cleaning liquid nozzle 87 configured to supply a cleaning liquid (e.g., an organic solvent) to the support substrate S is supported on a tip portion of the arm 86.

The arm 86 is movable along the rail 85 by a nozzle driving unit 861. Thus, the cleaning liquid nozzle 87 can be moved from a standby portion 88 provided beside the cup 84 to above a central portion of the support substrate S in the cup 84. Further, the cleaning liquid nozzle 87 can be moved above the support substrate S in a radial direction of the support substrate S. The arm 86 can be moved up and down by a nozzle driving unit 861, thereby adjusting a height of the cleaning liquid nozzle 87.

As shown in FIG. 13A, a supply pipe 891 configured to supply the cleaning liquid to the cleaning liquid nozzle 87 is connected to the cleaning liquid nozzle 87. The supply pipe 891 communicates with a cleaning liquid supply source 892 storing the cleaning liquid. A supply kit 893 including a valve or a flow rate controller for controlling the flow of the cleaning liquid is provided at the supply pipe 891.

Under the control of the control device 30, the second cleaning device 800 performs a cleaning process (second cleaning process) for the support substrate S transferred by the third transfer device 211.

Specifically, the delaminated support substrate S is placed on the spin chuck 820 of the second cleaning device 800 by the third transfer device 211 as the bonding surface Sj faces upward. The second cleaning device 800 sucks and holds the support substrate S by means of the spin chuck 820 and then moves the spin chuck 820 downward to a predetermined position. Subsequently, the arm 86 moves the cleaning liquid nozzle 87, which stays in the standby portion 88, to above the central portion of the support substrate S. Thereafter, the cleaning liquid is supplied from the cleaning liquid nozzle 87 to the bonding surface Sj of the support substrate S while the support substrate S is rotated by the spin chuck 820. The supplied cleaning liquid is diffused to the entire bonding surface Sj of the support substrate S due to a centrifugal force. Consequently, the bonding surface Sj of the support substrate S is cleaned.

The cleaned support substrate S is carried out of the second cleaning device 800 by the second transfer device 231 and is accommodated to the cassette Cs of the carry-out station 24.

Lift pins (not shown), which support the support substrate S from below and moves the support substrate S up and down, may be provided below the spin chuck 820. In this case, the lift pins may be inserted to through-holes (not shown) formed in the spin chuck 820 and protrude from the top surface of the spin chuck 820. Further, the support substrate S may be delivered between the lift pins and the spin chuck 820 by moving the lift pins up and down instead of moving the spin chuck 820 up and down.

Further, in the second cleaning device 800, a back rinse nozzle (not shown), which injects the cleaning liquid toward a back surface of the support substrate S (i.e., the non-bonding surface Sn) (see FIG. 2), may be provided below the spin chuck 820. The cleaning liquid injected from the back rinse nozzle may clean the non-bonding surface Sn of the support substrate S and the outer periphery of the support substrate S.

As described above, the delamination system 1 according to the first embodiment includes the first processing block 10, which performs the processes for the DF-attached laminated substrate T or the delaminated target substrate W, and the second processing block 20, which performs the processes for the delaminated support substrate S.

The first processing block 10 includes the carry-in/carry-out station 11, the first transfer device 121, the delamination station 15 and the first cleaning station 16. The DF-attached laminated substrate T held by the dicing frame F or the delaminated target substrate W is placed in the carry-in/carry-out station 11. The first transfer device 121 transfers the delaminated target substrate W or the DF-attached laminated substrate T placed in the carry-in/carry-out station 11. The delamination device 5, which delaminates the DF-attached laminated substrate T transferred by the first transfer device 121 into the target substrate W and the support substrate S, is provided in the delamination station 15. The first cleaning device 700, which cleans the delaminated target substrate W, which is transferred by the first transfer device 121, while holding the delaminated target substrate W on the dicing frame F, is provided in the first cleaning station 16.

The second processing block 20 includes the second cleaning station 22, the delivery station 21, the second transfer device 231 and the carry-out station 24. The second cleaning device 800 that cleans the delaminated support substrate S is provided in the second cleaning station 22. The delivery station 21 is disposed between the second cleaning station 22 and the delamination station 15. The delivery station 21 receives the delaminated support substrate S from the delamination station 15 and delivers the delaminated support substrate S to the second cleaning station 22. The second transfer device 231 transfers the support substrate S cleaned by the second cleaning device 800. The support substrate S transferred by the second transfer device 231 is placed in the carry-out station 24.

In the delamination system 1, the first processing block 10 and the second processing block 20 are connected to each other by the delivery station 21. Thus, the delamination system 1 of the first embodiment can improve the throughput of the serial substrate processing processes including the delamination process and the cleaning process.

Further, the delamination device 5 according to the first embodiment includes the first holding unit 110, the second holding unit 150 and the movement mechanism 140. The first holding unit 110 holds the support substrate S of the DF-attached laminated substrate T from above. The second holding unit 150 holds the target substrate W of the DF-attached laminated substrate T from below via the dicing tape P. The movement mechanism 140 moves the first holding unit 110 away from the second holding unit 150. Thus, the delamination device 5 does not need to turn upside down the delaminated target substrate W and the efficiency of the delamination process can be enhanced.

Further, the delamination device 5 according to the first embodiment includes the first holding unit 110, the second holding unit 150 and the local movement unit 130. The first holding unit 110 holds the support substrate S of the DF-attached laminated substrate T in which the support substrate S and the target substrate W are bonded together. The second holding unit 150 holds the target substrate W of the DF-attached laminated substrate T. The local movement unit 130 moves a portion of the outer periphery of the first holding unit 110 away from the second holding unit 150. The first holding unit 110 is made of a pliable member. Thus, the delamination device 5 can efficiently perform the delamination of the support substrate S and the target substrate W.

<Delamination Device according to a Second Embodiment>

To enhance the delamination of the DF-attached laminated substrate T, a cut may be made in the side surface of the DF-attached laminated substrate T by means of a sharp member such as an edged tool or the like in the above-described delamination device. According to the second embodiment, a cut is made in the side surface of the DF-attached laminated substrate T by means of a sharp member. The description of the second embodiment will be described in detail below.

FIG. 14 is a schematic side view showing the configuration of a delamination device according to the second embodiment. In the following description, components identical to the already described components are designated by the same reference numeral and repetitive descriptions thereon are omitted.

As shown in FIG. 14, the delamination device 5A according to the second embodiment includes a measuring unit 210, a cut making unit 220 and a position adjustment unit 230 in addition to the components of the delamination device 5 according to the first embodiment. The measuring unit 210 and the position adjustment unit 230 are provided in, for example, the upper base unit 120. The cut making unit 220 is supported by the position adjustment unit 230 beside the DF-attached laminated substrate T.

For example, the measuring unit 210 is a laser displacement meter. The measuring unit 210 measures a distance from a predetermined measurement reference position to a holding surface of the second holding unit 150 or a distance from the measurement reference position to an object located between the measurement reference position and the holding surface of the second holding unit 150. The measurement result obtained by the measuring unit 210 is sent to the control device 30 (see FIG. 1).

Figure 15:
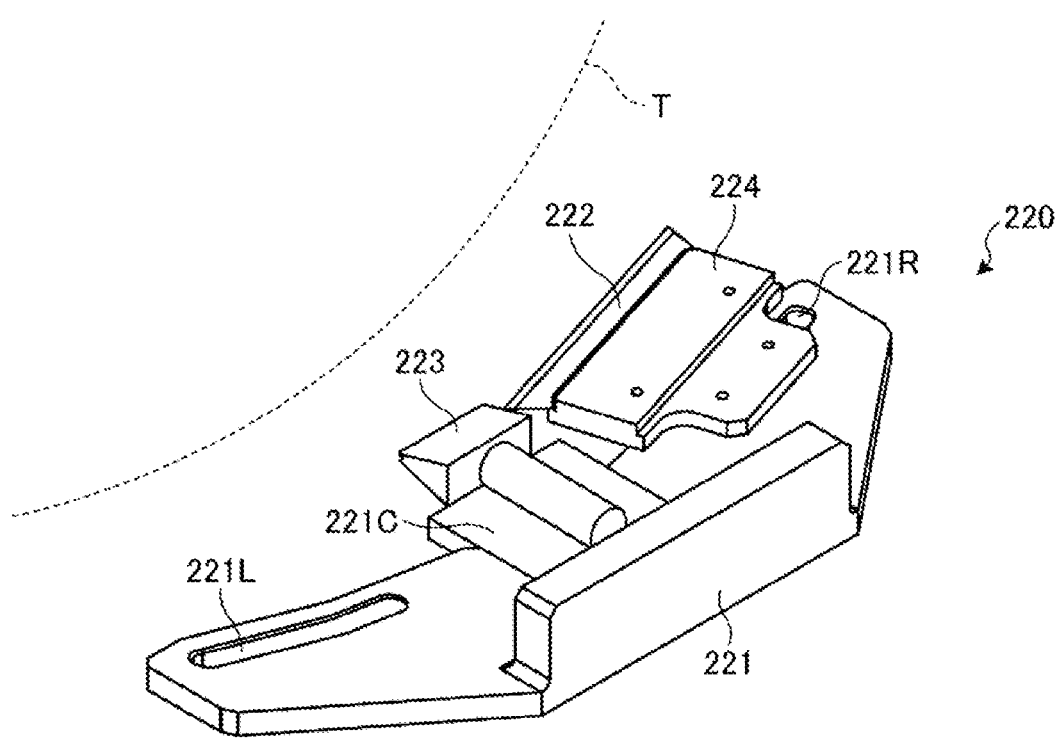
FIG. 15 is a schematic perspective view showing a configuration of a cut making unit.

The cut making unit 220 makes a cut in the bonding portion between the target substrate W and the support substrate S, i.e., the portion of the bonding agent G. The configuration of the cut making unit 220 will be described with reference to FIG. 15. FIG. 15 is a schematic perspective view showing the configuration of the cut making unit 220.

As shown in FIG. 15, the cut making unit 220 includes a body 221, a sharp member 222 and a gas ejection portion 223.

The body 221 is formed in a circular arc shape to conform a peripheral side of a substrate such as the laminated substrate T. The sharp member 222 is attached to a right section 221R of the body 221 via a fixing portion 224. The gas ejection portion 223 is attached to a central section 221C of the body 221.

The sharp member 222 is, for example, an edged tool, and is supported by the position adjustment unit 230 such that its tip protrudes toward the DF-attached laminated substrate T. The sharp member 222 penetrates to the bonding agent G (the bonding portion of the target substrate W and the support substrate S) and makes the cut in the bonding agent G, thus creating a delamination start point.

In the second embodiment, the sharp member 222 is a single-edged tool in which a slant surface defining an edge angle is provided at a top surface, that is, toward the support substrate S. As such, the slant surface of the sharp member 222 faces toward the support substrate S and a flat surface of the sharp member 222 faces toward the target substrate W, thus preventing damages of the target substrate W (a product as a substrate) when the sharp member 222 penetrates to the bonding agent G.

For example, a razor blade, a roller blade or an ultrasonic cutter may be used as the edged tool. Further, if a ceramic resin-based edged tool or a fluorine-coated edged tool is used, particles may be prevented from being generated when making a cut in the DF-attached laminated substrate T. The fixing portion 224 is detachably attached to the right section 221R of the body 221. In the cut making unit 220, the sharp member 222 can be easily replaced by replacing the fixing portion 224.

In this embodiment, although it is illustrated that the sharp member 222 is attached to only the right section 221R of the body 221, the cut making unit 220 may include another sharp member 222 attached to a left section 221L of the body 221. Further, the cut making unit 220 may include different types of sharp members 222 at the right section 221R and the left section 221L.

The gas ejection portion 223 ejects gas such as air or an inert gas toward a cut place of the bonding portion cut by the sharp member 222. That is, the gas ejection portion 223 injects the gas from the cut place made by the sharp member 222 to the inside of the DF-attached laminated substrate T, thus enhancing the delamination of the DF-attached laminated substrate T.

The position adjustment unit 230 will be described with reference to FIG. 14. The position adjustment unit 230 includes a load cell 232 and a drive device 233. The drive device 233 moves the cut making unit 220 in the vertical direction or in the horizontal direction. By moving the cut making unit 220 in the vertical direction by the drive device 233, the position adjustment unit 230 adjusts the cut position of the cut making unit 220 for the bonding agent G. By moving the cut making unit 220 in the horizontal direction by the drive device 233, the position adjustment unit 230 allows the tip of the sharp member 222 to penetrate to the bonding agent G. The load cell 232 detects a load applied to the cut making unit 220.

The penetration of the sharp member 222 to the bonding agent G is controlled using the drive device 233 and the load cell 232. This will be described below.

Further, in the control device 30 (see FIG. 1) according to the second embodiment, the storage unit (not shown) stores an information on a thickness of the DF-attached laminated substrate T, which is obtained in advance by an external device (hereinafter referred to as "prior thickness information"). The prior thickness information includes the thickness of the DF-attached laminated substrate T, a thickness of the target substrate W, a thickness of the support substrate S, a thickness of the bonding agent G and a thickness of the dicing tape P.

Based on the measurement result acquired from the measuring unit 210 as well as the prior thickness information stored in the storage unit, the control device 30 determines the cut position of the cut making unit 220 such that it falls within a thickness range of the bonding agent G. Then, the control device 30 controls the position adjustment unit 230 to move the cut making unit 220 such that the tip of the sharp member 222 can be positioned in the decided cut position. The details of the position adjustment process will be described below.

As shown in FIG. 14, the frame holding unit 160 holds the dicing frame F in a position lower than the second holding unit 150. Thus, a space, through which the cut making unit 220 can move toward the DF-attached laminated substrate T held by the second holding unit 150, can be secured.

Figure 16:
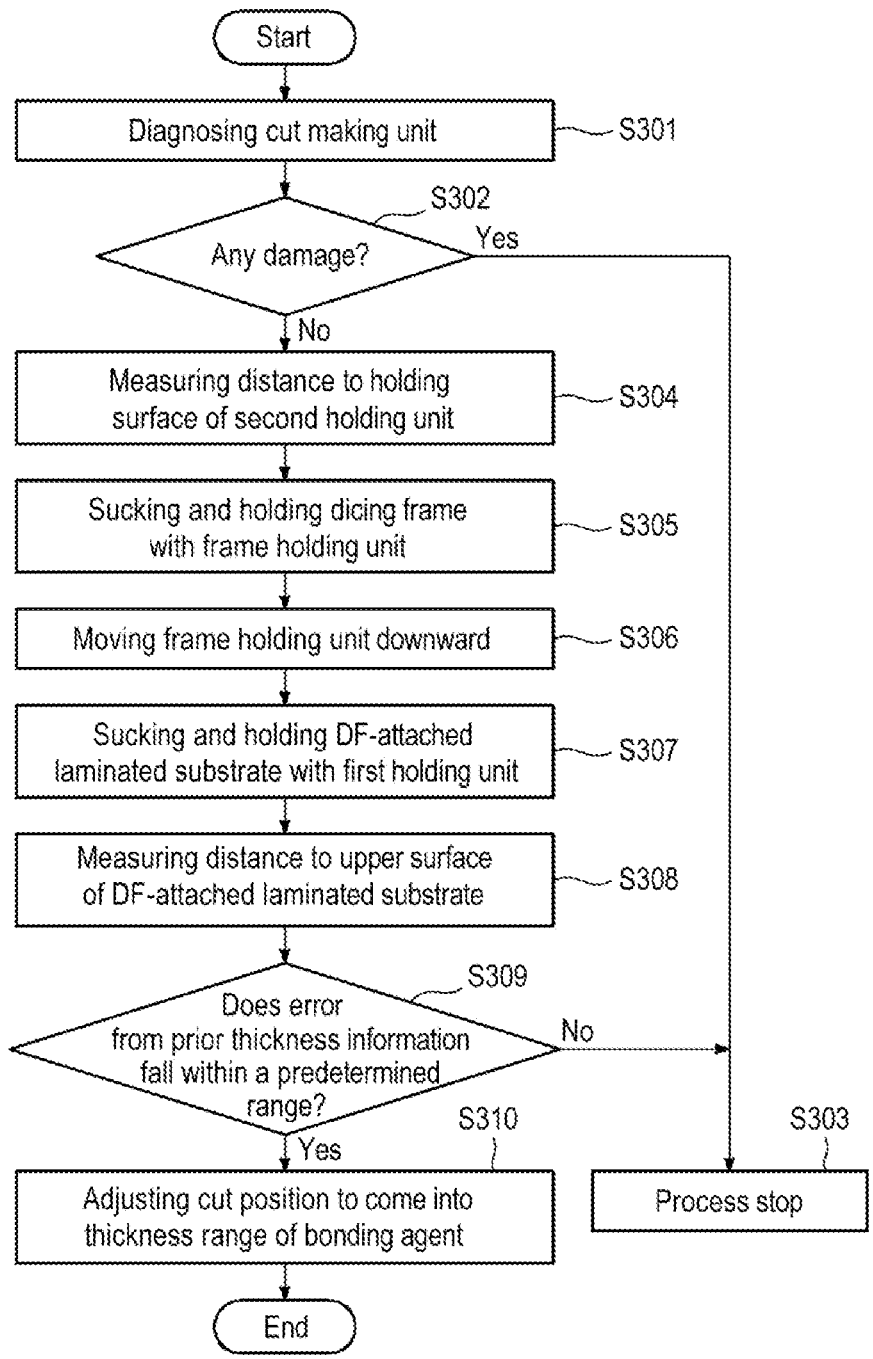
FIG. 16 is a flowchart showing a sequence of position adjustment processes for the cut making unit.
Figure 17A:
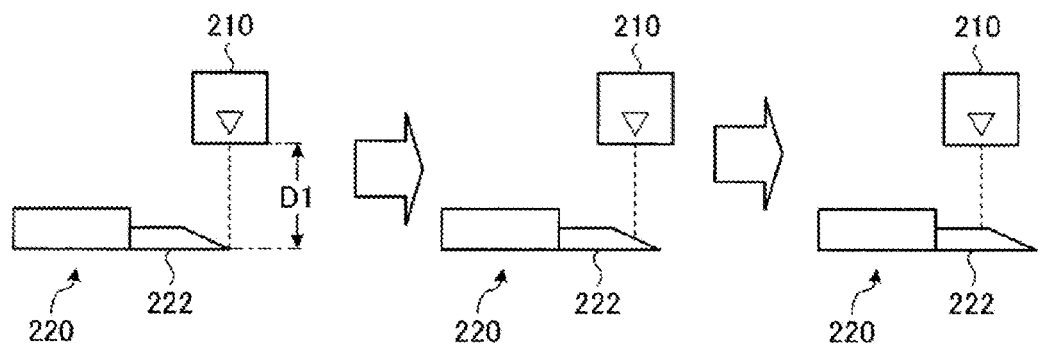
FIGS. 17A and 17B are views illustrating delamination operations of the delamination device.
Figure 17B:
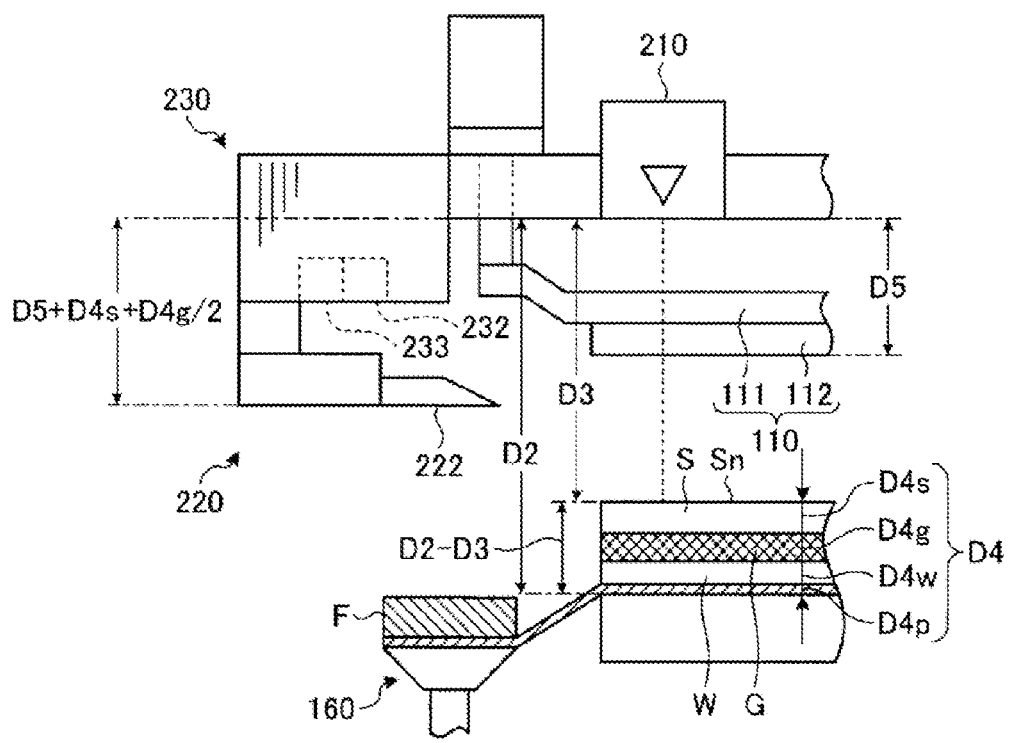

The position adjustment process for the cut making unit 220 performed by the delamination device 5A according to the second embodiment will be described with reference to FIGS. 16, 17A and 17B. FIG. 16 is a flowchart showing the process procedures of the position adjustment process for the cut making unit 220. FIGS. 17A and 17B illustrate the operation of the delamination device 5A. Under the control of the control device 30, the delamination device 5A performs each process procedure shown in FIG. 16.

As shown in FIG. 16, the delamination device 5A first performs a cut making unit examination process (at Step S301). In the cut making unit examination process, it is examined by means of the measuring unit 210 whether the sharp member 222 is damaged (e.g., edge damage).

Specifically, as shown in FIG. 17A, the delamination device 5A measures the distance D1 from the measurement reference position to the top surface of the sharp member 222 by the measuring unit 210 while moving the cut making unit 220 in the horizontal direction by the position adjustment unit 230. The measurement result is sent to the control device 30. The control device 30 determines that the sharp member 222 is damaged, when a rate of change of the distance D1 exceeds a predetermined range or when the difference between a reference distance previously measured by using a new sharp member 222 and the distance D1 exceeds a predetermined range.

If it is determined at step S301 in the cut making unit examination process that the sharp member 222 is damaged (if YES at Step S302), the delamination device 5A stops perform subsequent processes (at Step S303). As such, the delamination device 5A detects the damage of the sharp member 222 based on the change in the distance D1 from the measurement reference position to the cut making unit 220 when the cut making unit 220 is moved in the horizontal direction. Thus, the damages of the target substrate W, which may occur when the cut is made in the DF-attached laminated substrate T by the damaged sharp member 222, can be prevented in advance.

If the damage of the sharp member 222 is not detected at Step S301 in the cut making unit examination process (if NO at Step S302), the delamination device 5A measures a distance D2 (see FIG. 17B) from the measurement reference position to the holding surface of the second holding unit 150 by the measuring unit 210 (at Step S304). At this time, the DF-attached laminated substrate T is not yet carried into the delamination device 5A.

The thickness D4 of the DF-attached laminated substrate T, the thickness D4w of the target substrate W, the thickness D4g of the bonding agent G, the thickness D4s of the support substrate S and the thickness D4p of the dicing tape P, which are shown in FIG. 17B, are stored in the storage unit of the control device 30 as the prior thickness information.

Subsequently, the delamination device 5A sucks and holds the dicing frame F of the DF-attached laminated substrate T, which is carried into the delamination station 15 by the first transfer device 121, from below by means of the frame holding unit 160 (at Step S305). Further, the delamination device 5A moves the frame holding unit 160 downward by means of the movement mechanism 163 (see FIG. 6) (at Step S306). Thus, the target substrate W of the DF-attached laminated substrate T contacts the second holding unit 150 via the dicing tape P. Thereafter, the delamination device 5A sucks and holds the DF-attached laminated substrate T using the second holding unit 150 with the dicing tape pipeline P interposed therebetween (at Step S307). Thus, the DF-attached laminated substrate T is positioned such that the target substrate W is held by the second holding unit 150 and the dicing frame F is held by the frame holding unit 160.

Thereafter, the delamination device 5A measures a distance D3 (see FIG. 17B) from the measurement reference position to the top surface of the DF-attached laminated substrate T sucked and held by the second holding unit 150 (i.e., the non-bonding surface Sn of the support substrate S) (at Step S308). The measurement result is sent to the control device 30. The control device 30 determines whether the difference between the thickness (D2−D3) of the DF-attached laminated substrate T calculated from the measurement result of the measuring unit 210 and the thickness D4 of the DF-attached laminated substrate T included in the prior thickness information falls within a predetermined range.

In this regard, the difference between the thickness (D2−D3) of the DF-attached laminated substrate T calculated from the measurement result of the measuring unit 210 and the prior thickness information (D4) may exceed the predetermined range. This shows that the DF-attached laminated substrate T other than the DF-attached laminated substrate T, which must be correctly carried in, is erroneously carried in. In this case, the thickness range of the bonding agent G, which is calculated based on the prior thickness information, may deviate from the actual thickness range. In addition, the tip of the sharp member 222 may come into contact with the target substrate W or the support substrate S, thereby damaging the target substrate W or the support substrate S. For the reasons noted above, if the difference between the thickness of the DF-attached laminated substrate T calculated by using the measurement result of the measuring unit 210 and the thickness of the DF-attached laminated substrate T included in the prior thickness information exceeds the predetermined range (if NO at Step S309), then the delamination device 5A stops performing subsequent processes (at Step S303).

However, if the aforesaid difference falls within the predetermined range (if YES at Step S309), then the control device 30 calculates the thickness range of the bonding agent G (the bonding portion of the target substrate W and the support substrate S) based on the prior thickness information.

By way of example, as shown in FIG. 17B, a distance from the measurement reference position of the measuring unit 210 to the holding surface of the first holding unit 110 (i.e., the bottom surface of the suction pad 112) is assumed as D5. Then, the thickness range of the bonding agent G when the DF-attached laminated substrate T is sucked and held by the first holding unit 110 is from D5+D4s to D5+D4s+D4g. The control device 30 determines the cut position of the cut making unit 220 within this thickness range. For example, the control device 30 determines the median of the thickness range (e.g., D5+D4s+D4g/2) as the cut position. In this connection, it is assumed that the distance D5 from the measurement reference position to the bottom surface of the suction pad 112 is previously stored in the storage unit of the control device 30.

If the cut position of the cut making unit 220 is determined by the control device 30, then the delamination device 5A moves the cut making unit 220 by means of the position adjustment unit 230 under the control of the control device 30, thus adjusting the cut position of the cut making unit 220 within the thickness range of the bonding agent G (at Step S310). That is, the delamination device 5A moves the cut making unit 220 in the vertical direction by means of the position adjustment unit 230 such that the tip of the sharp member 222 is positioned in the cut position decided by the control device 30.

Thereafter, the delamination device 5A performs the step S204 and the processes subsequent thereto, which are shown in FIG. 9. When the delamination device 5A pulls a portion of the outer periphery of the first holding unit 110 by means of the local movement unit 130 at step S206, the delamination device 5A horizontally moves the cut making unit 220 by means of the position adjustment unit 230, thereby allowing the sharp member 222 to penetrate to the bonding agent G. Thus, the cut is made in the bonding agent G (the bonding portion of the target substrate W and the support substrate S) and the delamination of the DF-attached laminated substrate T performed by the local movement unit 130 is enhanced.

The penetration depth of the sharp member 222 to the bonding agent G may be, for example, about 2 mm. Further, the timing of the penetration of the sharp member 222 to the bonding agent G may be between the Steps S205 and S206 or between the Steps S206 and S207 or may coincide with the Step S206.

As described above, the penetration of the sharp member 222 to the bonding agent G is controlled using the drive device 233 and the load cell 232. Specifically, the sharp member 222 penetrates to the bonding agent G at a predetermined speed by the drive device 233. The cut start position (the position where the tip of the sharp member 222 contacts the bonding agent G) is detected by the load cell 232. The drive device 233 allows the sharp member 222 to penetrate to the bonding agent G by a preprogrammed amount from such a cut start position.

As such, the delamination device 5A according to the second embodiment performs the penetration of the cut making unit 220 to the bonding agent G, thereby creating a delamination start point in the DF-attached laminated substrate T.

Further, the delamination device 5A according to the second embodiment is configured to adjust the position of the cut making unit 220 based on the measurement result of the measuring unit 210 and the prior thickness information. Thus, the tip of the sharp member 222 can reliably penetrate to the bonding agent G.

Since the target substrate W, the support substrate S and the bonding agent G are very thin, it is difficult to align the position of the cut making unit 220 with naked eyes. In contrast, by using the measuring unit 210, the position of the bonding agent G can be easily and accurately detected and thus the cut position of the cut making unit 220 can be aligned. Further, it may be considered that the cut position is identified through image recognition using a camera or the like. However, it is difficult to identify the position of the bonding agent G only using the image recognition due to the following reasons: focusing is difficult because of the peripheral side of a substrate such as the laminated substrate T; light reflects on the substrate; and the bonding agent G is transparent. In contrast, by using the measuring unit 210, the position of the bonding agent G can be readily identified without the aforementioned problems.

Further, the cut making unit 220 makes the cut in the bonding agent G when the difference between the previously-obtained thickness of the DF-attached laminated substrate T and the calculated thickness of the DF-attached laminated substrate T, which is calculated using the distance D2 from the measurement reference position to the holding surface of the second holding unit 150 and the distance D3 from the measurement reference position to the DF-attached laminated substrate T held by the first holding unit 110, falls within a predetermined range. Thus, the damage of the target substrate W and the support substrate S, which is caused by the sharp member 222, can be prevented in advance.

In this embodiment, although it is illustrated that the sharp member 222 is a single-edged tool, the sharp member 222 may be a double-edged tool. Further, the sharp member 222 does not need to be an edged tool. The sharp member 222 may be a tubular needle, such as a hypodermic needle or the like, or a wire.

Further, the delamination device 5A according to the second embodiment may detect an inclination of the second holding unit 150 using the measuring unit 210. Specifically, the delamination device 5A measures the distance D2 (see FIG. 17B) from the measurement reference position to the holding surface of the second holding unit 150 while rotating the second holding unit 150 by the rotation mechanism 180. If the amount of change of the distance D2 is equal to or greater than a predetermined amount, e.g., 20 μm, then the delamination device 5A determines that the holding surface of the second holding unit 150 is inclined, and then stops performing the subsequent processes.

As such, the delamination device 5A can detect the inclination of the holding surface of the second holding unit 150 based on the change in the distance D2 from the measurement reference position to the holding surface of the second holding unit 150 when the second holding unit 150 is rotated.

If the holding surface of the second holding unit 150 is inclined, differences may occur between the thickness range of the bonding agent G calculated by using the prior thickness information and the actual thickness range of the bonding agent G. For this reason, the sharp member 222 cannot appropriately penetrate to the bonding agent G. Therefore, by stopping to perform the subsequent processes when the holding surface of the second holding unit 150 is inclined, the damage of the target substrate W and the support substrate S, which is caused by the sharp member 222, can be prevented in advance. Alternatively, the process of detecting the inclination of the second holding unit 150 may be performed before the DF-attached laminated substrate T is carried into the delamination device 5A.

Figure 18C:
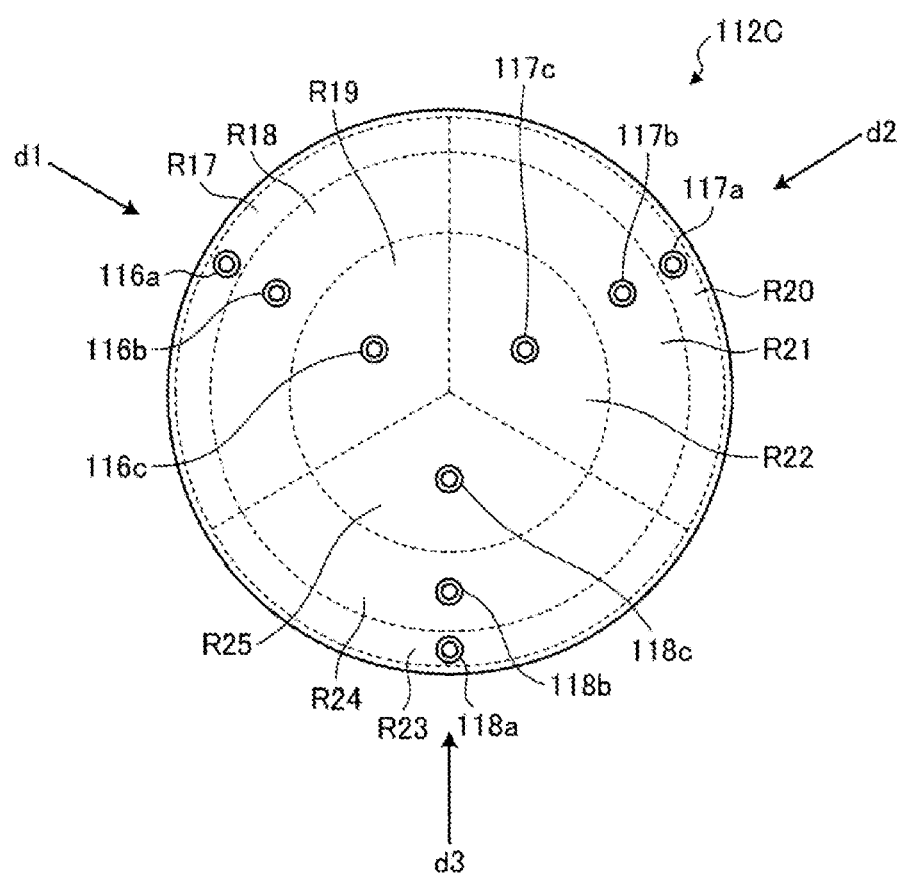

In the above-described delamination device, the first holding unit includes the suction pad 112 (see FIG. 7B) whose suction region is divided by a plurality of lines extending radially from the center and a plurality of circular arcs. However, the configuration of the suction pad of the first holding unit is not limited thereto. Another configuration examples of the suction pad of the first holding unit will be described below with reference to FIGS. 18A to 18C. FIGS. 18A to 18C are schematic plane views showing another configuration examples of the suction pad.

As shown in FIG. 18A, the suction region of the suction pad 112A may be divided by lines perpendicular to the delamination progress direction d. In the example shown in FIG. 18A, the suction region of the suction pad 112A is divided into individual regions R5 to R7 by two straight lines L3 and L4 perpendicular to the delamination progress direction d.

As such, the suction region of the suction pad may be divided by the lines perpendicular to the delamination progress direction. The suction pad having this configuration is suitable for the case where the delamination is done in one direction.

Similar to the suction pad 112 shown in FIG. 7B, suction ports 114a to 114c are formed in the respective individual regions R5 to R7 of the suction pad 112A. Each of the suction ports 114a to 114c is connected to the suction device via suction pipes. Thus, similar to the suction pad 112 shown in FIG. 7B, the support substrate S can be appropriately held.

Further, similar to the suction pad 112 shown in FIG. 7B, the individual regions R5 to R7 are formed such that the individual region R7 defined at the front side of the delamination progress direction d is larger than the individual region R5 defined at the rear side of the delamination progress direction d. Thus, similar to the suction pad 112 shown in FIG. 7B, the support substrate S can be prevented from being delaminated from the first holding unit 110 during the delamination operation.

In this embodiment, the suction region of the suction pad 112A is divided into three individual regions R5 to R7 but the division number of the suction region is not limited to three.

Further, as shown in FIG. 18B, the suction region of the suction pad 112B may be divided in a lattice shape. FIG. 18B shows an example where the suction region of the suction pad 112B is divided into nine individual regions R8 to R16. Similar to the suction pad 112 shown in FIG. 7B, suction ports 115a to 115i are formed in the respective individual regions R8 to R16 and are connected to the suction device via suction pipes.

As such, the suction region of the suction pad may be divided in a lattice shape. In this example, the straight lines dividing the suction region of the suction pad 112B are inclined with respect to the delamination progress direction d. Alternatively, the suction pad may be divided in a lattice shape by straight lines parallel to the delamination progress direction d and straight lines perpendicular to the delamination progress direction d.

The foregoing embodiments are described with the example where the delamination progress direction is one direction. However, the delamination operation may be performed in multiple directions by providing a plurality of the local movement units 130.

In this case, as shown in FIG. 18C, the suction region of the suction pad may be divided into a plurality of suction regions corresponding to the delamination progress directions d1 to d3 by a plurality of lines extending radially from the center. The suction region in each delamination progress direction may be further divided into a plurality of individual regions by circular arcs. For example, the suction region of the suction pad 112C shown in FIG. 18C is divided into three suction regions that correspond to the delamination progress directions d1 to d3 respectively. Further, each of the suction regions is divided into three individual regions by circular arcs.

Specifically, the suction region corresponding to the delamination progress direction d1 is divided into the individual regions R17 to R19. The suction region corresponding to the delamination progress direction d2 is divided into the individual regions R20 to R22. The suction region corresponding to the delamination progress direction d3 is divided into the individual regions R23 to R25. Suction ports 116a to 116c, 117a to 117c and 118a to 118c are formed in the respective individual regions R17 to R25 and are connected to the suction device via suction pipes. The suction ports 116a to 116c, 117a to 117c and 118a to 118c may be connected to a single suction device or may be connected to a plurality of suction devices that are provided in the respective delamination progress directions d1 to d3.

Further, an optimal cut making direction may be in the laminated substrate T depending upon a crystal direction, a warp direction or a pattern. Thus, in the second embodiment, the position of the sharp member 222 in a circumferential direction may be changed depending on the type of the laminated substrate T. In this case, for example, after the dicing frame F is held by the frame holding unit 160 (see FIG. 14), the cut position of the sharp member 222 in the circumferential direction may be adjusted by rotating the rotation mechanism 180 to a predetermined position and thereafter the sharp member 222 may penetrate the bonding agent G. Thus, since the sharp member 222 can be positioned in any position along the circumferential direction, the cut can be made in any types of the laminated substrate T in an optimal position of such a laminated substrate T. Further, after delaminating the laminated substrate T, the rotation mechanism 180 is rotated again and comes back to its initial rotation position.

Further, when the delamination is unfeasible in a first rotation position, the rotation mechanism 180 may be rotated to a second rotation position in order to perform the delamination. It may be determined whether the delamination is unfeasible, for example, by detecting the failure in sucking and holding of the first holding unit 110 and the second holding unit 150 or detecting the overload in a motor in case where the motor is used as the drive unit of the rotation mechanism 180. By providing the above-described reattempt function, the delamination process can be fulfilled without a stop even if the delamination is unfeasible due to the partial deterioration of the bonding agent G or the failure of the first holding unit 110 or the second holding unit 150.

<Delamination Device According to a Third Embodiment>

Figure 19:
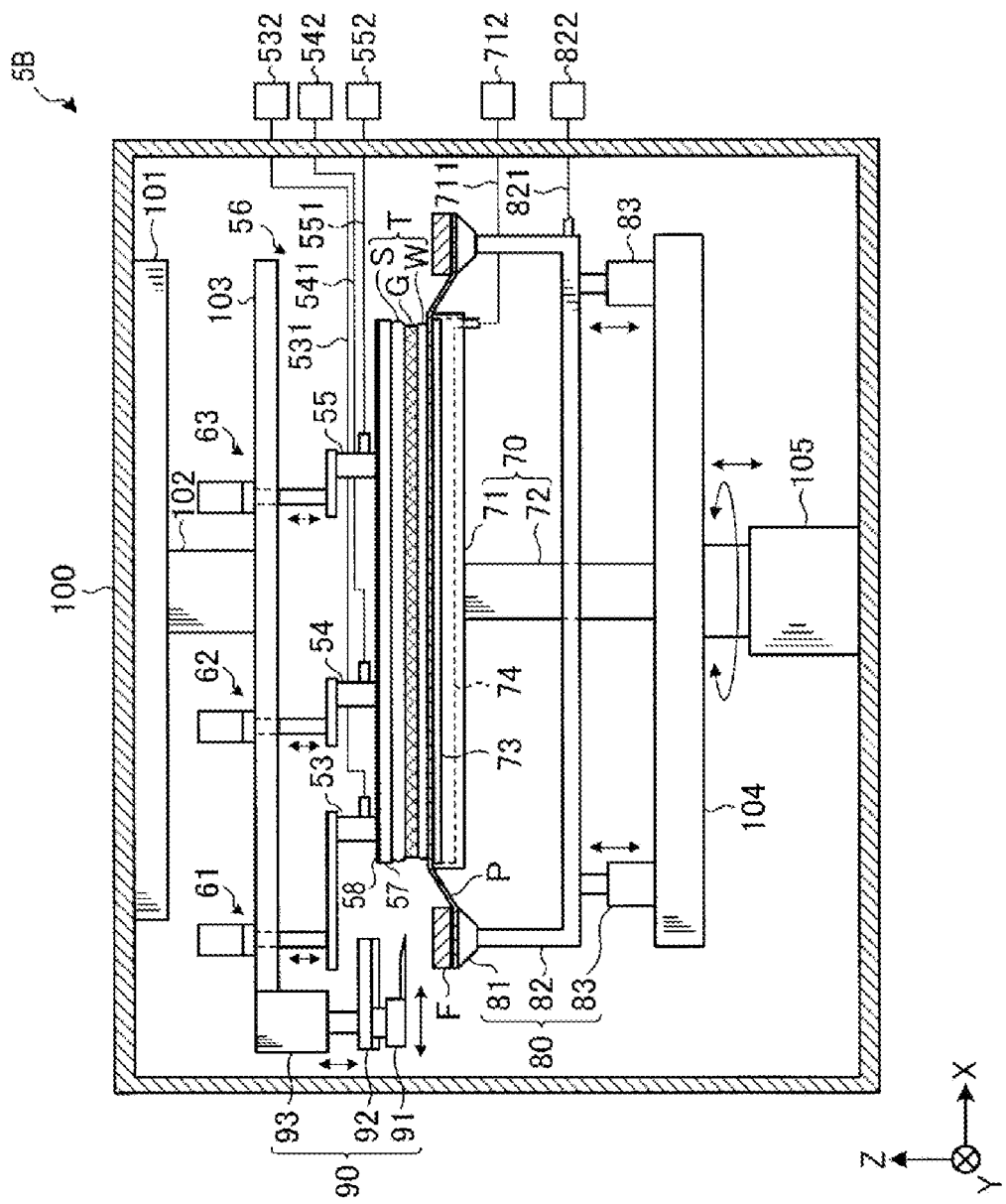
FIG. 19 is a schematic side view showing a configuration of a delamination device according to a third embodiment.

Next, a configuration of a delamination device according to a third embodiment, which is installed in the delamination station 15, will be described with reference to FIG. 19. FIG. 19 is a schematic side view showing the configuration of the delamination device according to the third embodiment.

As shown in FIG. 19, the delamination device 5B includes a processing chamber 100. Inlet/outlets (not shown) are formed in side surfaces of the processing chamber 100. The inlet/outlets are respectively formed at the side of the first transfer region 12 and at the side of the delivery station 21.

The delamination device 5B further includes a first holding unit 56, a movement unit 61, a first additional movement unit 62, a second additional movement unit 63, a second holding unit 70, a frame holding unit 80 and a delamination inducing unit 90, all of which are disposed within the processing chamber 100.

The delamination device 5B sucks and holds the support substrate S of the laminated substrate T from above using the first holding unit 56, and sucks and holds the target substrate W of the laminated substrate T from below using the second holding unit 70. The delamination device 5B operates the movement unit 61, the first additional movement unit 62 and the second additional movement unit 63 one after another, thereby moving the support substrate S away from the surface of the target substrate W. Thus, the support substrate S held by the first holding unit 56 is continuously delaminated from the target substrate W, at which time the delamination proceeds from one end portion of the support substrate S toward the other end portion thereof. Individual components will now be described in detail.

The first holding unit 56 includes a contact portion 57, an elastic member 58, a first suction portion 53, a second suction portion 54 and a third suction portion 55.

The contact portion 57 is a disc-shaped member having a diameter substantially equal to the diameter of the support substrate S and is configured to bring into contact with the non-bonding surface Sn of the support substrate S. A plurality of suction ports (not shown) is formed on a surface of the contact portion 57 brought into contact with the support substrate S.

The elastic member 58 is a disc-shaped flat member having a diameter substantially equal to the diameter of the contact portion 57 and is installed on the opposite surface of the contact portion 57 from the surface brought into contact with the support substrate S.

The first suction portion 53, the second suction portion 54 and the third suction portion 55 are connected to the respective suction ports of the contact portion 57 through the elastic member 58. Further, the first suction portion 53, the second suction portion 54 and the third suction portion 55 are connected to suction devices 532, 542 and 552, such as vacuum pumps or the like, via suction pipes 531, 541 and 551.

The first holding unit 56 sucks the non-bonding surface Sn (see FIG. 2) of the support substrate S from the respective suction ports of the contact portion 57 using the suction forces generated by the suction devices 532, 542 and 552, eventually sucking and holding the support substrate S of the laminated substrate T.

The movement unit 61, the first additional movement unit 62 and the second additional movement unit 63 are respectively connected to the first suction portion 53, the second suction portion 54 and the third suction portion 55 of the first holding unit 56. The movement unit 61 moves the first suction portion 53 vertically upward. The first additional movement unit 62 moves the second suction portion 54 vertically upward. The second additional movement unit 63 moves the third suction portion 55 vertically upward.

The movement unit 61, the first additional movement unit 62 and the second additional movement unit 63 are supported by an upper base unit 103. The first holding unit 56 is supported by the upper base unit 103 through the movement unit 61, the first additional movement unit 62 and the second additional movement unit 63. Further, the upper base unit 103 is supported through a post 102 by a fixing member 101 attached to a ceiling portion of the processing chamber 100.

Figure 20:
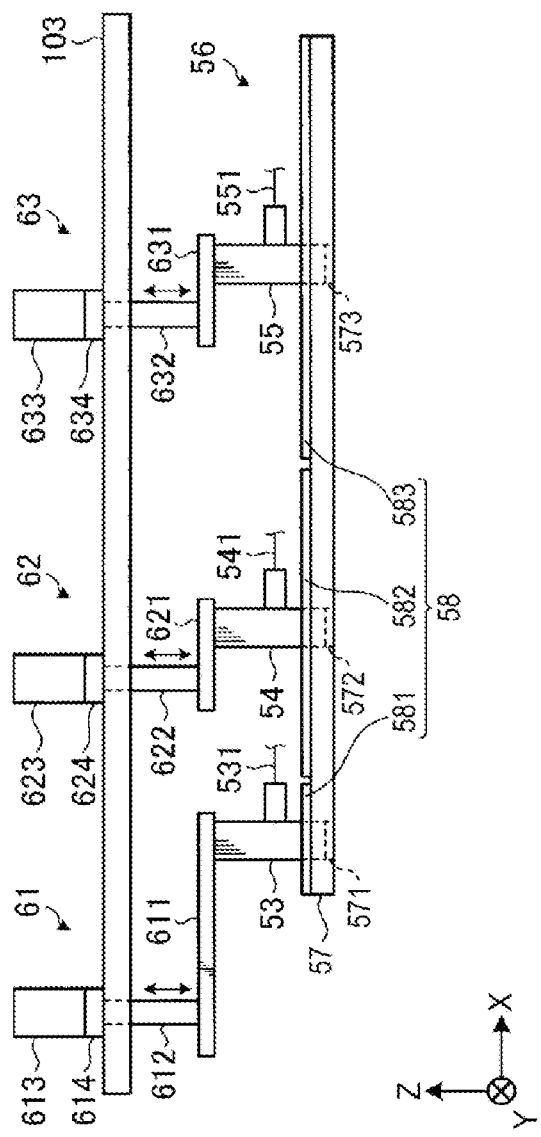
FIG. 20 is a schematic side view showing configurations of a first holding unit, a movement unit, a first additional movement unit and a second additional movement unit.
Figure 21:
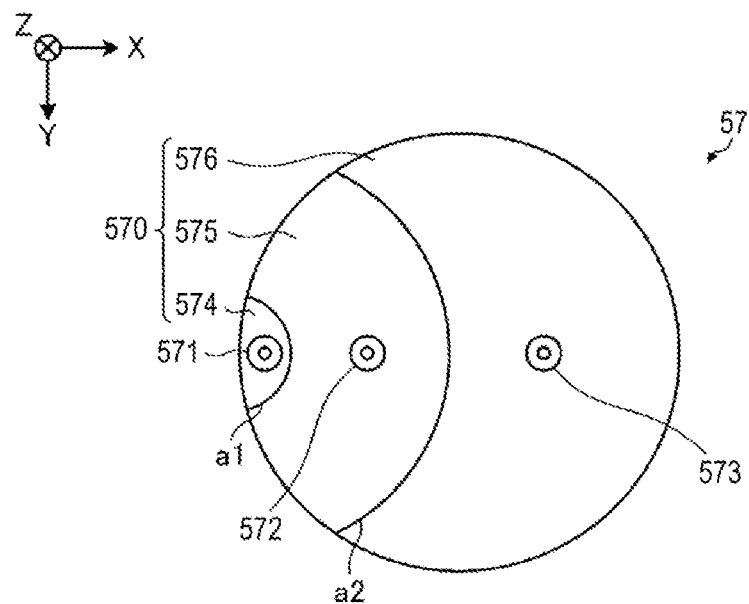
FIG. 21 is a schematic bottom view of a contact portion.

Detailed configurations of the first holding unit 56, the movement unit 61, the first additional movement unit 62 and the second additional movement unit 63 will now be described with reference to FIGS. 20 and 21. FIG. 20 is a schematic side view showing the configurations of the first holding unit 56, the movement unit 61, the first additional movement unit 62 and the second additional movement unit 63. Further, FIG. 21 is a schematic bottom view of the contact portion 57.

As shown in FIG. 20, the contact portion 57 includes a plurality of suction ports 571, 572 and 573 formed on the surface of the contact portion 57 making contact with the support substrate S.

The suction ports 571, 572 and 573 are disposed side by side along a delamination progress direction (e.g., X-axis forward direction). Specifically, the suction port 571 is formed in a position corresponding to an outer periphery of the contact portion 57 as a delamination start point (corresponding to a portion in which a delamination start section M, which will be described later, is formed). The suction ports 572 and 573 are disposed closer to a delamination end point from the suction port 571 (at the front side of the suction port 571 in the X-axis forward direction). The suction ports 572 and 573 are disposed in the order of the suction port 572 and the suction port 573 along the delamination progress direction.

The first suction portion 53, the second suction portion 54 and the third suction portion 55 are respectively connected to the suction ports 571, 572 and 573.

As shown in FIG. 21, the contact portion 57 includes a suction region 570 which is divided into a plurality of individual regions 574, 575 and 576. The individual regions 574, 575 and 576 are disposed in that order along the delamination progress direction (e.g., the X-axis forward direction). The suction port 571 is formed in the individual region 574, the suction port 572 in the individual region 575, and the suction port 573 in the individual region 576.

As described above, in the first holding unit 56 according to this embodiment, the suction region 570 of the contact portion 57 is divided into the plurality of individual regions 574, 575 and 576. Each of the first suction portion 53, the second suction portion 54 and the third suction portion 55 is installed in respective individual regions 574, 575 and 576.

With this configuration, the first holding unit 56 can suck and hold the support substrate S in all the individual regions 574, 575 and 576. Therefore, for example, even if a suction leakage is generated in one of the individual regions 574, 575 and 576, the support substrate S can be held in the remaining individual regions.

The suction region 570 of the contact portion 57 is divided into the individual regions 574, 575 and 576 by circular arcs a1 and a2 bulging in the delamination progress direction (e.g., the X-axis forward direction).

The delamination of the support substrate S from the target substrate W proceeds in a circular arc shape when viewed from the top. The suction region 570 is divided by arc shapes a1 and a2 bulging in the delamination progress direction (e.g., the X-axis forward direction) such that the support substrate S under delamination can be properly sucked and held. This prevents the support substrate S from being removed from the first holding unit 56 during delamination.

A delamination border line between the support substrate S and the target substrate W is kept in a circular arc shape at the initial stage of delamination as described above. Along with the progress of delamination, the delamination border line is gradually changed to a straight line extending in a direction (Y-axis direction) perpendicular to the delamination progress direction.

For that reason, the curvature of the circular arcs a1 and a2 dividing the suction region 570 becomes smaller (becomes similar to a straight line) toward the delamination end point. In this embodiment, the curvature of the circular arc a2 existing at the side of the delamination end point is smaller than the curvature of the circular arc a1 existing at the side of the delamination start point.

Figure 22A:
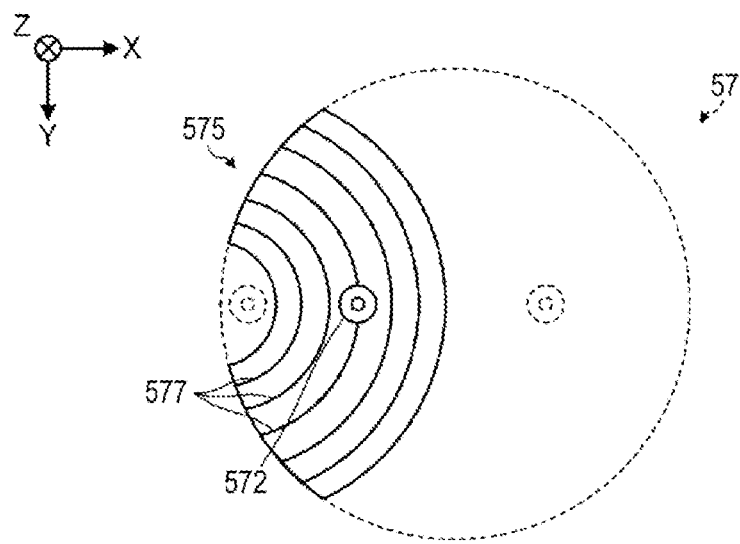
FIG. 22A is a schematic bottom view showing shapes of grooves formed in individual regions.
Figure 22B:
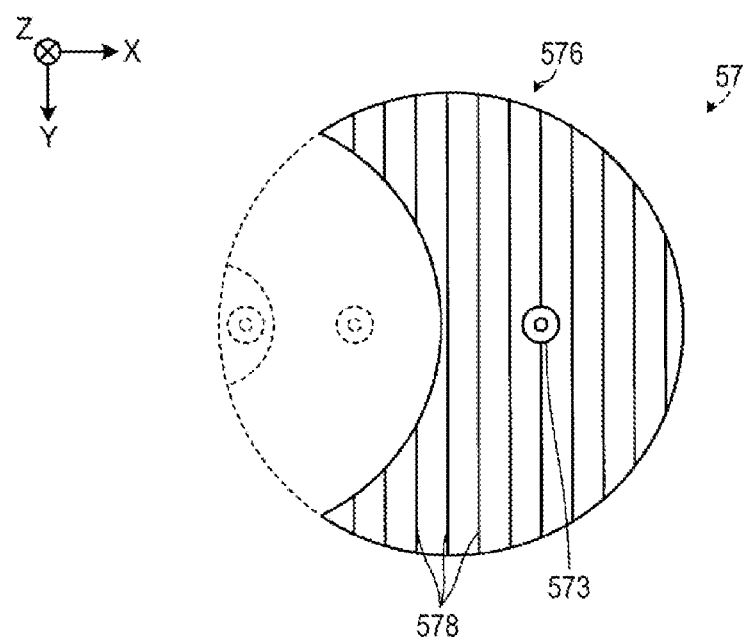
FIG. 22B is a schematic bottom view showing shapes of grooves formed in individual regions.

Grooves through which suction forces generated from the suction ports 572 and 573 are uniformly distributed are formed in the individual regions 575 and 576. The shape of the grooves formed in the individual regions 575 and 576 will now be described with reference to FIGS. 22A and 22B. FIG. 22A is a schematic bottom view showing the shape of the grooves formed in the individual region 575. FIG. 22B is a schematic bottom view showing the shape of the grooves formed in the individual region 576.

As shown in FIG. 22A, a plurality of circular arc-shaped grooves 577 bulging in the delamination progress direction is formed in the individual region 575 existing closer to the delamination start point than the individual region 576. In contrast, as shown in FIG. 22B, a plurality of linear grooves 578 extending in a direction (Y-axis direction) perpendicular to the delamination progress direction is formed in the individual region 576 existing closer to the delamination end point than the individual region 575.

As described above, along with the progress of delamination, the delamination border line between the support substrate S and the target substrate W is gradually changed from the circular arc shape to the straight line shape. Therefore, if the grooves of the individual regions 575 and 576 are formed in conformity with the shape of the delamination border line that changes depending on process steps of the delamination, the support substrate S under delamination can be properly sucked and held. This prevents the support substrate S from being removed from the first holding unit 56 during the delamination process.

Since the individual region 574 has a relatively narrow suction area, grooves are not formed in the individual region 574. In case of forming grooves even in the individual region 574, circular arc-shaped grooves bulging in the delamination progress direction may be formed as is the case in the individual region 575.

While in the above embodiment, the circular arc-shaped grooves have been described to be formed in the individual region 575 and the linear grooves have been described to be formed in the individual region 576, the circular arc-shaped grooves bulging in the delamination progress direction may be formed in the individual regions 575 and 576 or in the entire of the suction region 570.

The contact portion 57 is formed of a pliable member so that the shape thereof can be flexibly changed when the contact portion 57 is pulled by the movement unit 61, the first additional movement unit 62 and the second additional movement unit 63. Specifically, the contact portion 57 may be made of a resin such as rubber or the like.

That is to say, the first holding unit 56 sucks and holds the substantially entire surface of the support substrate S by bringing the pliable contact portion 57 into contact with the substantially entire surface of the support substrate S. As a result, in the below-mentioned delamination process, the support substrate S can be delaminated from the target substrate W without applying a heavy load to the target substrate W.

Referring back to FIG. 20, the elastic member 58 will be described. The elastic member 58 is formed of, e.g., a leaf spring or the like. The elastic member 58 is installed in the pliable contact portion 57. This can forcibly restrict the delamination progress direction. Thus, the target substrate W and the support substrate S can be appropriately delaminated.

As shown in FIG. 20, the elastic member 58 is divided into a plurality of (three, in this embodiment) elastic pieces 581, 582 and 583 in a corresponding relationship with the individual regions 574, 575 and 576 of the contact portion 57.

Figure 23:
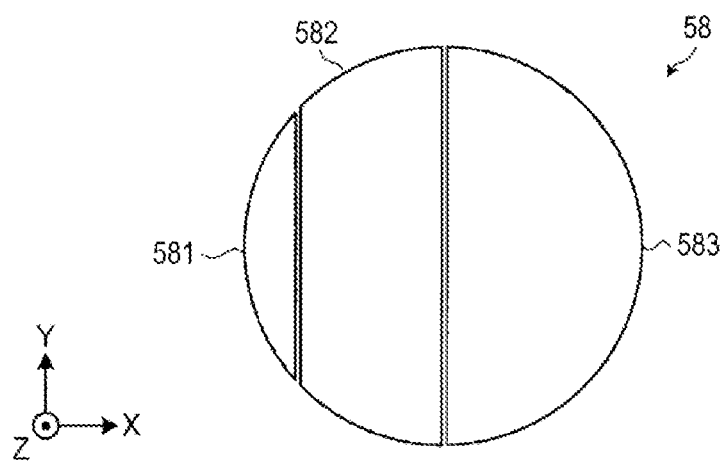
FIG. 23 is a schematic plane view of an elastic member.

FIG. 23 is a schematic plane view of the elastic member 58. As shown in FIG. 23, the elastic member 58 is divided into three elastic pieces 581, 582 and 583 by straight lines extending in a direction (Y-axis direction) perpendicular to the delamination progress direction (X-axis forward direction). The elastic pieces 581, 582 and 583 are disposed side by side in that order along the delamination progress direction.

The movement unit 61 includes a horizontal member 611, a post member 612, a movement mechanism 613 and a load cell 614.

The horizontal member 611 is a plate-like member extending along the delamination progress direction (e.g., X-axis forward direction). One end portion of the horizontal member 611 in the X-axis forward direction is fixed to an upper portion of the first suction portion 53.

The post member 612 is a member extending in a vertical direction (e.g., Z-axis direction). One end portion of the post member 612 is connected to the other end portion of the horizontal member 611. The other end portion of the post member 612 is connected to the movement mechanism 613 through the upper base unit 103.

The movement mechanism 613 is fixed to the upper portion of the upper base unit 103 and is configured to vertically move the post member 612 attached to the lower end of the movement mechanism 613.

The movement unit 61 moves the post member 612 and the horizontal member 611 vertically upward using the movement mechanism 613, whereby a portion of the outer periphery of the first holding unit 56, specifically the individual region 574 (see FIG. 21) of the contact portion 57, is lifted up through the elastic piece 581 and the first suction portion 53.

As shown in FIG. 20, the post member 612 serving as a lifting power point is disposed at the opposite side of the delamination progress direction from the first suction portion 53 serving as a lifting fulcrum. Thus, a torque (moment) acting clockwise in FIG. 20 is generated in the outer edge (e.g., the delamination start point corresponding to the below-mentioned "delamination start section M") of the laminated substrate T serving as a lifting action point. Thus, the movement unit 61 can pull the support substrate S while turning up the outer edge of the support substrate S, which makes it possible to efficiently delaminate the support substrate S from the target substrate W.

The movement unit 61 detects a load applied to the post member 612 using the load cell 614. Thus, the movement unit 61 can pull the individual region 574 of the contact portion 57 while controlling a force to be applied to the support substrate S, based on the detection result obtained by the load cell 614.

The first additional movement unit 62 and the second additional movement unit 63 are substantially similar in configuration to the movement unit 61. Specifically, the first additional movement unit 62 includes a horizontal member 621, a post member 622, a movement mechanism 623 and a load cell 624. The first additional movement unit 62 moves the post member 622 and the horizontal member 621 vertically upward using the movement mechanism 623, whereby the individual region 575 (see FIG. 21) of the contact portion 57 is lifted up through the elastic piece 582 and the second suction portion 54.

The second additional movement unit 63 includes a horizontal member 631, a post member 632, a movement mechanism 633 and a load cell 634. The second additional movement unit 63 moves the post member 632 and the horizontal member 631 vertically upward using the movement mechanism 633, whereby the individual region 576 (see FIG. 21) of the contact portion 57 is lifted up through the elastic piece 583 and the third suction portion 55.

In the first additional movement unit 62 and the second additional movement unit 63, similar to the movement unit 61, the post member 622 or 632 serving as a lifting power point is disposed closer to the delamination start point than the second suction portion 54 or the third suction portion 55 serving as a lifting fulcrum. Thus, the first additional movement unit 62 and the second additional movement unit 63 can pull the second suction portion 54 and the third suction portion 55 while turning up them so that the support substrate S can be efficiently delaminated from the target substrate W.

In case of delaminating the support substrate S from the target substrate W, a largest force is needed in delaminating the outer periphery of the support substrate S corresponding to the region nearest to the delamination start point, namely the delamination start section M which will be described below. For this reason, among the horizontal members 611, 621 and 631, the horizontal member 611 disposed at the side of the delamination start point is the longest.

Referring back to FIG. 19, other configurations of the delamination device 5B will be described. The second holding unit 70 is disposed below the first holding unit 56.

The second holding unit 70 sucks and holds the target substrate W of the laminated substrate T through the dicing tape P. The second holding unit 70 includes a disc-shaped body 71 and a column member 72 configured to support the body 71.

The body 71 is formed of, e.g., a metallic material such aluminum or the like. A suction face 73 is formed in an upper surface of the body 71. The suction face 73 is porous and is made of, e.g., a resin material such as PCTFE (polychlorotrifluoroethylene) or the like.

A suction space 74 communicating with the outside through the suction face 73 is formed within the body 71. The suction space 74 is connected to a suction device 712 such as a vacuum pump or the like through a suction pipe 711. The second holding unit 70 sucks and holds the laminated substrate T by causing the non-bonding surface Wn of the target substrate W to be sucked to the suction face 73 through the dicing tape P using a negative pressure generated by the suction of the suction device 712.

The suction face 73 of the body 71 is a little larger in diameter than the target substrate W. This prevents occurrence of a suction leakage in the peripheral edge of the target substrate W, which makes it possible to reliably suck and hold the laminated substrate T.

If a non-suction portion such as a groove or the like is formed on the suction face 73 that makes contact with the target substrate W, it is likely that a crack is generated in the target substrate W due to the existence of the non-suction portion. For that reason, the suction face 73 of the body 71 is formed into a planar surface that does not have a non-suction portion such as a groove or the like. This prevents generation of a crack in the target substrate W. Since the suction face 73 is made of the resin material such as PCTFE or the like, the damage to the target substrate W can be further suppressed.

The frame holding unit 80 configured to hold the dicing frame F from below is disposed outside the second holding unit 70. The frame holding unit 80 includes a plurality of suction pads 81 configured to suck and hold the dicing frame F, a support member 82 configured to support the suction pads 81 and a movement mechanism 83 configured to vertically move the support member 82.

The suction pads 81 are made of an elastic material such as rubber or the like and are installed in positions corresponding to, e.g., four corners of the dicing frame F shown in FIG. 3B. Suction ports (not shown) are formed in the suction pads 81. A suction device 822 such as a vacuum pump or the like is connected to the suction ports through the support member 82 and the suction pipe 821.

The frame holding unit 80 holds the dicing frame F by sucking the dicing frame F using the negative pressure generated by the suction of the suction device 822. Further, the frame holding unit 80 vertically moves the dicing frame F sucked and held by the suction pads 81, by vertically moving the support member 82 and the suction pads 81 using the movement mechanism 83.

The second holding unit 70 and the frame holding unit 80 are supported from below by a lower base unit 104. Further, the lower base unit 104 is supported by a rotary elevating mechanism 105 fixed to a floor surface of the processing chamber 100.

The rotary elevating mechanism 105 rotates together the second holding unit 70 and the frame holding unit 80 supported on the lower base unit 104 by rotating the lower base unit 104 about its vertical axis. Further, the rotary elevating mechanism 105 vertically moves together the second holding unit 70 and the frame holding unit 80 supported on the lower base unit 104 by vertically moving the lower base unit 104.

The delamination inducing unit 90 is disposed outside the second holding unit 70. The delamination inducing unit 90 forms, on the side surface of the laminated substrate T, a section that triggers delamination of the support substrate S from the target substrate W.

The delamination inducing unit 90 includes a sharp member 91, a movement mechanism 92 and an elevating mechanism 93. The sharp member 91 is, for example, an edged tool, and is supported by the movement mechanism 92 such that its tip protrudes toward the laminated substrate T.

The movement mechanism 92 moves the sharp member 91 along a rail extending in the X-axis direction. The elevating mechanism 93 is fixed to, e.g., the upper base unit 103, and is configured to vertically move the movement mechanism 92. Thus, a position of the sharp member 91, namely a contact position in which the sharp member 91 makes contact with the side surface of the laminated substrate T, is adjusted.

The delamination inducing unit 90 brings the sharp member 91 into contact with the side surface of the support substrate S near the bonding agent G, by adjusting the position of the sharp member 91 using the elevating mechanism 93 and then moving the sharp member 91 in the horizontal direction (the X-axis forward direction in this embodiment) using the movement mechanism 92. Thus, a section that triggers delamination of the support substrate S from the target substrate W (hereinafter referred to as "delamination start section") is formed in the laminated substrate T.

Figure 24:
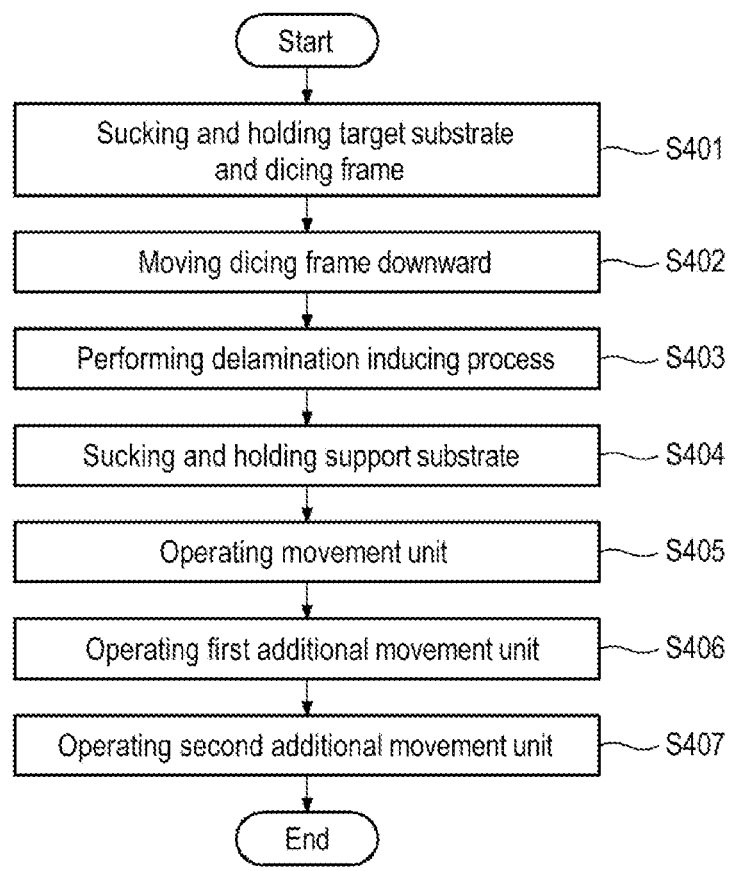
FIG. 24 is a flowchart showing a sequence of delamination processes.

Next, specific operations of the delamination device 5B will be described with reference to FIGS. 24 and 25A to 25G. FIG. 24 is a flowchart showing a sequence of delamination processes. FIGS. 25A to 25G are views illustrating delamination operations performed by the delamination device 5B according to the third embodiment. Under the control of the control device 30, the delamination device 5B performs the respective processes shown in FIG. 24.

If the laminated substrate T fixed to the dicing frame F is carried into the processing chamber 100, the delamination device 5B first sucks and holds the target substrate W of the laminated substrate T and the dicing frame F from below using the second holding unit 70 and the frame holding unit 80 (at Step S40). At this time, as shown in FIG. 25A, the target substrate W and the dicing frame F are held by the second holding unit 70 and the frame holding unit 80 in a state where the dicing tape P is horizontally attached.

Then, the delamination device 5B moves the frame holding unit 80 downward using the movement mechanism 83 (see FIG. 19) of the frame holding unit 80, thereby moving the dicing frame F held by the frame holding unit 80 downward (at Step S402). Thus, there is provided a space in which the sharp member 91 of the delamination inducing unit 90 is moved toward the laminated substrate T (see FIG. 25B).

Subsequently, the delamination device 5B performs a delamination inducing process using the delamination inducing unit 90 (at Step S403). In the delamination inducing process, a section that triggers delamination of the support substrate S from the target substrate W (the delamination start section) is formed in the laminated substrate T (see FIG. 25C).

Figure 26A:
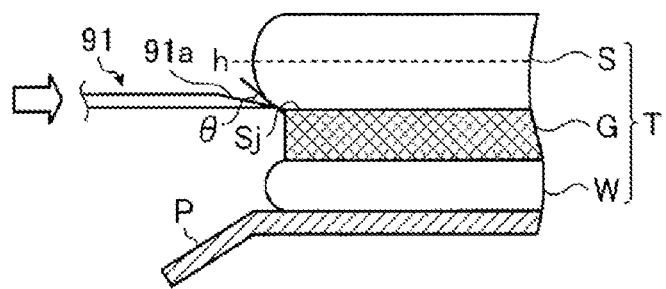
FIGS. 26A to 26C are views illustrating delamination inducing operations.
Figure 26B:
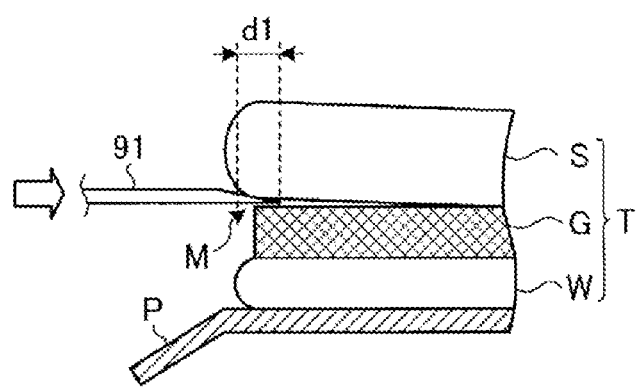
Figure 26C:
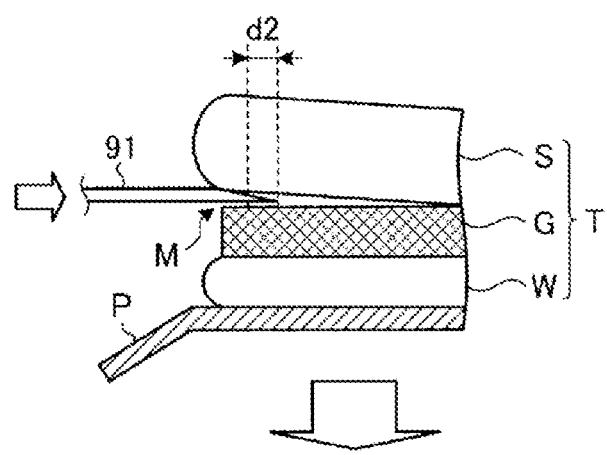

Detailed description of the delamination inducing process will now be given with reference to FIGS. 26A to 26C. FIGS. 26A to 26C are views illustrating operations of the delamination inducing process.

The delamination inducing process is performed after the target substrate W of the laminated substrate T is held by the second holding unit 70 with the dicing frame F held by the frame holding unit 80 and before the support substrate S of the laminated substrate T is held by the first holding unit 56. That is, the delamination inducing process is performed in a state where the support substrate S is kept free.

The delamination device 5B adjusts the position of the sharp member 91 using the elevating mechanism 93 (see FIG. 19) and then moves the sharp member 91 toward the side surface of the laminated substrate T using the movement mechanism 92. Specifically, as shown in FIG. 26A, the sharp member 91 is substantially moved horizontally toward the side surface of the support substrate S near the bonding agent G among the side surface of the laminated substrate T.

The term "the side surface of the support substrate S near the bonding agent G" used herein denotes the side surface of the support substrate S existing nearer to the bonding surface Sj than a half-thickness position h of the support substrate S. Specifically, the side surface of the support substrate S is formed into a substantially circular arc shape in a cross section. "The side surface of the support substrate S near the bonding agent G" is a side surface that makes an angle θ of more than 0 to less than 90 degrees with an edge slant surface 91a of the sharp member 91.

The sharp member 91 is a single-edged tool and is supported by the movement mechanism 92 with the slant surface 91a oriented upward. If the single-edged tool having the slant surface 91a oriented toward the support substrate S is used as the sharp member 91, as compared with a case where a double-edged tool is used as the sharp member 91, it is possible to reduce the load to be applied to the target substrate W when the sharp member 91 is penetrated into the laminated substrate T.

The delamination device 5B first advances the sharp member 91 to a predetermined position (preliminary advance operation). Thereafter, the delamination device 5B further advances the sharp member 91, thus bringing the sharp member 91 into contact with the side surface of the support substrate S near the bonding agent G. By way of example, a load cell (not shown) is installed in the delamination inducing unit 90. The delamination device 5B detects a load to be applied to the sharp member 91 using the load cell, consequently detecting the fact that the sharp member 91 makes contact with the support substrate S.

As described above, the side surface of the support substrate S is formed into a substantially circular arc shape in cross section. Thus, the sharp member 91 makes contact with the side surface of the support substrate S near the bonding agent G, whereby an upwardly-biased force is applied to the support substrate S.

Subsequently, as shown in FIG. 26B, the delamination device 5B further advances the sharp member 91. Thus, the support substrate S is pushed upward along the curve of the side surface. As a result, a portion of the support substrate S is delaminated from the bonding agent G, whereby the delamination start section M is formed.

Since the support substrate S is not held by the first holding unit 56 and is kept free, the upward movement of the support substrate S is not obstructed. In the operation shown in FIG. 26B, an advancing distance d1 of the sharp member 91 is, e.g., about 2 mm.

In some embodiments, the delamination device 5B may include an identifying device configured to identify the formation of the delamination start section M. By way of example, an IR (Infrared) camera installed above the support substrate S can be used as the identifying device.

The reflectance of infrared rays varies in a section of the support substrate S delaminated from the target substrate W and in another section of the support substrate S not delaminated from the target substrate W. Thus, if the support substrate S is first imaged by the IR camera, image data showing a difference in infrared ray reflectance in the support substrate S are obtained. The image data are sent to the control device 30. Based on the image data, the control device 30 can detect the section of the support substrate S delaminated from the target substrate W, namely the delamination start section M.

Upon detecting the delamination start section M, the delamination device 5B proceeds to a subsequent process, which will be described below. On the other hand, if the control device 30 fails to detect the delamination start section M, the delamination device 5B forms the delamination start section M by, e.g., further advancing the sharp member 91 or by moving the sharp member 91 backward away from the support substrate S and then performing the operations shown in FIGS. 26A and 26B once again. As described above, the identifying device configured to identify the delamination state of the support substrate S is provided and the delamination device 5B is operated depending on the delamination state so that the delamination start section M can be reliably formed.

After the delamination start section M is formed, the delamination device 5B further advances the sharp member 91 as shown in FIG. 26C, while moving the second holding unit 70 and the frame holding unit 80 downward using the rotary elevating mechanism 105 (see FIG. 19). Thus, a downwardly-biased force is applied to the target substrate W and the bonding agent G. An upwardly-biased force is applied to the support substrate S supported by the sharp member 91. Consequently, the delamination start section M becomes larger.

In the operation shown in FIG. 26C, an advancing distance d2 of the sharp member 91 is, e.g., about 1 mm.

As described above, the delamination device 5B can form the delamination start section M, which triggers the delamination of the support substrate S from the target substrate W, on the side surface of the laminated substrate T by bringing the sharp member 91 into contact with the side surface of the support substrate S near the bonding agent G.

The support substrate S has a thickness about 5 to 15 times as large as the thickness of the bonding agent G. Thus, as compared with a case where a delamination start section is formed by bringing the sharp member 91 into contact with the bonding agent G, it is possible to easily control the vertical position of the sharp member 91.

Since the sharp member 91 is brought into contact with the side surface of the support substrate S near the bonding agent G, a force acting to peel off the support substrate S from the target substrate W (namely, the upwardly-biased force) can be applied to the support substrate S. Further, since the outermost edge portion of the support substrate S is lifted up, the force acting to peel off the support substrate S from the target substrate W can be efficiently applied to the support substrate S.

Further, as compared with a case where the sharp member 91 is brought into contact with the bonding agent G, it is possible to reduce the possibility that the sharp member 91 makes contact with the target substrate W. This prevents the target substrate W from being damaged by the sharp member 91.

In some embodiments, the term "the side surface of the support substrate S near the bonding agent G" may be a side surface extending from the bonding surface Sj of the support substrate S to a position equivalent to one quarter of the thickness of the support substrate S, namely a side surface which makes an angle θ of 0 to 45 degrees with the sharp member 91. This is because the force for lifting up the support substrate S can be made larger as the angle θ becomes smaller.

If a bonding force of the support substrate S and the bonding agent G is relatively weak, the delamination start section M can be formed by merely bringing the sharp member 91 into contact with the side surface of the support substrate S near the bonding agent G as shown in FIG. 26A. In this case, the operations shown in FIGS. 26B and 26C can be omitted.

If the bonding force of the support substrate S and the bonding agent G is relatively strong, the delamination device 5B may, for example, further rotate the laminated substrate T about its vertical axis in the state shown in FIG. 26C using the rotary elevating mechanism 105. Thus, the delamination start section M is expanded in a circumferential direction of the laminated substrate T, which makes it possible to easily delaminate the support substrate S from the target substrate W.

Figure 27A:
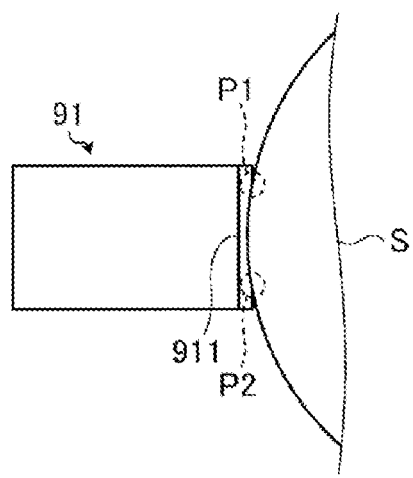
FIGS. 27A to 27C are schematic plane views showing various examples of a shape of an edge of a sharp member.
Figure 27B:
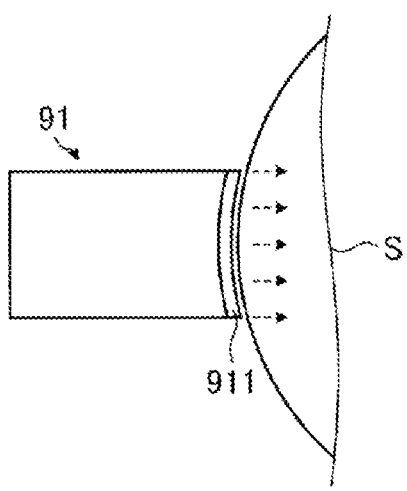
Figure 27C:
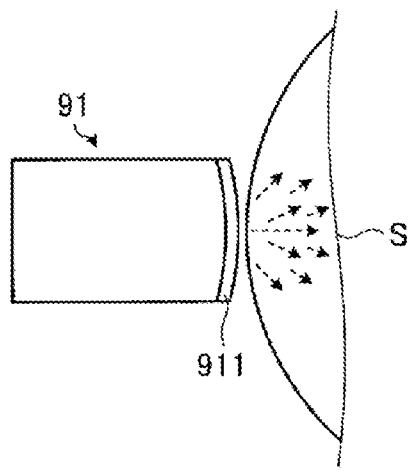

The shape of the edge of the sharp member 91 will now be described with reference to FIGS. 27A to 27C. FIGS. 27A to 27C are schematic plane views showing examples of the edge of the sharp member 91.

As shown in FIG. 27A, an edge 911 of the sharp member 91 may be formed into a linear shape when viewed from the top. However, as illustrated in FIG. 27A, the peripheral edge of the support substrate S (the laminated substrate T) has a circular arc shape. For that reason, if the edge of the sharp member 91 is formed into a linear shape when viewed from the top, loads are likely to concentrate on two points (P1 and P2 in FIG. 27A) of the edge intersecting with the support substrate S when viewed from the top. Thus, nicks may possibly be generated in the edge of the sharp member 91.

In some embodiments, as shown in FIG. 27B, the edge 911 of the sharp member 91 may be formed into an arcuate concave shape in conformity with the shape of the outer periphery of the support substrate S. As a result, the edge 911 as a whole makes uniformly contact with the support substrate S. This prevents a load from concentrating on a specific point of the edge 911.

In some embodiments, as shown in FIG. 27C, the edge 911 of the sharp member 91 may be formed into a shape in which the central portion of the edge 911 bulges toward the support substrate S in a circular arc shape. Thus, as compared with a case where the edge 911 is formed into the linear shape, a larger portion of the edge 911 can be penetrated into the laminated substrate T. Consequently, the loads applied to the sharp member 91 when the upwardly-biased force is exerted on the support substrate S can be distributed over a broad area. This prevents concentration of the loads.

If the edge 911 is formed into the shape shown in FIG. 27B, the support substrate S receives uniformly-distributed forces from the sharp member 91. On the other hand, if the edge 911 is formed into the shape shown in FIG. 27C, the support substrate S receives a force acting in such a direction as to diffuse from the center of the edge 911 of the sharp member 91.

Figure 25D:
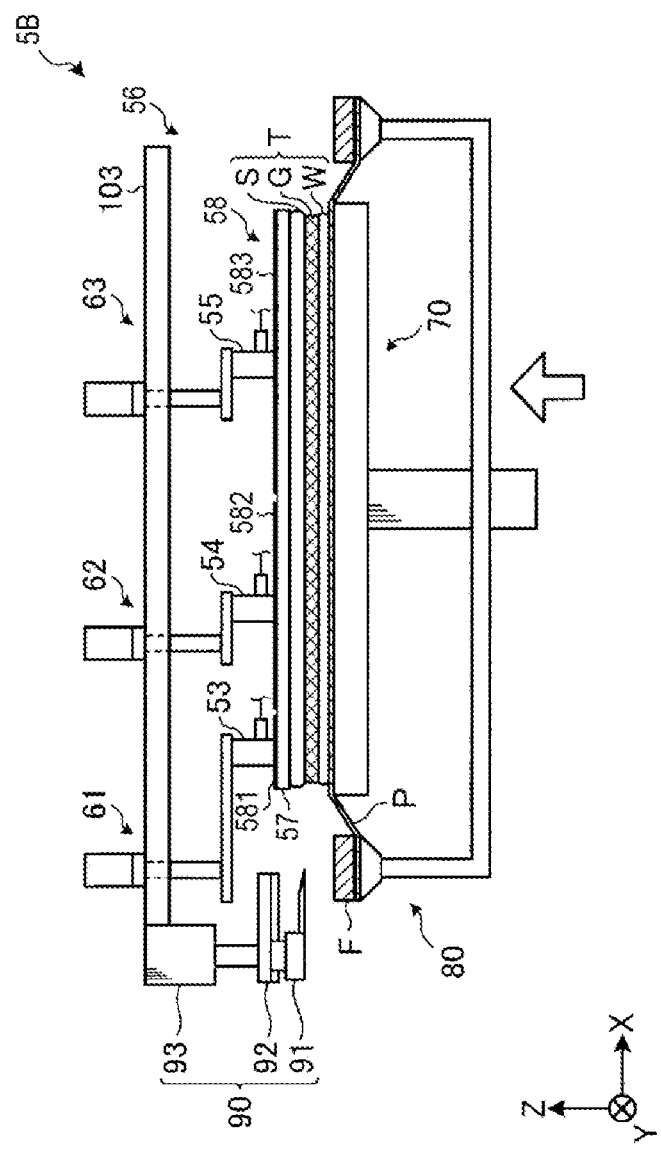
Figure 25G:
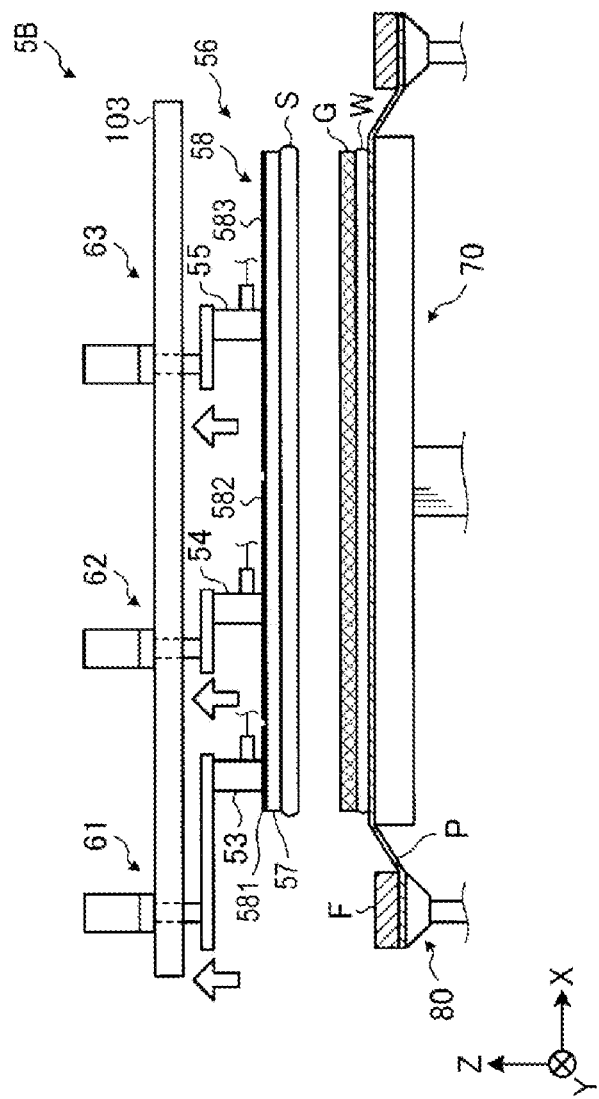

If the delamination inducing process of Step S403 is finished, the delamination device 5B moves the second holding unit 70 and the frame holding unit 80 upward using the rotary elevating mechanism 105 (see FIG. 19), thereby bringing the support substrate S of the laminated substrate T into contact with the contact portion 57 of the first holding unit 56 (see FIG. 25D). Then, the delamination device 5B causes the suction devices 532, 542 and 552 to start suction operations, whereby the support substrate S is sucked and held by the first holding unit 56 (at Step S404).

Subsequently, the delamination device 5B operates the movement unit 61 (see FIG. 19) (at Step S405) such that a portion of the outer periphery of the first holding unit 56 corresponding to the delamination start section M, namely the individual region 574 (see FIG. 21), is moved away from the second holding unit 70. Thus, a portion of the outer periphery of the support substrate S is delaminated from the target substrate W (see FIG. 25E).

At this time, the first additional movement unit 62 and the second additional movement unit 63 are not operated as yet. Thus, a portion of the outer periphery of the support substrate S is pulled by the movement unit 61 in a state where the support substrate S is pressed from above by the first additional movement unit 62 and the second additional movement unit 63. As a result, a portion of the outer periphery of the support substrate S can be efficiently delaminated from the target substrate W.

Since the elastic member 58 is divided into the elastic pieces 581, 582 and 583, even if the elastic piece 581 is pulled by the movement unit 61, the upwardly-biased force is hardly applied to the elastic piece 582 or the elastic piece 583. This makes it easy to maintain the state in which the support substrate S is pressed by the first additional movement unit 62 and the second additional movement unit 63. Thus, a portion of the outer periphery of the support substrate S can be more efficiently delaminated from the target substrate W.

Since the contact portion 57 of the first holding unit 56 is formed of the pliable resin member, when the movement unit 61 pulls the first holding unit 56, the contact portion 57 is deformed in response to the pulling action. Thus, the support substrate S can be delaminated from the target substrate W without applying a heavy load to the target substrate W. Since the contact portion 57 is pliable, "persistency" can be given to the force by which the support substrate S is delaminated from the target substrate W. Thus, the support substrate S can be efficiently delaminated from the target substrate W.

Subsequently, the delamination device 5B operates the first additional movement unit 62 (see FIG. 19) (at Step S406), thereby moving the individual region 575 (see FIG. 21) of the first holding unit 56 away from the second holding unit 70. Thus, after the outer periphery of the support substrate S is delaminated from the target substrate W by the movement unit 61, the portion of the support substrate S sucked and held by the individual region 575 is delaminated from the target substrate W (see FIG. 25F).

At this time, the second additional movement unit 63 is not yet operated. Thus, the support substrate S is pulled by the first additional movement unit 62 in a state where the support substrate S is pressed from above by the second additional movement unit 63. As a result, the portion of the support substrate S sucked and held by the individual region 575 can be efficiently delaminated from the target substrate W.

As described above, since the elastic member 58 is divided into the elastic pieces 581, 582 and 583, even if the elastic piece 582 is pulled by the first additional movement unit 62, the upwardly-biased force is hardly applied to the elastic piece 583. This makes it easy to maintain the state in which the support substrate S is pressed by the second additional movement unit 63. Thus, the portion of the support substrate S sucked and held by the individual region 575 can be more efficiently delaminated from the target substrate W.

Subsequently, the delamination device 5B operates the second additional movement unit 63 (see FIG. 19) (at Step S407), thereby moving the individual region 576 (see FIG. 21) of the first holding unit 56 away from the second holding unit 70. Thus, after the support substrate S is delaminated from the target substrate W by the first additional movement unit 62, the portion of the support substrate S sucked and held by the individual region 576 is delaminated from the target substrate W.

As described above, the delamination device 5B first operates the movement unit 61 and then operates the first additional movement unit 62 and the second additional movement unit 63 one after another, at which time the first additional movement unit 62 closer to the delamination start point is operated prior to the operation of the second additional movement unit 63. Thus, the support substrate S can be continuously delaminated from the target substrate W, at which time the delamination proceeds from one end portion of the support substrate S toward the other end portion.

Then, the delamination device 5B makes the support substrate S horizontal by moving the individual regions 575 and 576 of the first holding unit 56 upward using the first additional movement unit 62 and the second additional movement unit 63 or by moving the individual regions 574 and 575 downward using the movement unit 61 and the first additional movement unit 62. Thus, the delamination process is completed (see FIG. 25G).

As described above, the delamination device 5B according to this embodiment includes the first holding unit 56, the second holding unit 70 and the movement unit 61. The first holding unit 50 holds the support substrate S of the laminated substrate T obtained by bonding the support substrate S (equivalent to one example of a first substrate) and the target substrate W (equivalent to one example of a second substrate). The second holding unit 70 holds the target substrate W of the laminated substrate T. The movement unit 61 moves a portion of the outer periphery of the first holding unit 56 away from the second holding unit 70. The first holding unit 56 is pliable. The first holding unit 56 includes the contact portion 57 configured to make contact with the substantially entire surface of the support substrate S and the first suction portion 53 (equivalent to one example of a suction portion) installed in the contact portion 57 and configured to suck the contact surface of the support substrate S making contact with the contact portion 57. Thus, the delamination device 5B according to this embodiment can make the delamination process efficient.

Figure 28:
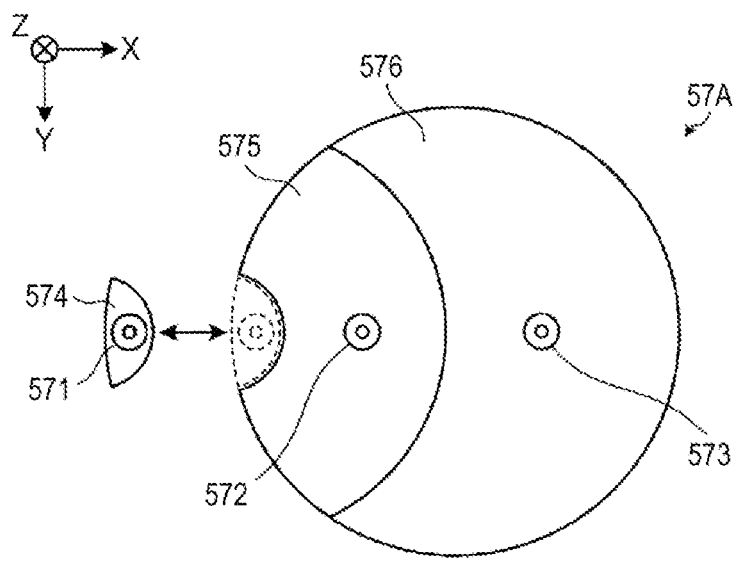
FIG. 28 is a schematic bottom view showing a configuration of a contact portion according to a first modified example.

In the above embodiments, the division of the elastic member 58 makes it possible to easily maintain the state in which the support substrate S is pressed by the first additional movement unit 62 and the second additional movement unit 63. However, the contact portion 57 may be further divided. FIG. 28 is a schematic bottom view showing a configuration of a contact portion according to a first modified example. In the following description, the same components as described above will be designated by like reference numerals and repeated description thereon will be omitted.

As shown in FIG. 28, in a contact portion 57A according to the first modified example, a section corresponding to the individual region 574 is severed from the remaining sections.

As described above, in case of delaminating the support substrate S from the target substrate W, a largest force is needed in delaminating the region nearest to the delamination start point. By severing the section of the contact portion 57A which corresponds to the individual region 574 existing nearest to the delamination start point, when pulling the individual region 574 using the movement unit 61, it is possible to reliably maintain the state in which the individual regions 575 and 576 are pressed by the first additional movement unit 62 and the second additional movement unit 63. Thus, a portion of the outer periphery of the support substrate S can be more reliably delaminated from the target substrate W.

In some embodiments, the section of the contact portion 57A corresponding to the individual region 575 may be further severed from the section of the contact portion 57A corresponding to the individual region 576. That is, the contact portion 57A may be severed in a corresponding relationship with the individual regions 574, 575 and 576.

Figure 29:
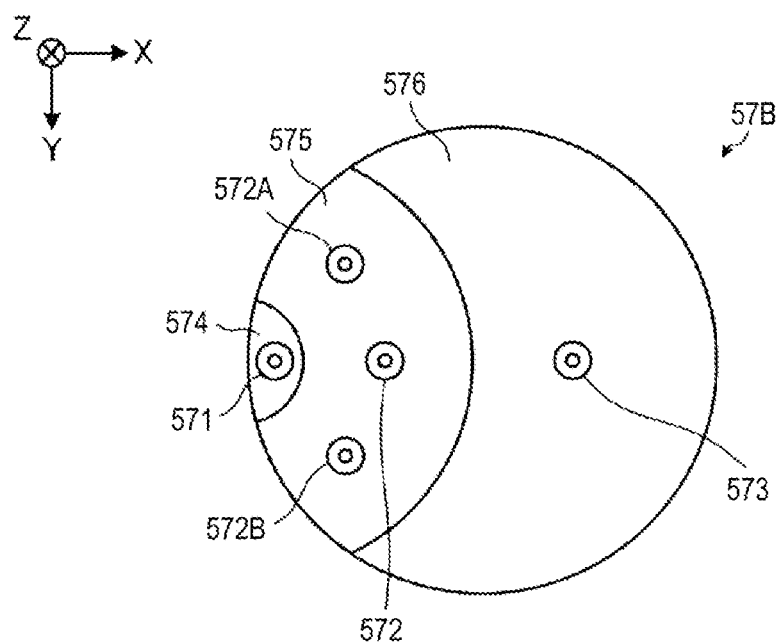
FIG. 29 is a schematic bottom view showing a configuration of a contact portion according to a second modified example.

In the aforementioned embodiments, description has been made on an example in which the suction ports 571, 572 and 573 are formed one by one in the respective individual regions 574, 575 and 576 of the contact portion 57. However, a plurality of suction ports may be formed in one of the individual regions 574, 575 and 576. FIG. 29 is a schematic bottom view showing a configuration of a contact portion according to a second modified example.

By way of example, as shown in FIG. 29, the contact portion 57B according to the second modified example further includes two suction ports 572A and 572B formed in the individual region 575, in addition to the three suction ports 571, 572 and 573 disposed along the delamination progress direction. The suction ports 572, 572A and 572B are disposed side by side in a circular arc shape in the individual region 575. The suction ports 572, 572A and 572B may be connected to a single suction device 542 (see FIG. 29) or a plurality of individual suction devices, respectively.

If the plurality of suction ports 572, 572A and 572B is formed in one individual region 575 in this manner, it is possible to strongly hold the support substrate S.

In this modified example, there has been illustrated an example in which the three suction ports 572, 572A and 572B are formed in the individual region 575. However, four or more suction ports may be formed in the individual region 575. Similarly, a plurality of suction ports may be formed in the individual region 574 or the individual region 576.

In the aforementioned embodiment, description has been made on an example in which the laminated substrate to be delaminated is the laminated substrate T obtained by bonding the target substrate W and the support substrate S with the bonding agent G. However, the laminated substrate to be delaminated by the delamination device is not limited to the laminated substrate T. By way of example, in the delamination device 5B, a laminated substrate obtained by bonding a donor substrate having an insulation film and a target substrate may be used as an object to be delaminated in order to produce an SOI substrate.

<Delamination Device According to a Fourth Embodiment>

Figure 30:
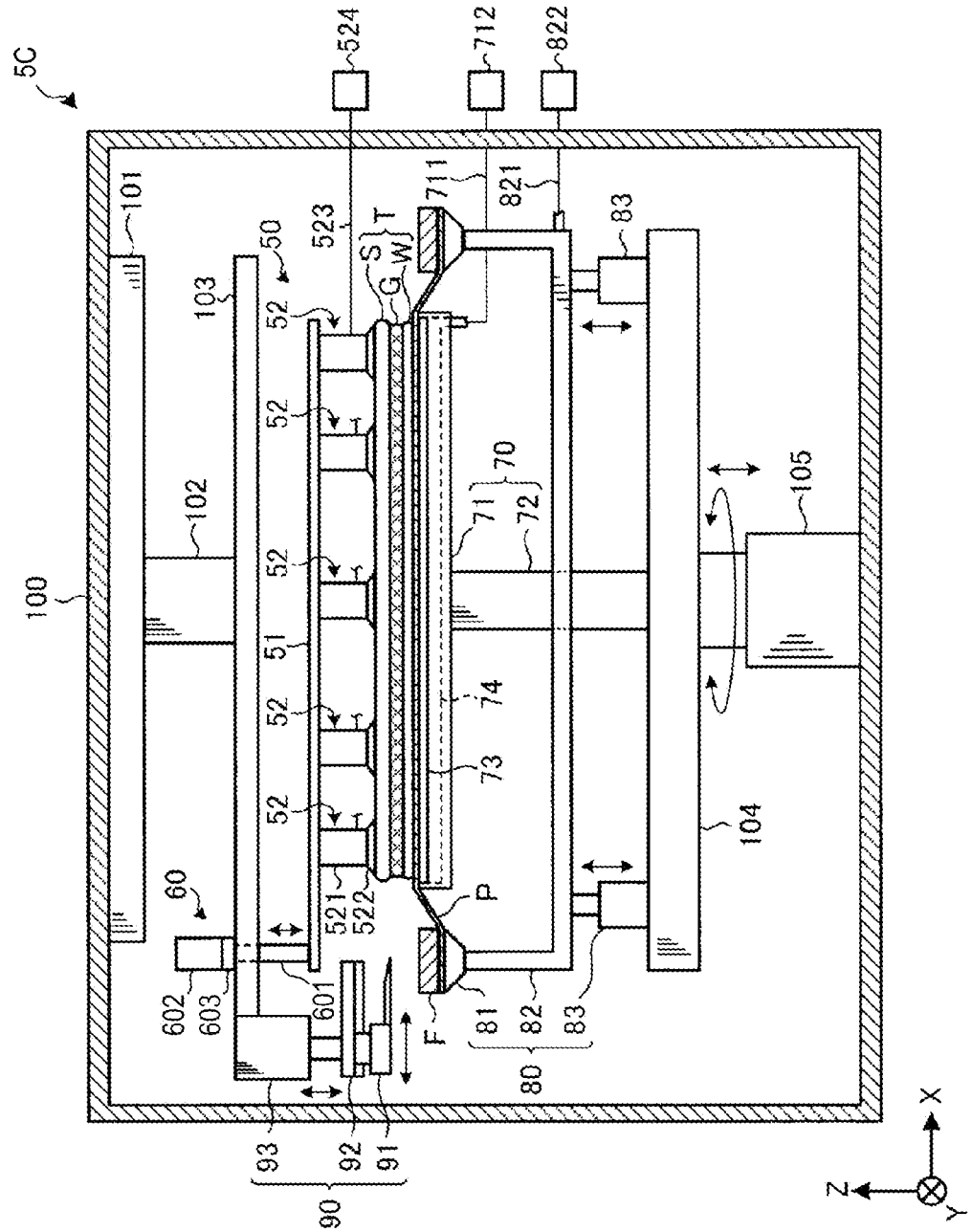
FIG. 30 is a schematic side view showing a configuration of a delamination device according to a fourth embodiment.

Next, a configuration of a delamination device according to a fourth embodiment, which is installed in the delamination station 15, will be described with reference to FIG. 30. FIG. 30 is a schematic side view showing a configuration of a delamination device 5C according to the fourth embodiment. The same components of the delamination device according to the fourth embodiment as the components of the delamination device according to the third embodiment will be designated by like reference numerals. Repeated description thereon will be omitted.

The delamination device 5C includes a first holding unit 50, a movement unit 61, a second holding unit 70, a frame holding unit 80 and a delamination inducing unit 90, all of which are disposed within the processing chamber 100.

The delamination device 5C sucks and holds the support substrate S of the laminated substrate T from above using the first holding unit 50, and sucks and holds the target substrate W of the laminated substrate T from below using the second holding unit 70. The delamination device 5C moves the support substrate S away from the surface of the target substrate W using the movement unit 61. Thus, the support substrate S held by the first holding unit 50 is continuously delaminated from the target substrate W, at which time the delamination proceeds from one end portion of the support substrate S toward the other end portion. Respective components will now be described in detail.

The first holding unit 50 includes an elastic member 51 and a plurality of suction portions 52. The elastic member 51 is a thin plate member and is formed of a metal such as a sheet metal or the like. The elastic member 51 is disposed above the support substrate S while being opposite to the support substrate S.

The plurality of suction portions 52 is installed on a surface of the elastic member 51 facing the support substrate S. Each of the suction portions 52 includes a body 521 fixed to the elastic member 51 and a suction pad 522 provided in the lower portion of the body 521.

Each of the suction portions 52 is connected to a suction device 524 such as a vacuum pump or the like through a suction pipe 523. The first holding unit 50 sucks the non-bonding surface Sn of the support substrate S with the suction portions 52 using a suction force generated by the suction device 524. Thus, the support substrate S is sucked and held by the first holding unit 50.

In some embodiments, the suction pad 522 of each of the suction portions 52 may be of a type small in deformation volume. This is because, if the suction pad 522 is greatly deformed when the movement unit 61 pulls the first holding unit 50 (which will be described later), a sucked portion of the support substrate S is heavily deformed along with the deformation of the suction pad 522, which may cause damage to the support substrate S or the target substrate W. In some embodiments, a suction pad having a rib on its suction surface or a flat pad having a space height of 0.5 mm or less, may be used as the suction pad 522.

Figure 31:
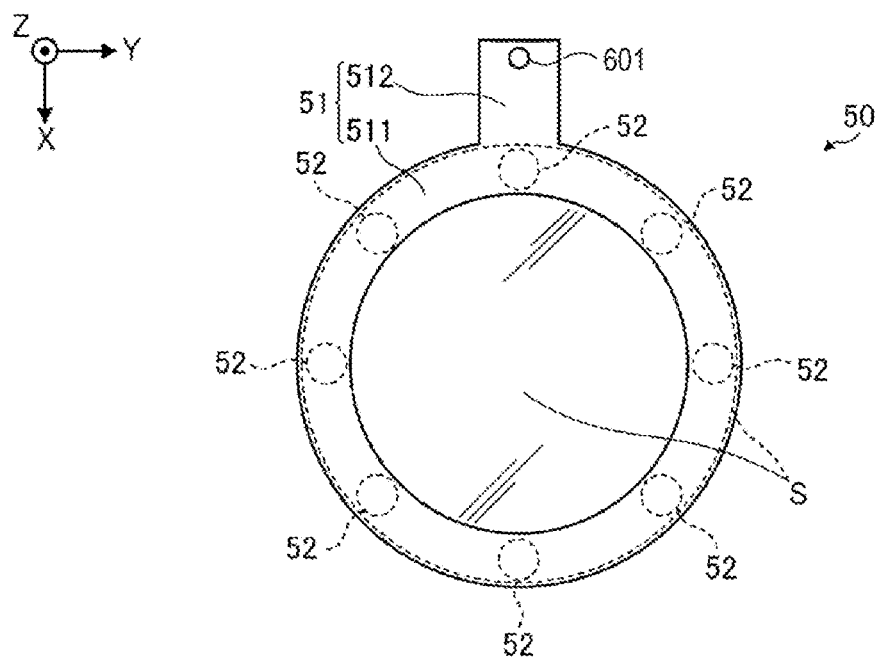
FIG. 31 is a schematic plane view of a first holding unit.

The configuration of the first holding unit 50 will now be described in more detail with reference to FIG. 31. FIG. 31 is a schematic plane view of the first holding unit 50.

As shown in FIG. 31, the plurality of suction portions 52 of the first holding unit 50 is disposed side by side in an annular shape on the elastic member 51. The suction portions 52 face the outer periphery of the support substrate S and suck the outer periphery of the support substrate S. In this embodiment, there is illustrated an example in which eight suction portions 52 are installed on the elastic member 51. However, the number of the suction portions 52 installed in the elastic member 51 is not limited to eight.

Among the plurality of suction portions 52, the suction portion 52 formed nearest to the delamination start point (e.g., the X-axis backward direction) is disposed at a position corresponding to the delamination start section M formed in the laminated substrate T by a delamination inducing unit 90 (which will be described later).

The elastic member 51 includes a body 511 and an extension portion 512. The body 511 is an annular frame having a central opening and an outer diameter substantially equal to the diameter of the support substrate S. The suction portions 52 are annularly disposed along the shape of the body 511 on the lower surface of the body 511, namely on a surface of the body 511 facing the support substrate S.

The extension portion 512 is a portion formed by extending a portion of the outer periphery of the body 511 positioned nearest to the delamination start point (the outer periphery of the body 511 positioned in the X-axis backward direction in this embodiment), toward the opposite side from the delamination progress direction (e.g., toward the X-axis backward direction). A post member 601 of the movement unit 61 is connected to the tip of the extension portion 512.

Referring back to FIG. 30, other configurations of the delamination device 5C will be described. The movement unit 60 includes the post member 601, a movement mechanism 602 and a load cell 603.

The post member 601 is a member extending in the vertical direction (e.g., Z-axis direction). One end portion of the post member 612 is connected to the extension portion 512 (see FIG. 31) of the elastic member 51. The other end portion of the post member 601 is connected to the movement mechanism 602 through the upper base unit 103.

The movement mechanism 602 is fixed to the upper portion of the upper base unit 103 and is configured to vertically move the post member 601 connected to the lower end of the movement mechanism 602. The load cell 603 detects a load applied to the post member 601.

The movement unit 60 moves the post member 601 vertically upward using the movement mechanism 602, thereby lifting up the first holding unit 50 connected to the post member 601. At this time, the movement unit 60 can pull the first holding unit 50 while controlling the force to be applied to the support substrate S, based on the detection result obtained by the load cell 603.

As shown in FIG. 31, the post member 601 serving as a lifting power point is disposed at the opposite side of the delamination progress direction from the suction portions 52 serving as a lifting fulcrum, namely the suction portion 52 formed nearest to the delamination start point (e.g., at the X-axis backward direction).

Thus, a torque (moment) acting clockwise in FIG. 30 is generated in the outer edge (the delamination start point corresponding to the below-mentioned "delamination start section M") of the laminated substrate T serving as a lifting action point. Thus, the movement unit 60 can pull the support substrate S so that the outer edge of the support substrate S can be turned up. Consequently, the support substrate S can be efficiently delaminated from the target substrate W.

The first holding unit 50 is supported by the movement unit 60. The movement unit 60 is supported by the upper base unit 103. The upper base unit 103 is supported through a post 102 by a fixing member 101 attached to a ceiling portion of the processing chamber 100.

Figure 32:
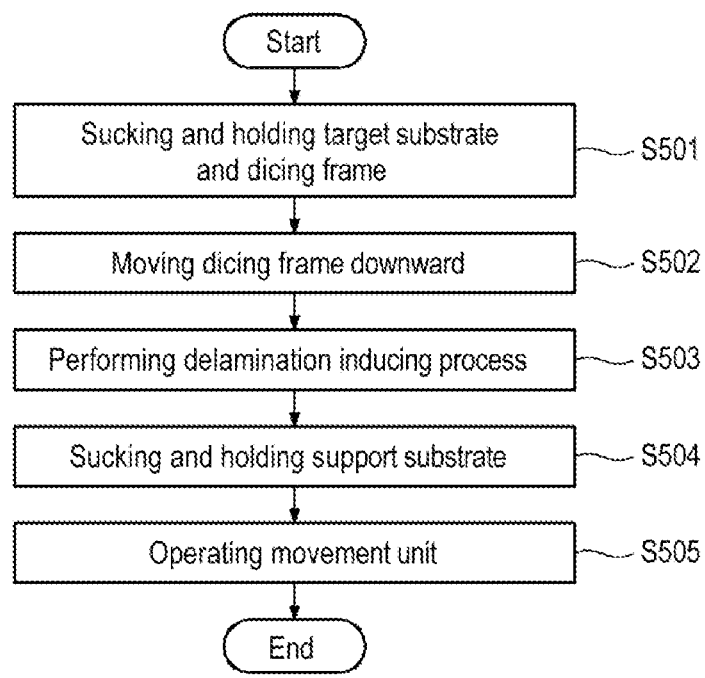
FIG. 32 is a flowchart showing a sequence of delamination processes performed by the delamination device according to the fourth embodiment.

Next, detailed operations of the delamination device 5C will be described with reference to FIGS. 32 and 33A to 33G. FIG. 32 is a flowchart showing a sequence of delamination processes performed by the delamination device 5C according to the fourth embodiment. FIGS. 33A to 33G are views illustrating delamination operations. Under the control of the control device 30, the delamination device 5C performs the respective processes shown in FIG. 32.

Figure 33A:
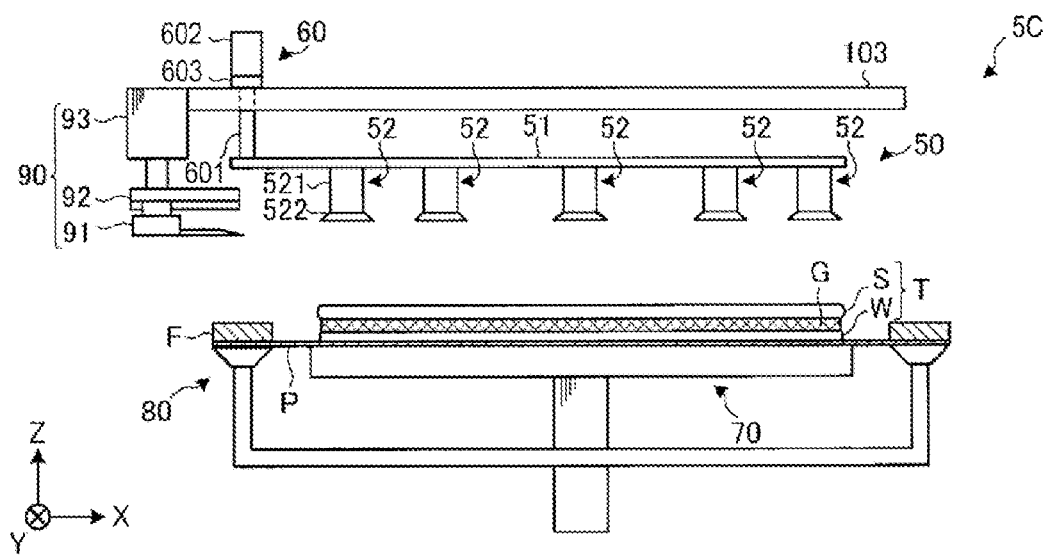
FIGS. 33A to 33G are views illustrating delamination operations.
Figure 33B:
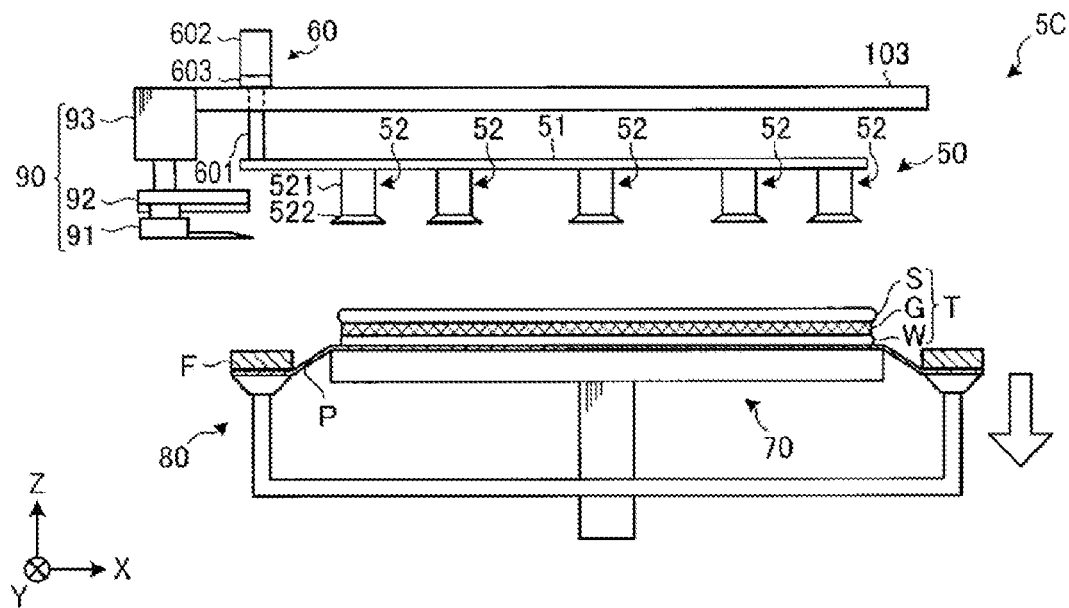
Figure 33C:
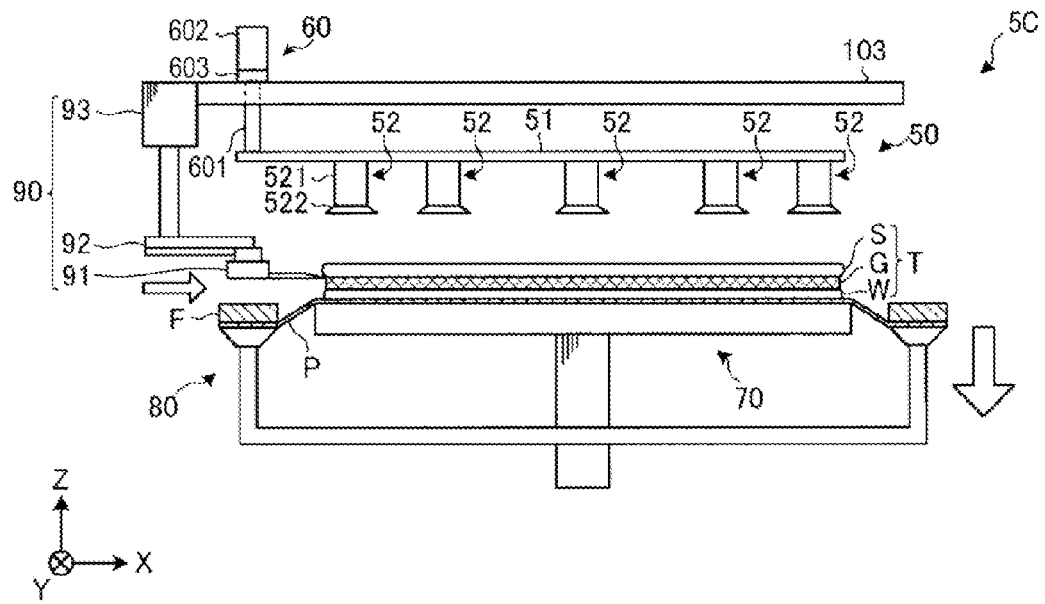

If the laminated substrate T fixed to the dicing frame F is carried into the processing chamber 100, the delamination device 5C first sucks and holds the target substrate W of the laminated substrate T and the dicing frame F from below using the second holding unit 70 and the frame holding unit 80, respectively (at Step S501). At this time, as shown in FIG. 33A, the target substrate W and the dicing frame F are held by the second holding unit 70 and the frame holding unit 80 in a state where the dicing tape P is horizontally attached.

Then, the delamination device 5C moves the frame holding unit 80 downward using the movement mechanism 83 (see FIG. 30) of the frame holding unit 80, thereby moving the dicing frame F held by the frame holding unit 80 downward (at Step S502). Thus, there is provided a space in which the sharp member 91 of the delamination inducing unit 90 is moved toward the laminated substrate T (see FIG. 33B).

Subsequently, the delamination device 5C performs a delamination inducing process using the delamination inducing unit 90 (at Step S503). In the delamination inducing process, a section that triggers delamination of the support substrate S from the target substrate W (the delamination start section M) is formed in the laminated substrate T (see FIG. 33C).

The operations of the delamination inducing process of the delamination device 5C are the same as the operations of the delamination inducing process of the delamination device 5B. Thus, the detailed description thereof will be omitted. The shape of the edge of the sharp member 91 of the delamination device 5C is the same as the shape of the edge of the sharp member 91 of the delamination device 5B. Thus, the detailed description thereof will be omitted.

Figure 33D:
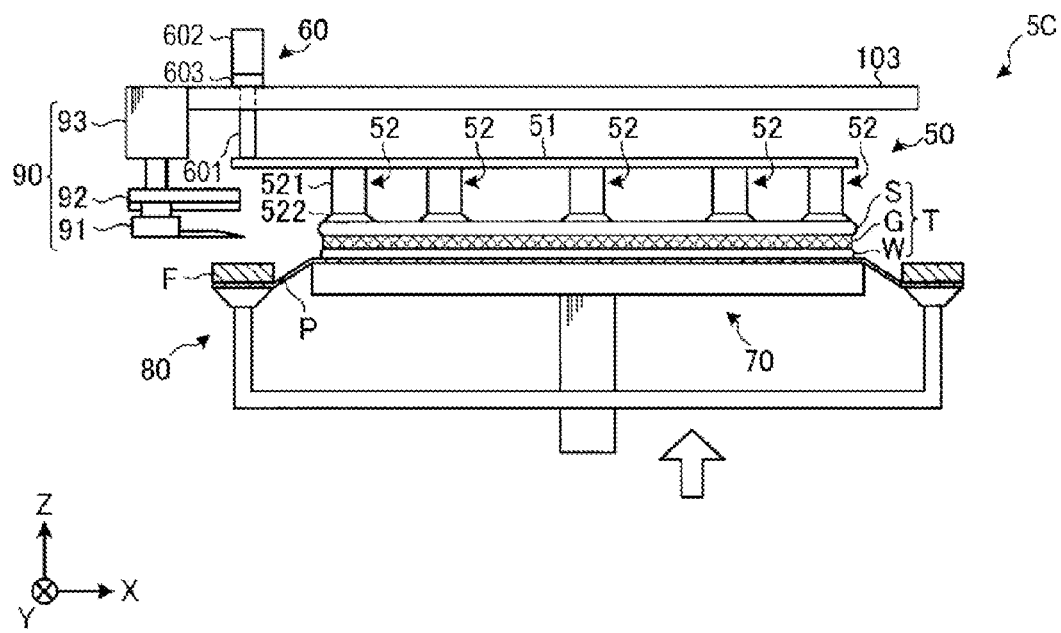
Figure 33E:
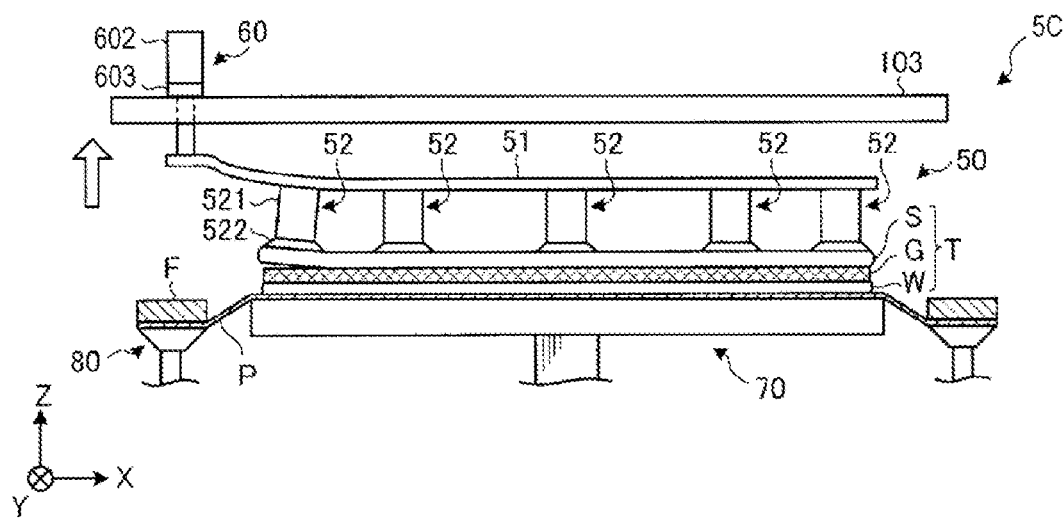
Figure 33F:
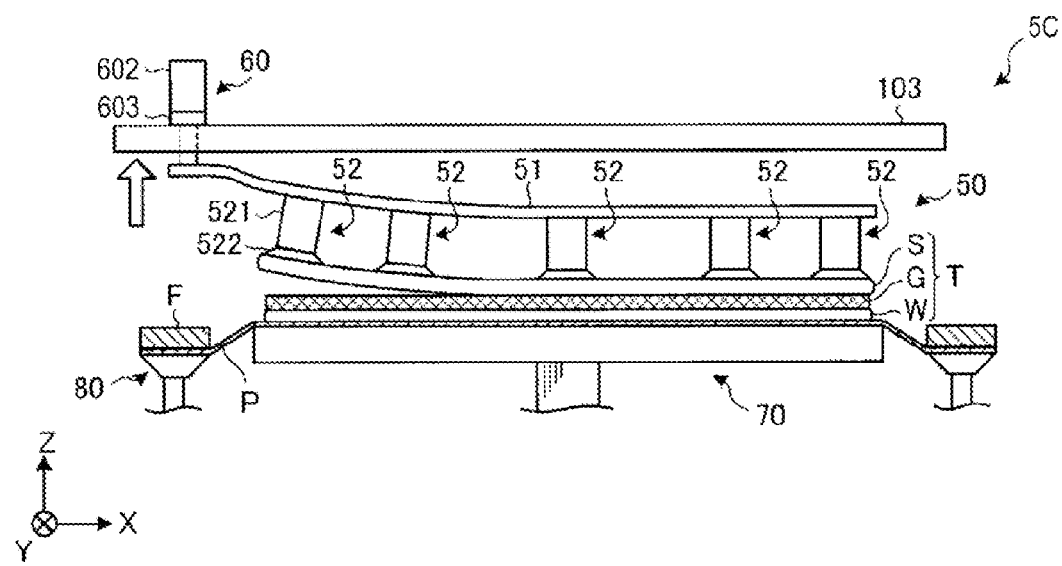
Figure 33G:
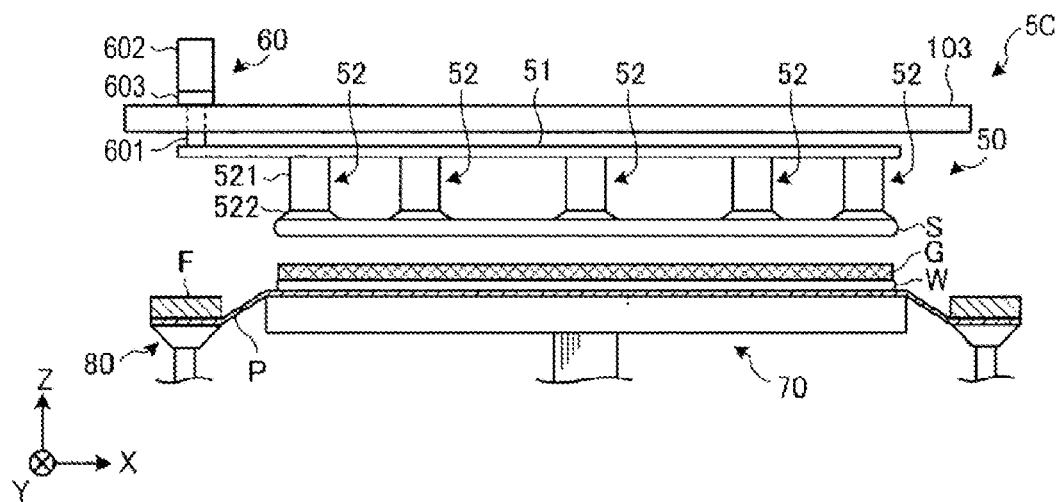

If the delamination inducing process of Step S503 is finished, the delamination device 5C moves the second holding unit 70 and the frame holding unit 80 upward using the rotary elevating mechanism 105 (see FIG. 30), thereby bringing the support substrate S of the laminated substrate T into contact with the suction portions 52 of the first holding unit 50 (see FIG. 33D). Then, the delamination device 5C causes the suction device 524 to start a suction operation, whereby the support substrate S is sucked and held by the first holding unit 50 (at Step S504).

Subsequently, the delamination device 5C operates the movement unit 60 (see FIG. 30) (at Step S505), thereby moving a portion of the outer periphery of the first holding unit 50, namely the extension portion 512 of the elastic member 51 (see FIG. 31) away from the second holding unit 70. Thus, the suction portion 52 formed nearest to the delamination start point is pulled and the support substrate S begins to be delaminated from the target substrate W at the delamination start section M as a delamination starting point (see FIG. 33E).

The elastic member 51 of the first holding unit 50 is pliable. Therefore, when the movement unit 61 pulls the first holding unit 50, the elastic member 51 is deformed in response to the pulling action. Thus, the support substrate S can be delaminated from the target substrate W without applying a heavy load to the target substrate W. Since the elastic member 51 is pliable, "persistency" can be given to the force by which the support substrate S is delaminated from the target substrate W. Thus, the support substrate S can be efficiently delaminated from the target substrate W.

As described above, the extension portion 512 is formed in the elastic member 51. The post member 601 of the movement unit 61 is connected to the extension portion 512. Thus, a torque (moment) can be added to the force by which the support substrate S is pulled. This enables the movement unit 61 to pull the support substrate S so that the outer edge of the support substrate S can be turned up. Consequently, the support substrate S can be efficiently delaminated from the target substrate W.

Thereafter, the delamination device 5C further lifts up the first holding unit 50 using the movement unit 61. Thus, delamination proceeds continuously from the end portion of the support substrate S in the X-axis backward direction toward the end portion of the support substrate S in the X-axis forward direction (see FIG. 33F). Finally, the support substrate S is delaminated from the target substrate W (see FIG. 33G). In this way, the delamination device 5C finishes the delamination process.

As described above, the delamination device 5C according to this embodiment includes the first holding unit 50, the second holding unit 70 and the movement unit 61. The first holding unit 50 holds the support substrate S of the laminated substrate T obtained by bonding the support substrate S (equivalent to one example of a first substrate) and the target substrate W (equivalent to one example of a second substrate). The second holding unit 70 holds the target substrate W of the laminated substrate T. The movement unit 61 moves a portion of the outer periphery of the first holding unit 50 away from the second holding unit 70. The first holding unit 50 includes the thin plate-shaped elastic member 51 connected to the movement unit 61, and the plurality of suction portions 52 installed in the elastic member 51 and configured to suck the support substrate S. Thus, the delamination device 5C according to this embodiment can make the delamination process efficient.

The configuration of the first holding unit 50 is not limited to the configuration described in respect of the aforementioned embodiments. Other configuration examples of the first holding unit 50 will now be described with reference to FIGS. 34A to 34E. FIGS. 34A to 34E are schematic plane views showing first holding units according to first to fifth modified examples. In the following description, the same components as described above will be designated by like reference numerals and repeated description thereon will be omitted.

Figure 34A:
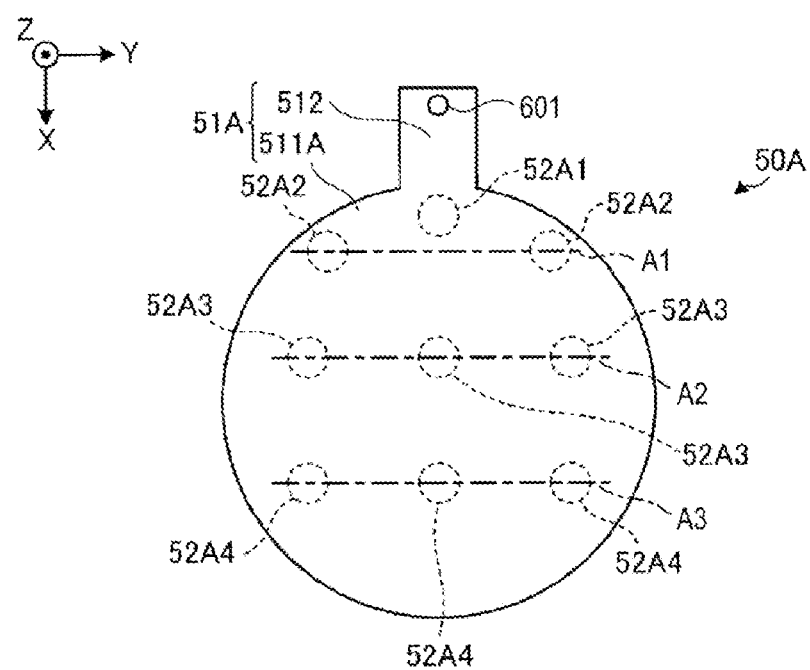
FIG. 34A is a schematic plane view of a first holding unit according to a first modified example.

By way of example, as shown in FIG. 34A, an elastic member 51A of a first holding unit 50A according to the first modified example includes, instead of the annular body 511 (see FIG. 31), a disc-shaped body 511A not provided with any central opening.

The body 511A includes a suction portion 52A1 formed nearest to the delamination start point, a first suction portion group formed of two suction portions 52A2, a second suction portion group formed of three suction portions 52A3 and a third suction portion group formed of three suction portions 52A4. The first to third suction portion groups are disposed in that order along the delamination progress direction.

The two suction portions 52A2 included in the first suction portion group are disposed side by side along a direction (e.g., Y-axis direction) perpendicular to the delamination progress direction (e.g., X-axis forward direction) (see an imaginary line A1 indicated in FIG. 34A). Similarly, the three suction portions 52A3 included in the second suction portion group and the three suction portions 52A4 included in the third suction portion group are disposed side by side along the direction (e.g., Y-axis direction) perpendicular to the delamination progress direction (see imaginary lines A2 and A3 indicated in FIG. 34A).

As described above, among the plurality of suction portions 52A1, 52A2, 52A3 and 52A4 of the first holding unit 50, the suction portions 52A2, 52A3 and 52A4 other than the suction portion 52A1 formed nearest to the delamination start point are arranged along the direction perpendicular to the delamination progress direction and are disposed at multiple stages along the delamination progress direction.

That is, the suction portions 52A2, 52A3 and 52A4 are disposed in conformity with the delamination progress direction, which makes it possible to efficiently delaminate the support substrate S from the target substrate W.

By disposing the suction portion 52A1 in a position nearest to the delamination start point, namely a position corresponding to the delamination start section M, the delamination of the support substrate S can be reliably started at the delamination start section M as a delamination starting point.

Figure 34B:
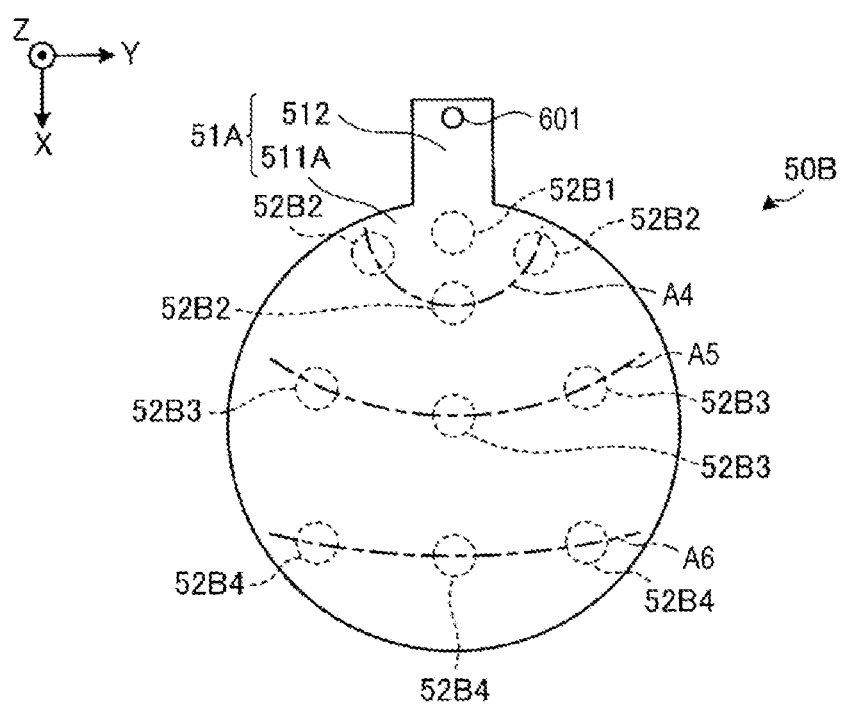
FIG. 34B is a schematic plane view of a first holding unit according to a second modified example.

As shown in FIG. 34B, the body 511A of the elastic member 51A of the first holding unit 50B according to the second modified example includes a suction portion 52B1, a first suction portion group formed of three suction portions 52B2, a second suction portion group formed of three suction portions 52B3 and a third suction portion group formed of three suction portions 52B4. The suction portion 52B1 is formed nearest to the delamination start point in a corresponding relationship with the delamination start section M. The first to third suction portion groups are disposed in that order along the delamination progress direction.

The three suction portions 52B2 included in the first suction portion group are disposed side by side in a circular arc shape bulging in the delamination progress direction (e.g., X-axis forward direction) (see an imaginary line A4 indicated in FIG. 34B). Similarly, the three suction portions 52B3 included in the second suction portion group and the three suction portions 52B4 included in the third suction portion group are disposed side by side in a circular arc shape bulging in the delamination progress direction (e.g., X-axis forward direction) (see imaginary lines A5 and A6 indicated in FIG. 34B).

As described above, the suction portions 52B2, 52B3 and 52B4 other than the suction portion 52B 1 formed nearest to the delamination start point are arranged in the circular arc shape bulging in the delamination progress direction and are disposed at multiple stages along the delamination progress direction.

The delamination of the support substrate S from the target substrate W proceeds in a circular arc shape when viewed from the top. By disposing the suction portions 52B2, 52B3 and 52B4 side by side in the circular arc shape bulging in the delamination progress direction, the support substrate S can be efficiently delaminated from the target substrate W. Further, the support substrate S under delamination can be appropriately sucked and held.

The delamination border line between the support substrate S and the target substrate W is kept in a circular arc shape at the initial stage of delamination. Along with the progress of delamination, the delamination border line is gradually changed to a straight line extending in a direction (e.g., Y-axis direction) perpendicular to the delamination progress direction.

For that reason, it is preferred that curvatures of the circular arcs drawn by the suction portions 52B2, 52B3 and 52B4 (curvatures of the imaginary lines A4, A5 and A6 indicated in FIG. 34B) becomes gradually smaller (becomes similar to a straight line) toward the delamination end point.

Figure 34C:
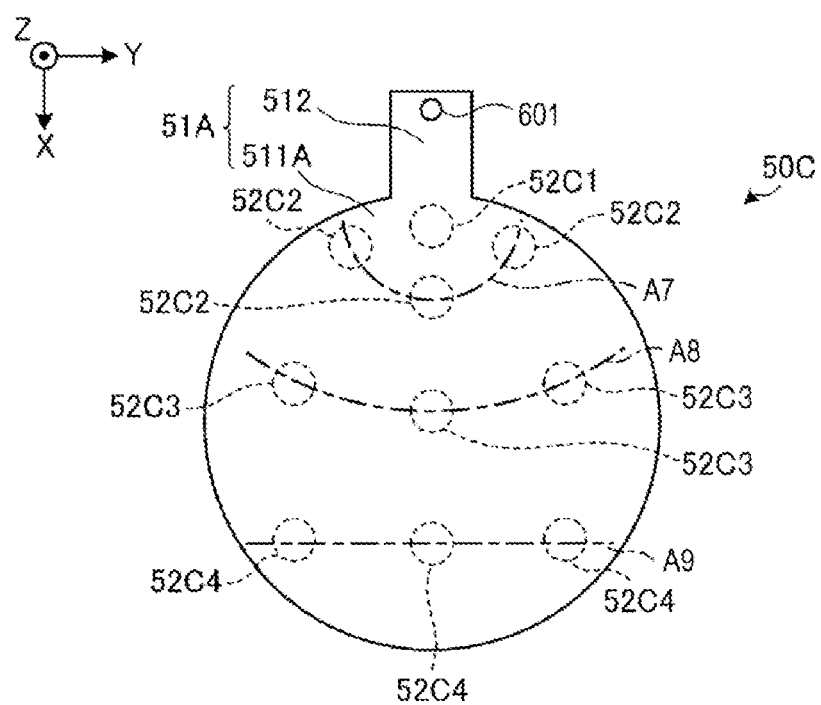
FIG. 34C is a schematic plane view of a first holding unit according to a third modified example.

As shown in FIG. 34C, the body 511A of the elastic member 51A of the first holding unit 50C according to the third modified example includes a suction portion 52C1, a first suction portion group formed of three suction portions 52C2, a second suction portion group formed of three suction portions 52C3 and a third suction portion group formed of three suction portions 52C4. The suction portion 52C1 is formed nearest to the delamination start point in a corresponding relationship with the delamination start section M. The first to third suction portion groups are disposed in that order along the delamination progress direction.

In the first holding unit 50C according to the third modified example, the arrangement of the three suction portions 52B4 formed nearest to the delamination end point, among the suction portions 52B2, 52B3 and 52B4 of the first holding unit 50B according to the second modified example, is changed a linear arrangement perpendicular to the delamination progress direction.

That is, the three suction portions 52C2 included in the first suction portion group and the three suction portions 52C3 included in the second suction portion group are disposed side by side in a circular arc shape bulging in the delamination progress direction (see imaginary lines A7 and A8 indicated in FIG. 34C). The three suction portions 52C4 included in the third suction portion group are disposed side by side in a linear shape perpendicular to the delamination progress direction (see an imaginary line A9 indicated in FIG. 34C).

As described above, the delamination border line between the support substrate S and the target substrate W is changed from the circular arc shape to the linear shape along with the progress of delamination. For that reason, the suction portion group (the suction portions 52C2 and 52C3 in this modified example) disposed at the side of the delamination start point, among the suction portions 52C1, 52C2, 52C3 and 52C4, may be disposed side by side in a circular arc shape bulging in the delamination progress direction. Further, the suction portion group (the suction portions 52C4 in this modified example) disposed closer to the delamination end point than the suction portions 52C2 and 52C3 may be disposed in a linear shape extending in a direction perpendicular to the delamination progress direction.

Figure 34D:
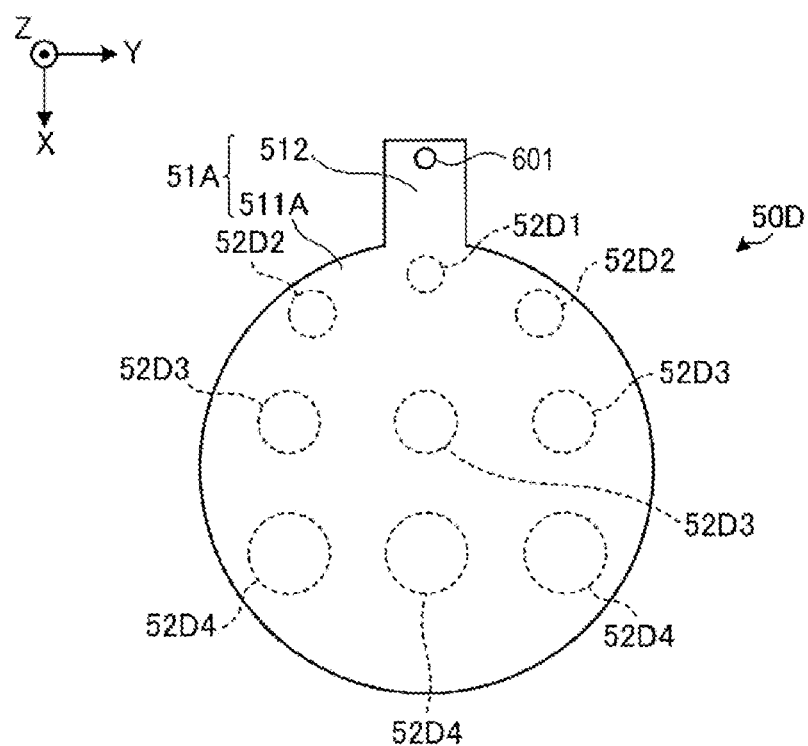
FIG. 34D is a schematic plane view of a first holding unit according to a fourth modified example.

As shown in FIG. 34D, the body 511A of the elastic member 51A of the first holding unit 50D according to the fourth modified example includes a suction portion 52D1, a first suction portion group formed of two suction portions 52D2, a second suction portion group formed of three suction portions 52D3 and a third suction portion group formed of three suction portions 52D4. The suction portion 52D1 is formed nearest to the delamination start point in a corresponding relationship with the delamination start section M. The first to third suction portion groups are disposed in that order along the delamination progress direction.

In the first holding unit 50D, suction areas of the respective suction portions 52D1, 52D2, 52D3 and 52D4 become gradually larger toward the delamination end point. That is, the suction area of the suction portion 52D1 formed nearest to the delamination start point is smallest. The suction area of the three suction portions 52D4 formed nearest to the delamination end point is largest.

As described above, the suction portions 52D1, 52D2, 52D3 and 52D4 may be configured such that the suction areas thereof become gradually larger toward the delamination end point.

Figure 34E:
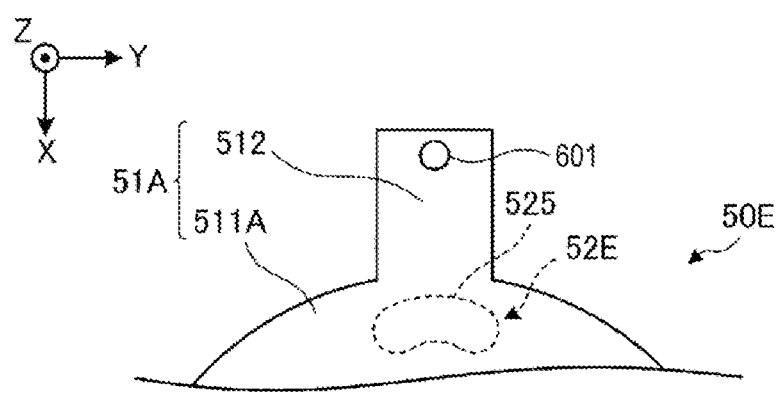
FIG. 34E is a schematic plane view of a first holding unit according to a fifth modified example.

As shown in FIG. 34E, the body 511A of the elastic member 51A of the first holding unit 50E according to the fifth modified example includes a plurality of suction portions. Among the suction portions of the first holding unit 50E, the suction portion 52E formed nearest to the delamination start point has a section 525 positioned at the side of the outer edge of the body 511, namely at the side of the outer edge of the support substrate S, and formed into an circular arc shape along the outer edge of the support substrate S.

Thus, the suction portion 52E can be disposed in a region nearer to the outermost edge of the support substrate S. Consequently, the force acting in such a direction as to peel off the support substrate S from the target substrate W can be efficiently applied to the support substrate S.

(Other Embodiments)

While in the above embodiments, the laminated substrate T as a target to be delaminated has been described to be obtained by bonding the target substrate W and the support substrate S with the adhesive agent G, the present disclosure is not limited thereto. As an example, in the delamination device according to the above embodiments, the laminated substrate may be obtained by bonding a donor substrate with an insulation film formed thereon and a target substrate in order to generate an SOI substrate.

Figure 35A:
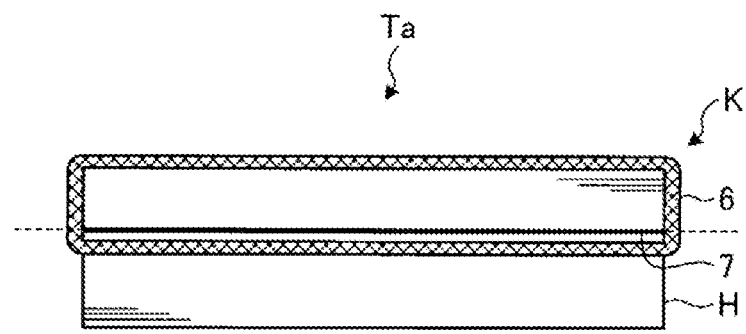
FIGS. 35A to 35B are schematic views showing manufacturing processes of an SOI substrate.
Figure 35B:
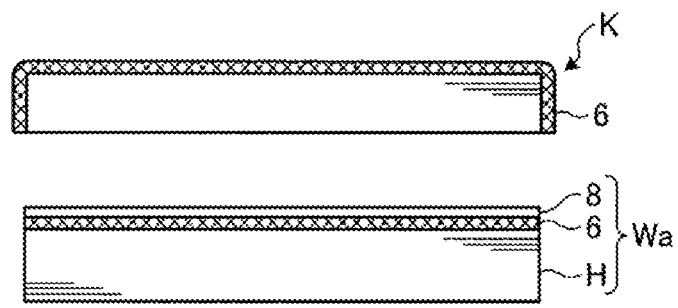

A method of manufacturing the SOI substrate will now be described with reference to FIGS. 35A and 35B. FIGS. 35A and 35B are schematic views showing a manufacturing process of the SOI substrate. As shown in FIG. 35A, a laminated substrate Ta for use in forming the SOI substrate is obtained by bonding a donor substrate K and a handle substrate H.

The donor substrate K includes an insulation film 6 formed thereon and a hydrogen ion injection layer 7 formed by a predetermined depth on a surface to be bonded to the handle substrate H. Examples of the handle substrate H may include a silicon wafer, a glass substrate, a sapphire substrate or the like.

In the delamination device according to some embodiments, a mechanical impact is applied to the hydrogen ion injection layer 7 formed on the donor substrate K by pulling an outer periphery of the laminated substrate Ta, e.g., in a state where the donor substrate K is held by a first holding unit while the handle substrate H is held by a second holding unit. Thus, as shown in FIG. 35B, a silicon-silicon bonding in the hydrogen ion injection layer 7 are disconnected so that a silicon layer 8 is delaminated from the donor substrate K. As a result, the insulation film 6 and the silicon layer 8 are transferred on an upper surface of the handle substrate H, thereby forming a SOI substrate Wa. While in the above, the donor substrate K and the handle substrate H have been described to be held by the first holding unit and the second holding unit, respectively, the donor substrate K and the handle substrate H may be held by the second holding unit and the first holding unit, respectively.

The foregoing embodiments are described with an example where the target substrate W and the support substrate S are bonded together by the bonding agent G. Each of the bonding surface Wj and the bonding surface Sj may be divided into a plurality of regions and bonding agents having different bonding force may be applied to the respective regions.

While in the above embodiments, the support substrate S and the target substrate W have been described to be held by the first holding unit and the second holding unit, respectively, the target substrate W may be held by the first holding unit and the support substrate S may be held by the second holding unit.

While in the above embodiments, the first holding unit has been described to hold the laminated substrate T from above, the first holding unit may hold the laminated substrate T from below.

Further, while in the above embodiments, the laminated substrate T has been described to be held by the dicing frame F, it need not necessarily be held by the dicing frame F.

Further, while in the above embodiments, the delamination process of the laminated substrate T has been described to be performed at the normal temperature, the delamination process may be performed while heating the laminated substrate T. In this case, a heating unit such as a heater may be installed in the body 111 of the first holding unit 110. The heating of the laminated substrate T softens the adhesive agent G used in bonding the target substrate W and the support substrate S. This facilities delamination of the target substrate W and the support substrate S.

While in the above embodiments, description has been made on an example in which the sharp member 91 of the delamination inducing unit 90 is a flat blade, the present disclosure is not limited thereto. In some embodiments, a razor blade, a roller blade or an ultrasonic cutter may be used as the sharp member 91.

While in the above embodiments, description has been made on a case in which the first additional movement unit 62 is installed in the section of the contact portion 57 corresponding to the individual region 575 while the second additional movement unit 63 is installed in the section of the contact portion 57 corresponding to the individual region 576, the present disclosure is not limited thereto. In some embodiments, the additional movement unit may be installed in only one of the section corresponding to the individual region 575 and the section corresponding to the individual region 576. Further, the delamination device 5B does not need to necessarily include the additional movement unit.

According to some embodiments of the present disclosure, it is possible to increase the efficiency of a delamination process.

While certain embodiments have been described, these embodiments have been presented by way of example only, and are not intended to limit the scope of the disclosures. Indeed, the novel device, system and method described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A delamination device of delaminating a laminated substrate obtained by bonding a first substrate and a second substrate, the laminated substrate being disposed in an opening of a frame, the opening having a diameter larger than that of the laminated substrate, and the laminated substrate being held by the frame with a bottom surface of the first substrate attached to a tape provided in the opening, the delamination device comprising:
   a first holding unit configured to hold the second substrate of the laminated substrate from above;
   a second holding unit configured to hold the first substrate of the laminated substrate from below through the tape;
   a moving mechanism configured to move the first holding unit in a direction away from the second holding unit, and
   a local movement unit including a body and a cylinder, one end of the cylinder being fixed to the body and being vertically moved by the body,
   wherein the other end of the cylinder is fixed to an outer periphery of the first holding unit such that the outer periphery of the first holding unit is partially pulled in the direction away from the second holding unit when the first holding unit is pulled by the local movement unit, and
   wherein the first holding unit is made of a material such that the shape of the first holding unit changes to delaminate the second substrate from the first substrate when the first holding unit is pulled by the local movement unit.

2. The device of claim 1, further comprising:
   a frame holding unit configured to hold the frame from below.

3. The device of claim 2, wherein the frame holding unit is configured to hold the frame in a location lower than a location at which the second holding unit is positioned.

4. A delamination device, comprising:
   a first holding unit configured to hold a second substrate of a laminated substrate which is obtained by bonding a first substrate and the second substrate;
   a second holding unit configured to hold the first substrate of the laminated substrate; and
   a local movement unit including a body and a cylinder, one end of the cylinder being fixed to the body and being vertically moved by the body,
   wherein the other end of the cylinder is fixed to an outer periphery of the first holding unit such that the outer periphery of the first holding unit is partially pulled in a direction away from the second holding unit when the first holding unit is pulled by the local movement unit, and
   wherein the first holding unit is made of a material such that the shape of the first holding unit changes to delaminate the second substrate from the first substrate when the first holding unit is pulled by the local movement unit.

5. The device of claim 4, wherein the first holding unit includes a flat elastic member and a resin member attached to a surface of the elastic member and configured to make contact with the second substrate, and
   wherein the second substrate is sucked and held by virtue of a suction force in a suction port formed in the resin member.

6. The device of claim 5, further comprising:
   a base unit disposed near the elastic member and opposite to the first holding unit with a gap formed between the base unit and the first holding unit; and
   a plurality of support members protruding from the base unit toward the elastic member,
   wherein the elastic member includes a plurality of fixing sections provided in locations corresponding to the respective support members in an outer periphery of the elastic member and fixed to the respective support members.

7. The device of claim 6, wherein the plurality of fixing sections are formed along a circumferential direction of the outer periphery of the elastic member and are fixed to the respective support members such that a movement of the first holding unit caused by the local movement unit is adjusted by fixing at least two of the fixing sections to the support members.

8. The device of claim 5, wherein the resin member includes a suction region divided into a plurality of individual regions, and
   wherein the second substrate is sucked and held at each of the individual regions by virtue of suction forces in suction ports formed in the respective individual regions.

9. A delamination device, comprising:
a first holding unit configured to hold a first substrate of a laminated substrate which is obtained by bonding the first substrate and a second substrate;
a second holding unit configured to hold the second substrate of the laminated substrate; and
a local movement unit including a body and a cylinder, one end of the cylinder being fixed to the body and being vertically moved by the body,
wherein the other end of the cylinder is fixed to an outer periphery of the first holding unit such that the outer periphery of the first holding unit is partially pulled away from the second holding unit when the first holding unit is pulled by the local movement unit, whereby the first substrate is separated from the second substrate, and
wherein the first holding unit includes:
a flat elastic member connected to the local movement unit, the shape of the flat elastic member being changed to delaminate the first substrate from the second substrate when the first holding unit is pulled by the local movement unit; and
a plurality of suction portions formed in the elastic member and configured to hold the first substrate.

10. The device of claim 9, wherein the plurality of suction portions are disposed in an annular shape and each of the plurality of suction portions sucks the outer periphery of the first holding unit.

11. The device of claim 9, wherein the plurality of suction portions are disposed in multiple stages along a direction orthogonal to a delamination progress direction.

12. The device of claim 9, wherein the plurality of suction portions are disposed in a circular arc shape bulging in a delamination progress direction and are disposed in multiple stages along the delamination progress direction.

13. The device of claim 9, wherein, among the plurality of suction portions, one group of suction portions disposed at a delamination start point is disposed in a circular arc shape bulging in a delamination progress direction, and
wherein, among the plurality of suction portions, another group of suction portions disposed at a delamination end point is arranged along a direction orthogonal to the delamination progress direction.

\* \* \* \* \*